US007872491B2

(12) United States Patent
Tadamori

(10) Patent No.: US 7,872,491 B2
(45) Date of Patent: Jan. 18, 2011

(54) NOISE FILTER CIRCUIT, DEAD TIME CIRCUIT, DELAY CIRCUIT, NOISE FILTER METHOD, DEAD TIME METHOD, DELAY METHOD, THERMAL HEAD DRIVER, AND ELECTRONIC INSTRUMENT

(75) Inventor: Saito Tadamori, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/335,184

(22) Filed: Dec. 15, 2008

(65) Prior Publication Data
US 2009/0153183 A1 Jun. 18, 2009

(30) Foreign Application Priority Data
Dec. 14, 2007 (JP) ............... 2007-323926

(51) Int. Cl.
H03K 17/16 (2006.01)
H03K 19/003 (2006.01)

(52) U.S. Cl. ............ 326/27; 326/21; 327/210; 327/217

(58) Field of Classification Search .......... 326/21; 327/166, 200–219
See application file for complete search history.

(56) References Cited

U.S. PATENT DOCUMENTS 3,851,189 A * 11/1974 Moyer ................ 327/210

7,279,948 B2 10/2007 Kozawa

FOREIGN PATENT DOCUMENTS

| JP | A-54-069947 | 6/1979 |
| JP | A-62-171220 | 7/1987 |
| JP | A-62-176320 | 8/1987 |
| JP | A-03-228424 | 10/1991 |
| JP | A-04-081118 | 3/1992 |
| JP | A-07-022921 | 1/1995 |
| JP | A-2003-163583 | 6/2003 |
| JP | A-2005-261091 | 9/2005 |
| JP | A-2006-197405 | 7/2006 |

OTHER PUBLICATIONS

U.S. Appl. No. 12/172,690, filed Jul. 14, 2008 in the name of Saito.

* cited by examiner

Primary Examiner—Rexford N Barnie
Assistant Examiner—Jany Tran
(74) Attorney, Agent, or Firm—Oliff & Berridge PLC

(57) ABSTRACT

A noise filter circuit includes a first inverter circuit that receives a signal based on an input signal, a second inverter circuit that receives a signal based on the input signal, and a latch circuit that receives signals based on a signal output from the first inverter circuit and a signal based on a signal output from the second inverter circuit as a set signal and a reset signal. Each of the first inverter circuit and the second inverter circuit includes a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor.

6 Claims, 35 Drawing Sheets

NOISE FILTER CIRCUIT, DEAD TIME CIRCUIT, DELAY CIRCUIT, NOISE FILTER METHOD, DEAD TIME METHOD, DELAY METHOD, THERMAL HEAD DRIVER, AND ELECTRONIC INSTRUMENT

Japanese Patent Application No. 2007-323926 filed on Dec. 14, 2007, is hereby incorporated by reference in its entirety.

BACKGROUND

The present invention relates to a noise filter circuit, a dead time circuit, a delay circuit, a noise filter method, a dead time method, a delay method, a thermal head driver, an electronic instrument, and the like.

An electronic instrument may include a noise filter circuit in order to remove noise contained in a signal (e.g., JP-A-2003-163583 (FIG. 1)). An electronic instrument or a circuit (e.g., noise filter circuit disclosed in JP-A-2003-163583) included in an electronic instrument may include a delay circuit in order to delay a signal (e.g., JP-A-7-022921 (FIGS. 2 and 1)). An electronic instrument may include a driver circuit, and may also include a dead time circuit in order to prevent a current from flowing through the driver circuit (e.g., JP-A-2005-261091 (FIGS. 8 and 1)).

It is desirable that an electronic instrument or a circuit (e.g., noise filter circuit, dead time circuit, and delay circuit) included in an electronic instrument have a simple structure. However, it is difficult to design a circuit having a simple structure.

SUMMARY

According to one aspect of the invention, there is provided a noise filter circuit comprising:

a first inverter circuit that receives a signal based on an input signal;

a second inverter circuit that receives a signal based on the input signal; and a latch circuit that receives signals based on a signal output from the first inverter circuit and a signal based on a signal output from the second inverter circuit as a set signal and a reset signal, each of the first inverter circuit and the second inverter circuit including a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor.

According to another aspect of the invention, there is provided a noise filter circuit comprising:

a first delay circuit that receives an input signal;

an AND circuit that receives the input signal and a signal output from the first delay circuit;

an OR circuit that receives the input signal and the signal output from the first delay circuit;

a latch circuit that receives signals based on a signal output from the AND circuit and a signal based on a signal output from the OR circuit as a set signal and a reset signal;

a second delay circuit that receives the signal output from the AND circuit; and a third delay circuit that receives the signal output from the OR circuit, each of the second delay circuit and the third delay circuit including an inverter circuit;

each of the inverter circuits including a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor; and the latch circuit receiving the signal based on the signal output from the AND circuit and the signal based on the signal output from the OR circuit through the second delay circuit and the third delay circuit.

According to another aspect of the invention, there is provided a dead time circuit comprising:

a first inverter circuit that receives a signal based on an input signal; and a second inverter circuit that receives a signal based on the input signal, each of the first inverter circuit and the second inverter circuit including a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor; and a combination of signals output from the first inverter circuit and the second inverter circuit forming a dead time.

According to another aspect of the invention, there is provided a delay circuit comprising:

an inverter circuit that receives a signal based on an input signal, the inverter circuit including a plurality of inverter circuits, each of the plurality of inverter circuits including a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor.

According to another aspect of the invention, there is provided a thermal head driver comprising the above noise filter circuit.

According to another aspect of the invention, there is provided an electronic instrument comprising the above noise filter circuit.

According to another aspect of the invention, there is provided an electronic instrument comprising the above dead time circuit.

According to another aspect of the invention, there is provided a noise filter circuit comprising the above delay circuit.

According to another aspect of the invention, there is provided a thermal head driver comprising the above delay circuit.

According to another aspect of the invention, there is provided an electronic instrument comprising the above delay circuit.

According to another aspect of the invention, there is provided a noise filter method comprising:

providing an input signal;

generating a first signal based on the input signal using a first inverter circuit, one of a rise time and a fall time of the first signal being longer than the other of the rise time and the fall time of the first signal;

generating a second signal based on the input signal using a second inverter circuit, one of a rise time and a fall time of the second signal being longer than the other of the rise time and the fall time of the second signal; and inputting signals based on the first signal and a signal based on the second signal to a latch circuit as a set signal and a reset signal.

According to another aspect of the invention, there is provided a noise filter method comprising:
- providing an input signal;
- delaying the input signal;
- inputting the input signal and the delayed signal to an AND circuit;
- inputting the input signal and the delayed signal to an OR circuit;
- inputting signals based on a signal output from the AND circuit and a signal based on a signal output from the OR circuit to a latch circuit as a set signal and a reset signal;
- generating a first signal based on a signal output from the AND circuit, one of a rise time and a fall time of the first signal being longer than the other of the rise time and the fall time of the first signal; and
- generating a second signal based on a signal output from the OR circuit, one of a rise time and a fall time of the second signal being longer than the other of the rise time and the fall time of the second signal.

According to another aspect of the invention, there is provided a dead time method comprising:
- providing an input signal;
- generating a first signal based on the input signal using a first inverter circuit, one of a rise time and a fall time of the first signal being longer than the other of the rise time and the fall time of the first signal; and
- generating a second signal based on the input signal using a second inverter circuit, one of a rise time and a fall time of the second signal being longer than the other of the rise time and the fall time of the second signal, the first signal and the second signal forming a dead time.

According to another aspect of the invention, there is provided a delay method comprising:
- providing an input signal;
- generating a first signal based on the input signal using a first inverter circuit, one of a rise time and a fall time of the first signal being longer than the other of the rise time and the fall time of the first signal; and
- generating a second signal based on the input signal using a second inverter circuit, one of a rise time and a fall time of the second signal being longer than the other of the rise time and the fall time of the second signal.

DESCRIPTION OF EXEMPLARY EMBODIMENTS

Figure 1:
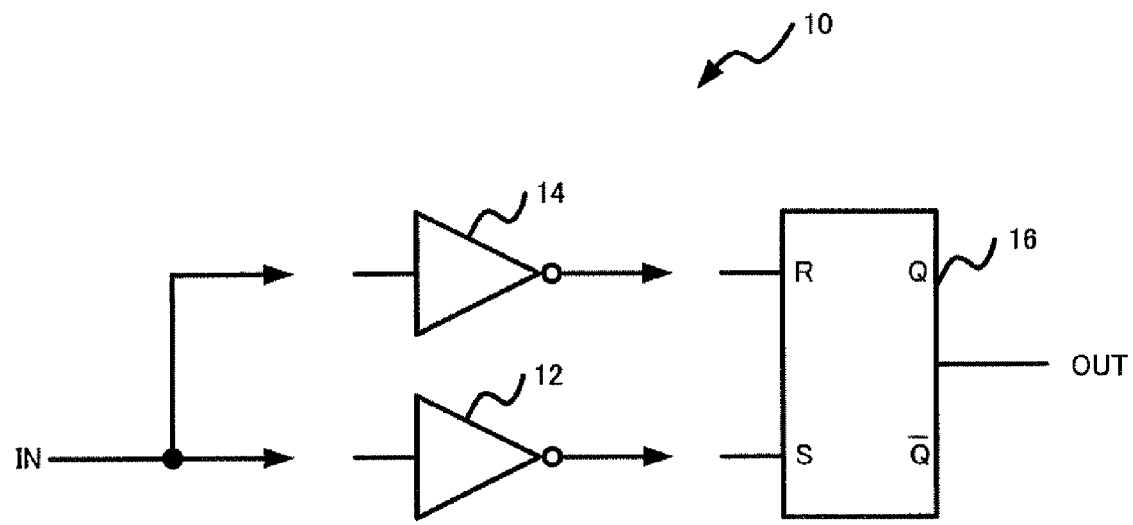
FIG. 1 is a schematic block diagram showing a noise filter circuit according to the invention.

Several aspects of the invention may provide a noise filter circuit, a dead time circuit, and a delay circuit having a simple structure, a noise filter method, a dead time method, a delay method, a thermal head driver, and an electronic instrument.

According to one embodiment of the invention, there is provided a noise filter circuit comprising:

a first inverter circuit that receives a signal based on an input signal;

a second inverter circuit that receives a signal based on the input signal; and a latch circuit that receives signals based on a signal output from the first inverter circuit and a signal based on a signal output from the second inverter circuit as a set signal and a reset signal, each of the first inverter circuit and the second inverter circuit including a first-conductivity-type transistor and a second-conductivity-type transistor the capability of one of the first-conductivity-type transistor and the second-conductivity-type transistor being lower than the capability of the other of the first-conductivity-type transistor and the second-conductivity-type transistor.

According to the above embodiment a noise filter circuit having a simple structure can be provided. Moreover, successive noises can be removed.

In the noise filter circuit, one of the first inverter circuit and the second inverter circuit may include a P-type transistor and an N-type transistor, the capability of the P-type transistor may be lower than the capability of the N-type transistor; and the other of the first inverter circuit and the second inverter circuit may include a P-type transistor and an N-type transistor, the capability of the P-type transistor may be lower than the capability of the N-type transistor.

Each of the first inverter circuit and the second inverter circuit may include the same type of inverter circuit (i.e., an inverter circuit in which the capability of the P-type transistor is lower than the capability of the N-type transistor). As a result, a variation in delay amount of the noise filter circuit can be reduced. Since each of the first inverter circuit and the second inverter circuit includes an inverter circuit in which the capability of the P-type transistor is lower than the capability of the N-type transistor, the noise filter circuit has a reduced chip size.

In the noise filter circuit, one of the first inverter circuit and the second inverter circuit may include a P-type transistor and an N-type transistor, the capability of the N-type transistor may be lower than the capability of the P-type transistor; and the other of the first inverter circuit and the second inverter circuit may include a P-type transistor and an N-type transistor, the capability of the N-type transistor may be lower than the capability of the P-type transistor.

Each of the first inverter circuit and the second inverter circuit may include the same type of inverter circuit (i.e., an inverter circuit in which the capability of the N-type transistor is lower than the capability of the P-type transistor). As a result, a variation in delay amount of the noise filter circuit can be reduced.

In the noise filter circuit, one of the first inverter circuit and the second inverter circuit may include a P-type transistor and an N-type transistor, the capability of the N-type transistor may be lower than the capability of the P-type transistor; and the other of the first inverter circuit and the second inverter circuit may include a P-type transistor and an N-type transistor, the capability of the P-type transistor may be lower than the capability of the N-type transistor.

Since the other of the first inverter circuit and the second inverter circuit includes an inverter circuit in which the capability of the P-type transistor is lower than the capability of the N-type transistor, the noise filter circuit has a reduced chip size.

In the above noise filter circuit, one of the first inverter circuit and the second inverter circuit may receive the input signal through a third inverter circuit.

In the above noise filter circuit, the latch circuit may receive the signal output from one of the first inverter circuit and the second inverter circuit through a third inverter circuit.

According to another embodiment of the invention, there is provided a noise filter circuit comprising:

a first delay circuit that receives an input signal;

an AND circuit that receives the input signal and a signal output from the first delay circuit;

an OR circuit that receives the input signal and the signal output from the first delay circuit;

a latch circuit that receives signals based on a signal output from the AND circuit and a signal based on a signal output from the OR circuit as a set signal and a reset signal;

a second delay circuit that receives the signal output from the AND circuit; and a third delay circuit that receives the signal output from the OR circuit, each of the second delay circuit and the third delay circuit including an inverter circuit;

each of the inverter circuits including a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor; and the latch circuit receiving the signal based on the signal output from the AND circuit and the signal based on the signal output from the OR circuit through the second delay circuit and the third delay circuit.

According to the above embodiment, successive noises can be removed.

According to another embodiment of the inventions there is provided a dead time circuit comprising:

a first inverter circuit that receives a signal based on an input signal; and a second inverter circuit that receives a signal based on the input signal, each of the first inverter circuit and the second inverter circuit including a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor; and a combination of signals output from the first inverter circuit and the second inverter circuit forming a dead time.

According to the above embodiment, a dead time circuit having a simple structure can be provided.

The above dead time circuit may further comprise: a first waveform adjusting circuit that receives a signal based on a signal output from the first inverter circuit; and a second waveform adjusting circuit that receives a signal based on a signal output from the second inverter circuit, and a signal output from the first waveform adjusting circuit and a signal output from the second waveform adjusting circuit may form a dead time.

In the dead time circuit, one of the first inverter circuit and the second inverter circuit may include a P-type transistor and an N-type transistor, the capability of the P-type transistor may be lower than the capability of the N-type transistor; and the other of the first inverter circuit and the second inverter circuit may include a P-type transistor and an N-type transistor, the capability of the P-type transistor may be lower than the capability of the N-type transistor.

Each of the first inverter circuit and the second inverter circuit may include the same type of inverter circuit (i.e., an inverter circuit in which the capability of the P-type transistor is lower than the capability of the N-type transistor). As a result, a variation in dead time of the dead time circuit can be reduced. Since each of the first inverter circuit and the second inverter circuit includes an inverter circuit in which the capability of the P-type transistor is lower than the capability of the N-type transistor, the dead time circuit has a reduced chip size.

In the dead time circuit, one of the first inverter circuit and the second inverter circuit may include a P-type transistor and an N-type transistor, the capability of the N-type transistor may be lower than the capability of the P-type transistor; and the other of the first inverter circuit and the second inverter circuit may include a P-type transistor and an N-type transistor, the capability of the N-type transistor may be lower than the capability of the P-type transistor.

Each of the first inverter circuit and the second inverter circuit may include the same type of inverter circuit (i.e., an inverter circuit in which the capability of the N-type transistor is lower than the capability of the P-type transistor). As a result, a variation in dead time of the dead time circuit can be reduced.

In the dead time circuit, one of the first inverter circuit and the second inverter circuit may include a P-type transistor and an N-type transistor, the capability of the N-type transistor may be lower than the capability of the P-type transistor; and the other of the first inverter circuit and the second inverter circuit may include a P-type transistor and an N-type transistor, the capability of the P-type transistor may be lower than the capability of the N-type transistor.

Since the other of the first inverter circuit and the second inverter circuit includes an inverter circuit in which the capability of the P-type transistor is lower than the capability of the N-type transistor, the dead time circuit has a reduced chip size.

In the above dead time circuit, one of the first inverter circuit and the second inverter circuit may receive the input signal through a third inverter circuit.

According to another embodiment of the invention, there is provided a delay circuit comprising:

an inverter circuit that receives a signal based on an input signal, the inverter circuit including a plurality of inverter circuits, each of the plurality of inverter circuits including a first-conductivity-type transistor and a second-conductivity-type transistor, the capability of one of the first-conductivity-type transistor and the second-conductivity-type transistor being lower than the capability of the other of the first-conductivity-type transistor and the second-conductivity-type transistor.

According to the above embodiment, a delay circuit having a simple structure can be provided.

In the above delay circuit, the plurality of inverter circuits may be connected in series; and the conductivity type of a low-capability transistor of each of the plurality of inverter circuits may be identical, the low-capability transistor being one of the first-conductivity-type transistor and the second-conductivity-type transistor that has a capability lower than the capability of the other of the first-conductivity-type transistor and the second-conductivity-type transistor.

The above delay circuit may further comprise a non-inverting waveform adjusting circuit connected in series between inverter circuits among the plurality of inverter circuits.

In the above delay circuit, the plurality of inverter circuits may be connected in series;

the plurality of inverter circuits may include an even number of successive inverter circuits and one subsequent inverter circuit;

the conductivity type of a low-capability transistor may alternately differ between the even number of successive inverter circuits, the low-capability transistor being one of the first-conductivity-type transistor and the second-conductivity-type transistor that has a capability lower than the capability of the other of the first-conductivity-type transistor and the second-conductivity-type transistor;

the conductivity type of the low-capability transistor of a final inverter circuit among the even number of successive inverter circuits may differ from the conductivity type of the low-capability transistor of the one subsequent inverter circuit; and the delay circuit may further comprise an inverting waveform adjusting circuit connected in series between the even number of successive inverter circuits and the one subsequent inverter circuit.

In the above delay circuit, the plurality of inverter circuits may be connected in series;

the plurality of inverter circuits may include an even number of successive inverter circuits and one subsequent inverter circuit;

the conductivity type of a low-capability transistor may alternately differ between the even number of successive inverter circuits, the low-capability transistor being one of the first-conductivity-type transistor and the second-conductivity-type transistor that has a capability lower than the capability of the other of the first-conductivity-type transistor and the second-conductivity-type transistor;

the conductivity type of the low-capability transistor of a final inverter circuit among the even number of successive inverter circuits may be the same as the conductivity type of the low-capability transistor of the one subsequent inverter circuit; and the delay circuit may further comprise a non-inverting waveform adjusting circuit connected in series between the even number of successive inverter circuits and the one subsequent inverter circuit.

In the above delay circuit, the plurality of inverter circuits may be connected in series;

the plurality of inverter circuits may include an odd number of successive inverter circuits and one subsequent inverter circuit;

the conductivity type of a low-capability transistor may alternately differ between the odd number of successive inverter circuits, the low-capability transistor being one of the first-conductivity-type transistor and the second-conductivity-type transistor that has a capability lower than the capability of the other of the first-conductivity-type transistor and the second-conductivity-type transistor;

the conductivity type of the low-capability transistor of a final inverter circuit among the odd number of successive inverter circuits may be the same as the conductivity type of the low-capability transistor of the one subsequent inverter circuit; and the delay circuit may further comprise a non-inverting waveform adjusting circuit connected in series between the odd number of successive inverter circuits and the one subsequent inverter circuit.

In the above delay circuit, the plurality of inverter circuits may be connected in series;

the plurality of inverter circuits may include an odd number of successive inverter circuits and one subsequent inverter circuit;

the conductivity type of a low-capability transistor may alternately differ between the odd number of successive inverter circuits, the low-capability transistor being one of the first-conductivity-type transistor and the second-conductivity-type transistor that has a capability lower than the capability of the other of the first-conductivity-type transistor and the second-conductivity-type transistor;

the conductivity type of the low-capability transistor of a final inverter circuit among the odd number of successive inverter circuits may differ from the conductivity type of the low-capability transistor of the one subsequent inverter circuit; and the delay circuit may further comprise an inverting waveform adjusting circuit connected in series between the odd number of successive inverter circuits and the one subsequent inverter circuit.

The above delay circuit may further comprise a waveform adjusting circuit that receives a signal based on a signal output from the inverter circuit.

The delay circuit may further comprise:

a waveform adjusting circuit that receives a signal based on a signal output from the inverter circuit, the plurality of inverter circuits may include a first inverter circuit and a second inverter circuit connected in parallel; and the waveform adjusting circuit may be a latch circuit.

The above delay circuit may further comprise:

a first inverting waveform adjusting circuit connected in series to the first inverter circuit;

a subsequent first inverter circuit connected in series to the first inverting waveform adjusting circuit;

a second inverting waveform adjusting circuit connected in series to the second inverter circuit;

a subsequent second inverter circuit connected in series to the second inverting waveform adjusting circuit; and a third inverter circuit connected in series to the preceding stage of the first inverter circuit, the subsequent stage of the subsequent first inverter circuit, the preceding stage of the second inverter circuit, or the subsequent stage of the subsequent second inverter circuit, the conductivity type of a low-capability transistor of the first inverter circuit may be the same as the conductivity type of the low-capability transistor of the subsequent first inverter circuit, the low-capability transistor being one of the first-conductivity-type transistor and the second-conductivity-type transistor that has a capability lower than the capability of the other of the first-conductivity-type transistor and the second-conductivity-type transistor; and the conductivity type of the low-capability transistor of the second inverter circuit may be the same as the conductivity type of the low-capability transistor of the subsequent second inverter circuit.

The above delay circuit may further comprise:

a first inverting waveform adjusting circuit connected in series to the first inverter circuit;

a subsequent first inverter circuit connected in series to the first inverting waveform adjusting circuit;

a second inverting waveform adjusting circuit connected in series to the second inverter circuit;

a subsequent second inverter circuit connected in series to the second inverting waveform adjusting circuit; and a third inverter circuit connected in series to the preceding stage of the first inverter circuit, the subsequent stage of the subsequent first inverter circuit, the preceding stage of the second inverter circuit, or the subsequent stage of the subsequent second inverter circuit, the first inverter circuit may include an even number of successive first inverter circuits;

the conductivity type of a low-capability transistor may alternately differ between the even number of successive first inverter circuits, the low-capability transistor being one of the first-conductivity-type transistor and the second-conductivity-type transistor that has a capability lower than the capability of the other of the first-conductivity-type transistor and the second-conductivity-type transistor, and the conductivity type of the low-capability transistor of a final inverter circuit among the even number of successive first inverter circuits may be the same as the conductivity type of the low-capability transistor of the subsequent first inverter circuit;

the second inverter circuit may include an even number of successive second inverter circuits; and the conductivity type of the low-capability transistor may alternately differ between the even number of successive second inverter circuits, and the conductivity type of the low-capability transistor of a final inverter circuit among the even number of successive second inverter circuits may be the same as the conductivity type of the low-capability transistor of the subsequent second inverter circuit.

The above delay circuit may further comprise:

a first non-inverting waveform adjusting circuit connected in series to the first inverter circuit;

a subsequent first inverter circuit connected in series to the first non-inverting waveform adjusting circuit;

a second non-inverting waveform adjusting circuit connected in series to the second inverter circuit;

a subsequent second inverter circuit connected in series to the second non-inverting waveform adjusting circuit; and a third inverter circuit connected in series to the preceding stage of the first inverter circuit, the subsequent stage of the subsequent first inverter circuit, the preceding stage of the second inverter circuit, or the subsequent stage of the subsequent second inverter circuit, the first inverter circuit may include an even number of successive first inverter circuits;

the conductivity type of a low-capability transistor may alternately differ between the even number of successive first inverter circuits, the low-capability transistor being one of the first-conductivity-type transistor and the second-conductivity-type transistor that has a capability lower than the capability of the other of the first-conductivity-type transistor and the second-conductivity-type transistor, and the conductivity type of the low-capability transistor of a final inverter circuit among the even number of successive first inverter circuits may differ from the conductivity type of the low-capability transistor of the subsequent first inverter circuit;

the second inverter circuit may include an even number of successive second inverter circuits; and the conductivity type of the low-capability transistor may alternately differ between the even number of successive second inverter circuits, and the conductivity type of the low-capability transistor of a final inverter circuit among the even number of successive second inverter circuits may differ from the conductivity type of the low-capability transistor of the subsequent second inverter circuit.

The above delay circuit may further comprise:

a first inverting waveform adjusting circuit connected in series to the first inverter circuit;

a subsequent first inverter circuit connected in series to the first inverting waveform adjusting circuit;

a second inverting waveform adjusting circuit connected in series to the second inverter circuit;

a subsequent second inverter circuit connected in series to the second inverting waveform adjusting circuit; and a third inverter circuit connected in series to the preceding stage of the first inverter circuit, the subsequent stage of the subsequent first inverter circuit, the preceding stage of the second inverter circuit, or the subsequent stage of the subsequent second inverter circuit, the first inverter circuit may include an odd number of successive first inverter circuits;

the conductivity type of a low-capability transistor may alternately differ between the odd number of successive first inverter circuits, the low-capability transistor being one of the first-conductivity-type transistor and the second-conductivity-type transistor that has a capability lower than the capability of the other of the first-conductivity-type transistor and the second-conductivity-type transistor, and the conductivity type of the low-capability transistor of a final inverter circuit among the odd number of successive first inverter circuits may be the same as the conductivity type of the low-capability transistor of the subsequent first inverter circuit;

the second inverter circuit may include an odd number of successive second inverter circuits; and the conductivity type of the low-capability transistor may alternately differ between the odd number of successive second inverter circuits, and the conductivity type of the low-capability transistor of a final inverter circuit among the odd number of successive second inverter circuits may be the same as the conductivity type of the low-capability transistor of the subsequent second inverter circuit.

The above delay circuit may further comprise:

a first non-inverting waveform adjusting circuit connected in series to the first inverter circuit;

a subsequent first inverter circuit connected in series to the first non-inverting waveform adjusting circuit;

a second non-inverting waveform adjusting circuit connected in series to the second inverter circuit;

a subsequent second inverter circuit connected in series to the second non-inverting waveform adjusting circuit; and a third inverter circuit connected in series to the preceding stage of the first inverter circuit, the subsequent stage of the subsequent first inverter circuit, the preceding stage of the second inverter circuit, or the subsequent stage of the subsequent second inverter circuit, the first inverter circuit may include an odd number of successive first inverter circuits;

the conductivity type of the low-capability transistor may alternately differ between the odd number of successive first inverter circuits, the low-capability transistor being one of the first-conductivity-type transistor and the second-conductivity-type transistor that has a capability lower than the capability of the other of the first-conductivity-type transistor and the second-conductivity-type transistor, and the conductivity type of the low-capability transistor of a final inverter circuit among the odd number of successive first inverter circuits may differ from the conductivity type of the low-capability transistor of the subsequent first inverter circuit;

the second inverter circuit may include an odd number of successive second inverter circuits; and the conductivity type of the low-capability transistor may alternately differ between the odd number of successive second inverter circuits, and the conductivity type of the low-capability transistor of a final inverter circuit among the odd number of successive second inverter circuits may differ from the conductivity type of the low-capability transistor of the subsequent second inverter circuit.

The above noise filter circuit may be applied to a thermal head driver, a thermal head, an electronic instrument, and a printing system, for example.

Therefore, a thermal head driver, a thermal head, an electronic instrument, and a printing system can be provided at low cost.

The above dead time circuit may be applied to a control circuit and an electronic instrument, for example.

Therefore, a control circuit and an electronic instrument can be provided at low cost.

The above delay circuit may be applied to a noise filter circuit, a thermal head driver, and an electronic instrument, for example.

Therefore, a noise filter circuit, a thermal head driver, and an electronic instrument can be provided at low cost.

According to another embodiment of the invention, there is provided a noise filter method comprising:

providing an input signal;

generating a first signal based on the input signal using a first inverter circuit, one of a rise time and a fall time of the first signal being longer than the other of the rise time and the fall time of the first signal;

generating a second signal based on the input signal using a second inverter circuit, one of a rise time and a fall time of the second signal being longer than the other of the rise time and the fall time of the second signal; and inputting signals based on the first signal and a signal based on the second signal to a latch circuit as a set signal and a reset signal.

According to the above embodiment, a noise filter circuit that executes the noise filter method has a simple structure.

According to another embodiment of the invention, there is provided a noise filter method comprising:

providing an input signal;

delaying the input signal;

inputting the input signal and the delayed signal to an AND circuit;

inputting the input signal and the delayed signal to an OR circuit;

inputting signals based on a signal output from the AND circuit and a signal based on a signal output from the OR circuit to a latch circuit as a set signal and a reset signal;

generating a first signal based on a signal output from the AND circuit, one of a rise time and a fall time of the first signal being longer than the other of the rise time and the fall time of the first signal; and generating a second signal based on a signal output from the OR circuit, one of a rise time and a fall time of the second signal being longer than the other of the rise time and the fall time of the second signal.

According to the above embodiment, a noise filter circuit that executes the noise filter method has a simple structure.

According to another embodiment of the invention, there is provided a dead time method comprising:

providing an input signal;

generating a first signal based on the input signal using a first inverter circuit, one of a rise time and a fall time of the first signal being longer than the other of the rise time and the fall time of the first signal; and generating a second signal based on the input signal using a second inverter circuit, one of a rise time and a fall time of the second signal being longer than the other of the rise time and the fall time of the second signal, the first signal and the second signal forming a dead time.

According to the above embodiment, a dead time circuit that executes the dead time method has a simple structure.

According to another embodiment of the invention, there is provided a delay method comprising:

providing an input signal;

generating a first signal based on the input signal using a first inverter circuit, one of a rise time and a fall time of the first signal being longer than the other of the rise time and the fall time of the first signal; and generating a second signal based on the input signal using a second inverter circuit, one of a rise time and a fall time of the second signal being longer than the other of the rise time and the fall time of the second signal.

According to the above embodiment, a delay circuit that executes the delay method has a simple structure.

A further embodiment of the invention relates to a delay method comprising:

providing an input signal;

generating a first signal based on the input signal using a first inverter circuit, one of a rise time and a fall time of the first signal being longer than the other of the rise time and the fall time of the first signal, generating a second signal based on the input signal using a second inverter circuit, one of a rise time and a fall time of the second signal being longer than the other of the rise time and the fall time of the second signal; and inputting the generated first signal and the generated second signal to a latch circuit to effect a waveform adjustment.

According to the above embodiment, a delay circuit that executes the delay method has a simple structure.

A person skilled in the art would readily appreciate that the above-described embodiments of the invention may be modified without materially departing from the spirit and the scope of the invention. For example, at least one element of one embodiment of the invention may be added to another embodiment of the invention. Alternatively, at least one element of one embodiment of the invention may be replaced by at least one element of another embodiment of the invention.

Several specific embodiments of the invention are described in detail below with reference to the drawings. The following specific embodiments are given so that the invention can be readily understood. Accordingly, the invention is not limited to the following specific embodiments.

1. Noise Filter Circuit 1.1 Operation Principle of Noise Filter Circuit

FIG. 1 is a schematic block diagram showing a noise filter circuit according to the invention.

A noise filter circuit 10 shown in FIG. 1 includes first and second inverter circuits 12 and 14 that receive signals based on an input signal (IN), and a latch circuit 16 that receives signals based on signals output from the first and second inverter circuits 12 and 14 as a set signal (S) and a reset signal (R).

The first inverter circuit 12 inverts a signal based on the input signal (IN) (e.g., a signal (IN') obtained by inverting the input signal (IN)), and outputs the inverted signal. The first inverter circuit 12 includes a first-conductivity-type transistor and a second-conductivity-type transistor. The capability (current drive capability) of one of the first-conductivity-type transistor and the second-conductivity-type transistor is lower than the capability of the other of the first-conductivity-type transistor and the second-conductivity-type transistor. The first inverter circuit 12 includes a CMOS transistor, for example.

The second inverter circuit 14 inverts a signal based on the input signal (IN) (e.g., the input signal (IN)), and outputs the inverted signal. The second inverter circuit 14 includes a first-conductivity-type transistor and a second-conductivity-type transistor. The capability of one of the first-conductivity-type transistor and the second-conductivity-type transistor is lower than the capability of the other of the first-conductivity-type transistor and the second-conductivity-type transistor. The second inverter circuit 14 includes a CMOS transistor, for example.

The latch circuit 16 receives a signal based on the signal output from the first inverter circuit 12 (e.g., the signal output from the first inverter circuit 12) as the set signal (S). The latch circuit 16 receives a signal based on the signal output from the second inverter circuit 14 (e.g., the signal output from the second inverter circuit 14) as the reset signal (R). The latch circuit 16 stores two output levels (Q and Q_) corresponding to the timings of the set signal (S) and the reset signal (R). The latch circuit 16 outputs one (e.g., Q) of the two output levels (Q and Q_).

The symbol "Q_" used herein means that a bar is attached to the top of a symbol "Q" (see FIG. 1) (i.e., the output level Q is inverted).

Figure 2:
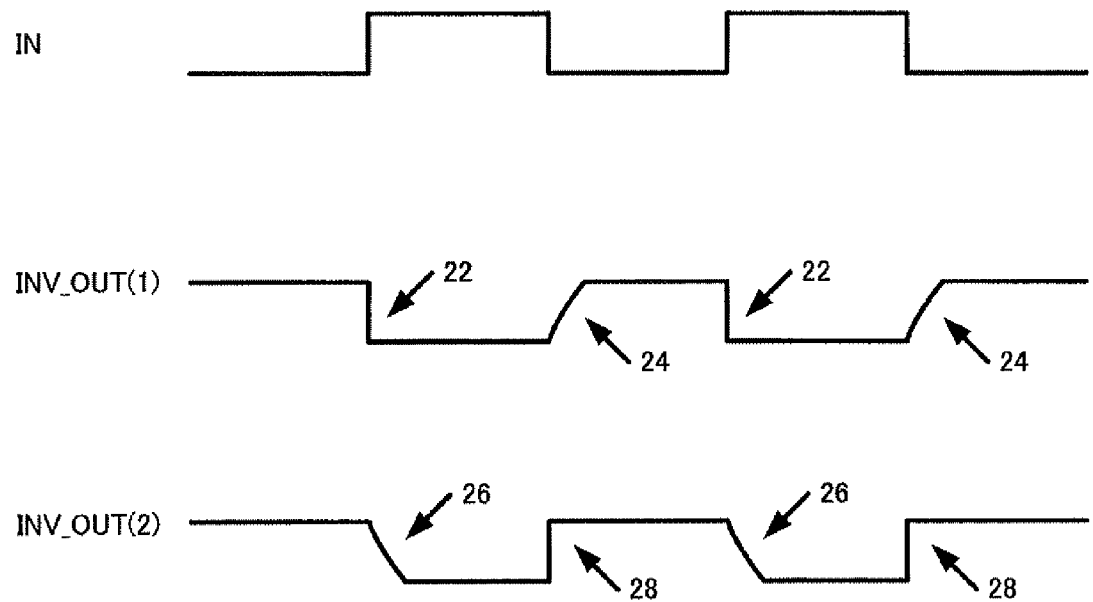
FIG. 2 is a timing diagram illustrative of the operation of a noise filter circuit 10 shown in FIG. 1.

FIG. 2 is a timing diagram illustrative of the operation of the noise filter circuit 10 shown in FIG. 1.

The input signal (IN) shown in FIG. 2 is a periodic rectangular wave that does not contain noise. Either or both of two inverter output signals (INV_OUT(1) and INV_OUT(2)) shown in FIG. 2 correspond to either or both of the outputs from the first and second inverter circuits 12 and 14.

Each of the first and second inverter circuits 12 and 14 includes a first-conductivity-type transistor and a second-conductivity-type transistor, and the capability of one of the first-conductivity-type transistor and the second-conductivity-type transistor is lower than the capability of the other of the first-conductivity-type transistor and the second-conductivity-type transistor, as described above.

The fall time (see arrow 22) of the inverter output signal (INV_OUT(1)) shown in FIG. 2 is significantly shorter than the rise time (see arrow 24) of the inverter output signal (INV_OUT(1)), and therefore, it is disregardable. The rise time (see arrow 28) of the inverter output signal (INV_OUT(2)) shown in FIG. 2 is significantly shorter than the fall time (see arrow 26) of the inverter output signal (INV_OUT(2)), and therefore, it is disregardable.

The rise time and the fall time of the input signal (IN) shown in FIG. 2 are significantly shorter than the delay amount of the first inverter circuit 12 or the second inverter circuit 14, and therefore, they are disregardable.

1.2 Operation of Noise Filter Circuit (1)

Figure 3:
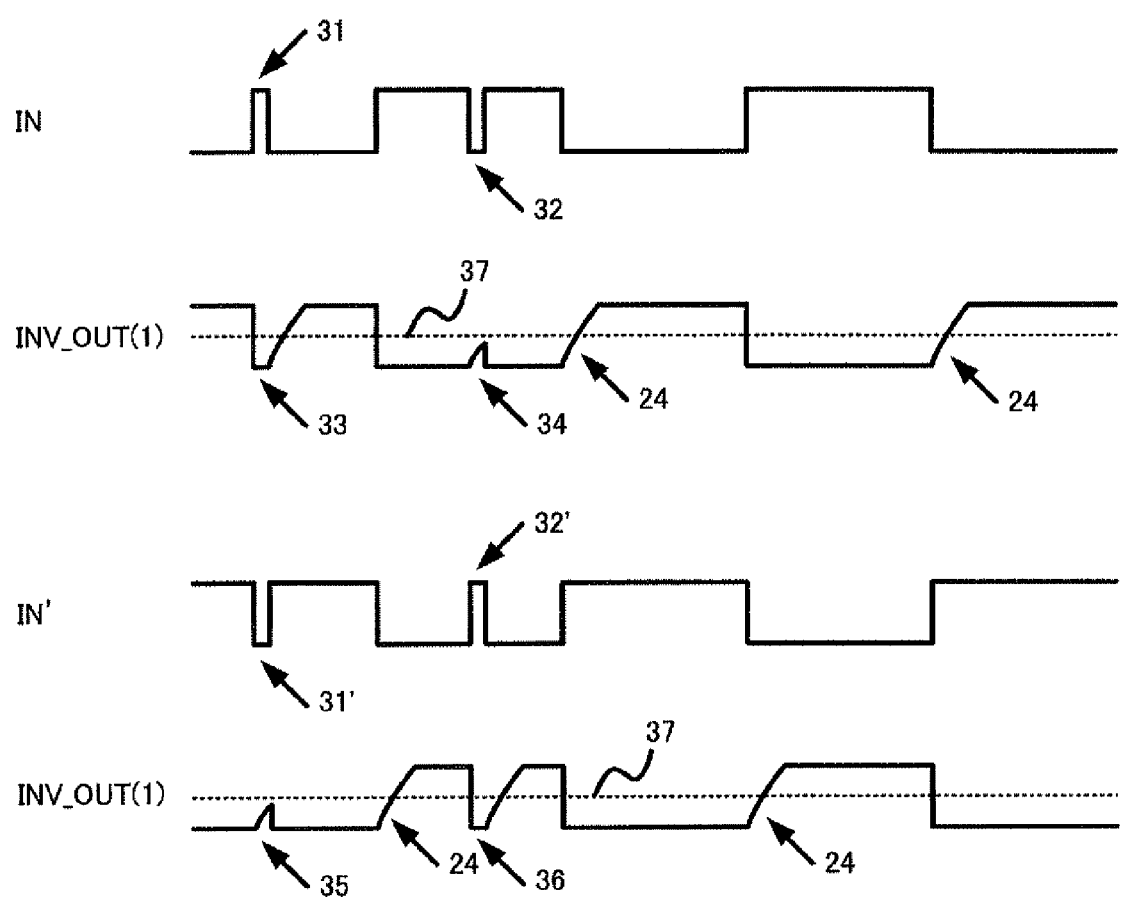
FIG. 3 is a timing diagram illustrative of the operation of the noise filter circuit 10 shown in FIG. 1.

FIG. 3 is a timing diagram illustrative of the operation of the noise filter circuit 10 shown in FIG. 1.

In FIG. 3, an inverter output signal (INV_OUT(1)) shown on the upper side corresponds to the second inverter circuit 14 shown in FIG. 1, and an inverter output signal (INV_OUT(1)) shown on the lower side corresponds to the first inverter circuit 12 shown in FIG. 1, for example.

The input signal (IN) shown in FIG. 3 includes a first noise and a second noise (see arrows 31 and 32) having a pulse width smaller than the HIGH-side or LOW-side pulse width of the input signal (IN). The inverter output signal (INV_OUT(1)) shown on the upper side of FIG. 3 indicates a signal obtained by inverting the input signal (IN) that includes the first noise and the second noise (31 and 32).

The input signal' (IN') shown in FIG. 3 indicates a signal obtained by inverting the input signal (IN) that includes the first noise and the second noise (31 and 32). The inverter output signal (INV_OUT(1)) shown on the lower side of FIG. 3 indicates a signal obtained by inverting the input signal' (IN').

In FIG. 3, the first noise (31) included in the input signal (IN) corresponds to a noise (see arrow 33) included in the inverter output signal (INV_OUT(1)) on the upper side, a noise (see arrow 31') included in the input signal' (IN'), and a noise (see arrow 35) included in the inverter output signal (INV_OUT(1)) on the lower side. The second noise (32) included in the input signal (IN) corresponds to a noise (see arrow 34) included in the inverter output signal (INV_OUT (1)) on the upper side, a noise (see arrow 32') included in the input signal' (IN'), and a noise (see arrow 36) included in the inverter output signal (INV_OUT(1)) on the lower side.

In FIG. 3, a dotted line 37 indicates an input threshold value with regard to the set signal (S) and the reset signal (R) of the latch circuit 16. The input threshold value 37 shown in FIG. 3 is the same with regard to the set signal (S) and the reset signal (R). Note that the input threshold value 37 may differ between the set signal (S) and the reset signal (R).

As shown in FIG. 3, when the rise time (24) of the inverter output signal (INV_OUT(1)) obtained by inverting the input signal (IN) is sufficiently longer than the fall time, the noise (34) does not exceed the input threshold value 37. Therefore, the latch circuit 16 can disregard the noise (34).

As shown in FIG. 3, when the rise time (24) of the inverter output signal (INV_OUT(1)) obtained by inverting the input signal' (IN') is sufficiently longer than the fall time, the noise (35) does not exceed the input threshold value 37. Therefore, the latch circuit 16 can disregard the noise (35).

The inverter output signal (INV_OUT(1)) shown on the upper side of FIG. 3 and the inverter output signal (INV_OUT (1)) shown on the lower side of FIG. 3 can thus be used as the set signal (S) and the reset signal (R), for example. As a result, the latch circuit 16 can also disregard the noise (33) and the noise (36).

A related-art noise filter circuit is disclosed in FIG. 1 of JP-A-2003-163583, for example. In such a noise filter circuit a delay circuit, a NAND circuit, and an OR circuit are disposed between an input signal and a latch circuit. On the other hand, the noise filter circuit 10 according to the invention includes the first and second inverter circuits 12 and 14 having a simple structure instead of a delay circuit, a NAND circuit, and an OR circuit, as shown in FIG. 1.

Even if the first noise (31) included in the input signal (IN) shown in FIG. 3 includes successive noises (131-1 and 131-2) (see FIG. 13 described later), for example, the successive noises do not exceed the input threshold value 37. Likewise, even if the second noise (32) included in the input signal (IN) shown in FIG. 3 includes successive noises, the successive noises do not exceed the input threshold value 37. Therefore, the noise filter circuit 10 according to the invention can remove successive noises. On the other hand, a related-art noise filter circuit may not be able to remove successive noises (described later).

1.3 Operation of Noise Filter Circuit (2)

Figure 4:
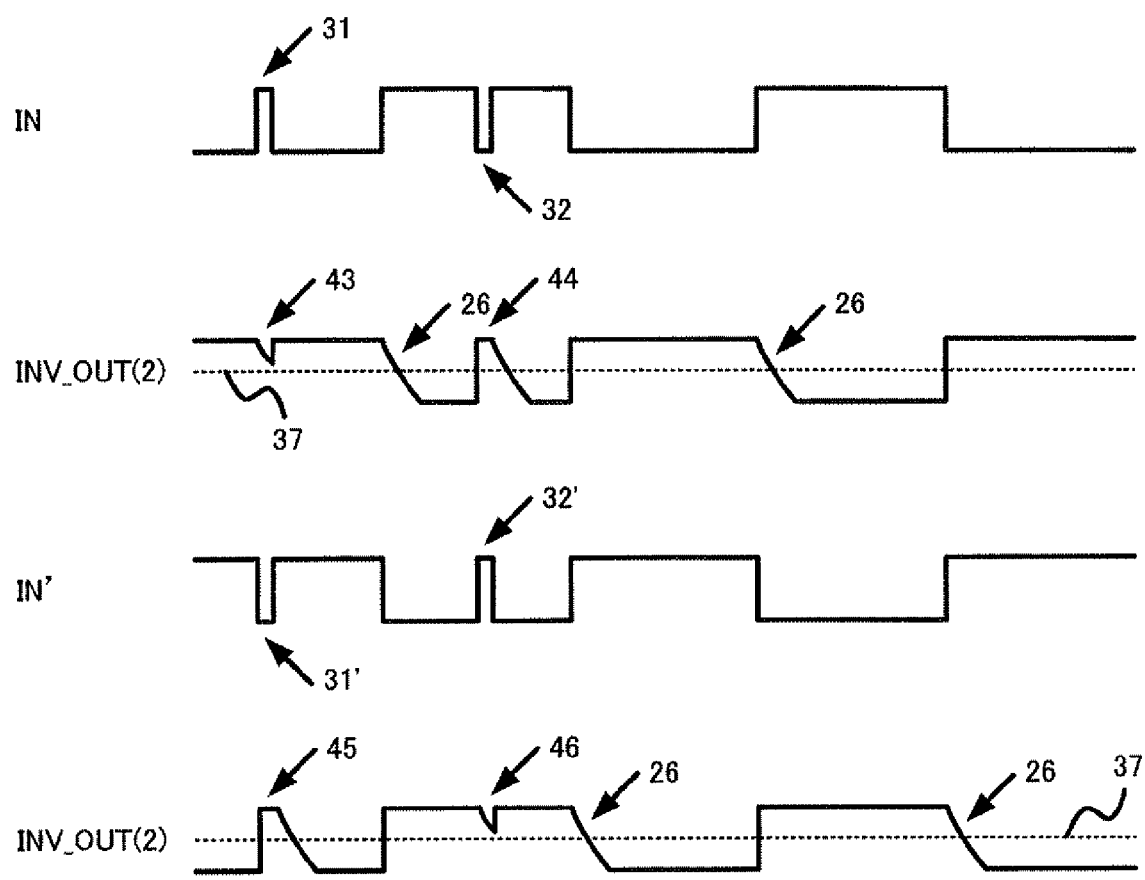
FIG. 4 is another timing diagram illustrative of the operation of the noise filter circuit 10 shown in FIG. 1.

FIG. 4 is another timing diagram illustrative of the operation of the noise filter circuit 10 shown in FIG. 1.

In FIG. 4, an inverter output signal (INV_OUT(2)) shown on the upper side corresponds to the first inverter circuit 12 shown in FIG. 1, and an inverter output signal (INV_OUT(2)) shown on the lower side corresponds to the second inverter circuit 14 shown in FIG. 1, for example.

An input signal (IN) and an input signal' (IN') shown in FIG. 4 correspond to the input signal (IN) and the input signal' (IN') shown in FIG. 3.

The inverter output signal (INV_OUT(2)) shown on the upper side of FIG. 4 indicates a signal obtained by inverting the input signal (IN), and the inverter output signal (INV_OUT(2)) shown on the lower side of FIG. 4 indicates a signal obtained by inverting the input signal' (IN').

As shown in FIG. 4, when the fall time (26) of the inverter output signal (INV_OUT(2)) obtained by inverting the input signal (IN) is sufficiently longer than the rise time, a noise (43) does not exceed the input threshold value 37. Therefore, the latch circuit 16 can disregard the noise (43).

As shown in FIG. 4, when the fall time (26) of the inverter output signal (INV_OUT(2)) obtained by inverting the input signal' (IN') is sufficiently longer than the rise time, a noise (46) does not exceed the input threshold value 37. Therefore, the latch circuit 16 can disregard the noise (46).

The inverter output signal (INV_OUT(2)) shown on the upper side of FIG. 4 and the inverter output signal (INV_OUT (2)) shown on the lower side of FIG. 4 can thus be used as the set signal (S) and the reset signal (R), for example. As a result, the latch circuit 16 can also disregard a noise (44) and a noise (45).

1.4 Operation of Noise Filter Circuit (3)

Figure 5:
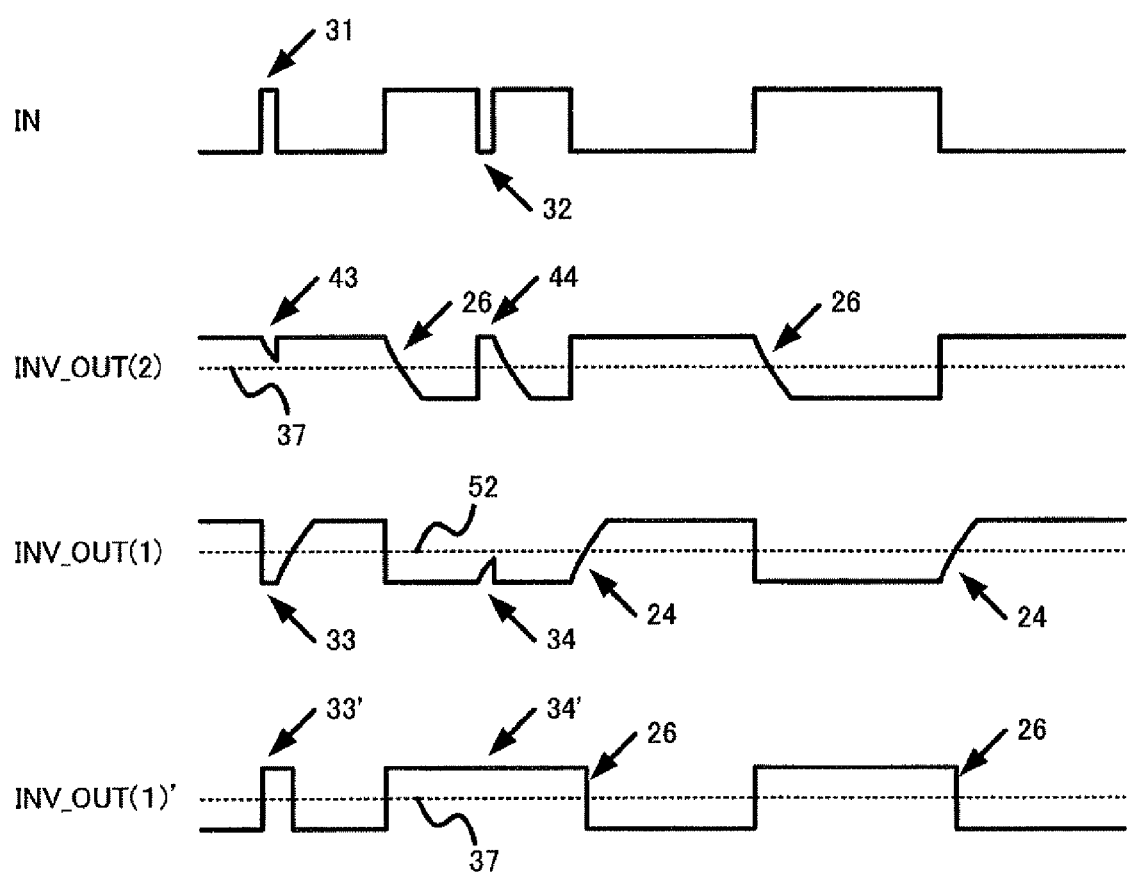
FIG. 5 is a farther timing diagram illustrative of the operation of the noise filter circuit 10 shown in FIG. 1.

FIG. 5 is a further timing diagram illustrative of the operation of the noise filter circuit 10 shown in FIG. 1.

In FIG. 5, an inverter output signal (INV_OUT(2)) shown on the upper side corresponds to the first inverter circuit 12 shown in FIG. 1, and an inverter output signal (INV_OUT(1)) shown on the lower side corresponds to the second inverter circuit 14 shown in FIG. 1, for example.

An input signal (IN) shown in FIG. 5 corresponds to the input signal (IN) shown in FIG. 3.

The inverter output signal (INV_OUT(2)) shown on the upper side of FIG. 5 indicates a signal obtained by inverting the input signal (IN) (i.e., the inverter output signal (INV_OUT(2)) shown on the upper side of FIG. 4).

The inverter output signal (INV_OUT(1)) shown on the lower side of FIG. 5 indicates a signal obtained by inverting the input signal (IN) (i.e., the inverter output signal (INV_OUT(1)) shown on the upper side of FIG. 3).

An inverter output signal' (INV_OUT(1)') shown in FIG. 5 indicates a signal that is obtained by inverting the inverter output signal (INV_OUT(1)) shown on the lower side of FIG. 5 and subjected to a waveform adjustment.

As shown in FIG. 5, when the fall time (26) of the inverter output signal (INV_OUT(2)) obtained by inverting the input signal (IN) is sufficiently longer than the rise time, the noise (43) does not exceed the input threshold value 37 of the latch circuit 16. Therefore, the latch circuit 16 can disregard the noise (43).

As shown in FIG. 5, when the rise time (24) of the inverter output signal (INV_OUT(1)) obtained by inverting the input signal (IN) is sufficiently longer than the fall time, the noise (34) does not exceed an input threshold value 52 of the circuit that inverts the inverter output signal (INV_OUT(1)).

Therefore, the inverter output signal' (INV_OUT(1)') that is obtained by inverting the inverter output signal (INV_OUT (1)) and subjected to a waveform adjustment does not include the noise (34) (see arrow 34'). As a result, the latch circuit 16 can disregard the noise (34).

The inverter output signal (INV_OUT(2)) shown on the upper side of FIG. 5 and the inverter output signal' (INV_OUT(1)') shown in FIG. 5 can thus be used as the set signal (S) and the reset signal (R), for example. As a result, the latch circuit 16 can also disregard the noise (44) and the noise (33).

In FIG. 5, the input threshold value 52 of the circuit that inverts the inverter output signal (INV_OUT(1)) may be the same as or different from the input threshold value 37 of the latch circuit 16.

Note that the combination of the set signal (S) and the reset signal (R) of the latch circuit 16 shown in FIG. 1 is not limited to the timing diagrams shown in FIGS. 3 to 5.

For example, the inverter output signal (INV_OUT(1)) shown on the lower side of FIG. 3 and a signal (not shown) obtained by inverting the inverter output signal (INV_OUT(2)) shown on the lower side of FIG. 4 may be used as the set signal (S) and the reset signal (R). A signal (not shown) obtained by inverting the inverter output signal (INV_OUT(2)) shown on the upper side of FIG. 5 and the inverter output signal (INV_OUT(1)) shown on the upper side of FIG. 3 may also be used as the set signal (S) and the reset signal (R).

1.5 First Specific Embodiment of Noise Filter Circuit

Figure 6:
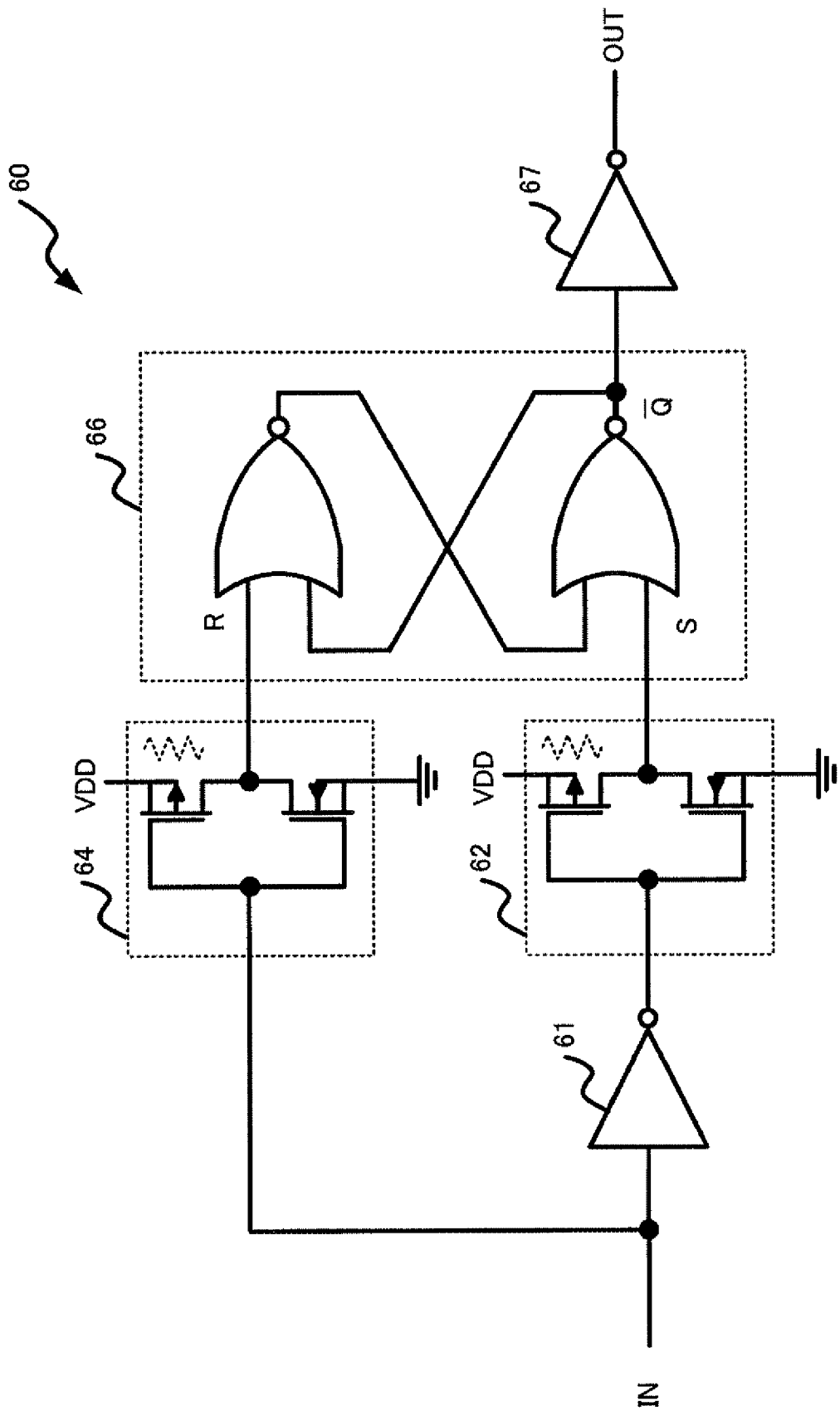
FIG. 6 shows a specific example of the noise filter circuit 10 shown in FIG. 1.

FIG. 6 shows a specific example of the noise filter circuit 10 shown in FIG. 1.

A noise filter circuit 60 shown in FIG. 6 includes first and second inverter circuits 62 and 64 that receive signals based on the input signal (IN), and a latch circuit 66 that receives signals based on signals output from the first and second inverter circuits 62 and 64.

The first inverter circuit 62 receives the input signal (IN) through a third inverter circuit 61.

The third inverter circuit 61 inverts the input signal (IN), and outputs the inverted signal.

The first inverter circuit 62 receives the signal output from the third inverter circuit 61 (i.e., the signal (IN') obtained by inverting the input signal (IN)). The first inverter circuit 62 inverts the input signal' (IN'), and outputs the inverted signal.

The first inverter circuit 62 includes a P-type transistor and an N-type transistor (CMOS transistor). The capability of the P-type transistor is lower than the capability of the N-type transistor.

The channel length and the channel width of the P-type transistor are respectively referred to as Lp and Wp, and the channel length and the channel width of the N-type transistor are respectively referred to as Ln and Wn. For example, when a value obtained by multiplying the ratio Wp/Lp by a factor of two to three is smaller than the ratio Wn/Ln, the ON-resistance of the P-type transistor is higher than the ON-resistance of the N-type transistor. Specifically, the capability of the P-type transistor of the first inverter circuit 62 is lower than the capability of the N-type transistor of the first inverter circuit 62. Since the mobility of electrons is higher than the mobility of holes, the capability of an N-type transistor is generally higher than the capability of a P-type transistor by a factor of two to three when the ratio Wp/Lp is equal to the ratio Wn/Ln.

The second inverter circuit 64 inverts the input signal (IN), and outputs the inverted signal. The second inverter circuit 64 includes a P-type transistor and an N-type transistor (CMOS transistor). The capability of the P-type transistor of the second inverter circuit 64 is lower than the capability of the N-type transistor of the second inverter circuit 64.

The latch circuit 66 receives the signal output from the first inverter circuit 62 as the set signal (S). The latch circuit 66 receives the signal output from the second inverter circuit 64 as the reset signal (R). The latch circuit 66 outputs one (Q_) of two output levels (Q and Q_) through a fourth inverter circuit 67 corresponding to the timings of the set signal (S) and the reset signal (R). The latch circuit 66 is formed using a NOR latch circuit.

The fourth inverter circuit 67 inverts the signal (Q_) output from the latch circuit 66, and outputs the inverted signal. The signal output from the fourth inverter circuit 67 forms an output signal (OUT) output from the noise filter circuit 60.

Figure 7:
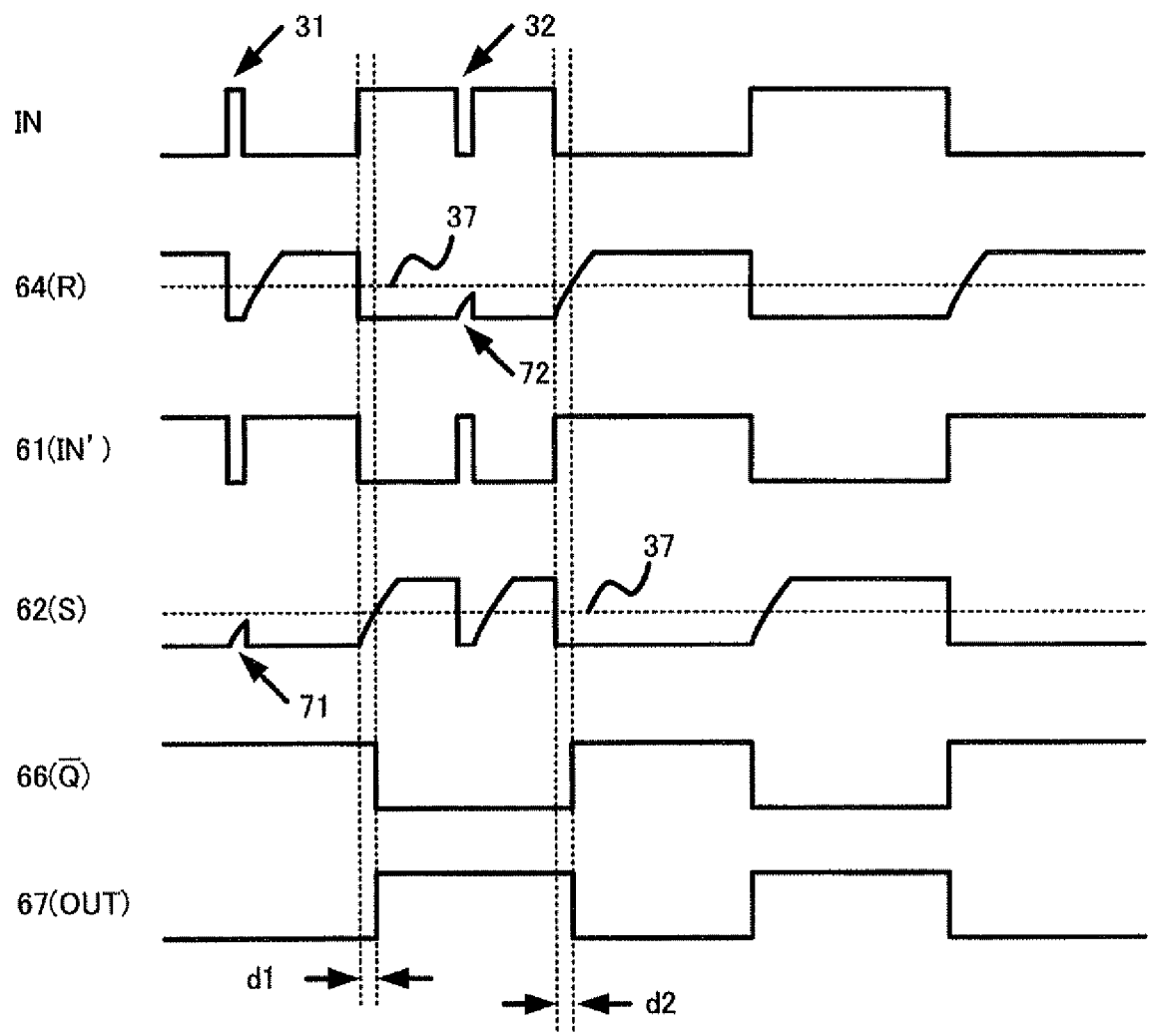
FIG. 7 is a timing diagram illustrative of the operation of a noise filter circuit 60 shown in FIG. 6.

FIG. 7 is a timing diagram illustrative of the operation of the noise filter circuit 60 shown in FIG. 6.

In FIG. 7, symbols IN, 61(IN'), 62(S), 64(R), 66(Q_), and 67(OUT) respectively indicate the input signal, the signal (input signal') output from the third inverter circuit 61, the signal (set signal) output from the first inverter circuit 62, the signal (reset signal) output from the second inverter circuit 64, the signal (latch signal) output from the latch circuit 66, and the signal (output signal) output from the fourth inverter circuit 67.

The inverter output signal (INV_OUT(1)) shown on the upper side of FIG. 3 corresponds to the signal (R) output from the second inverter circuit 14 shown in FIG. 7, and the inverter output signal (INV_OUT(1)) shown on the lower side of FIG. 3 corresponds to the signal (S) output from the first inverter circuit 12 shown in FIG. 7.

As shown in FIG. 7, the noise filter circuit 60 can remove a noise (71) that is included in the set signal (62(S)) and does not exceed the input threshold value 37. The noise (71) does not exceed the input threshold value 37 as long as the pulse width of the noise (71) included in the set signal (62(S)) does not exceed a first delay amount d1. Therefore, the noise filter circuit 10 can remove the noise (71) having a pulse width smaller than the first delay amount d1 (i.e., the HIGH-side noise (31) having a pulse width smaller than the first delay amount d1).

The noise filter circuit 60 can also remove a noise (72) that has a pulse width smaller than a second delay amount d2 and is included in the reset signal (64(R)) (i.e., the LOW-side noise (32) having a pulse width smaller than the second delay amount d2). The first delay amount d1 is preferably equal to the second delay amount d2.

The rise time and the fall time of each of the output signals (IN' and OUT) output from the third and fourth inverter circuits 61 and 67 shown in FIG. 7 are significantly short and can be disregarded.

In the above-mentioned related-art noise filter circuit, a delay circuit, a NAND circuit, and an OR circuit are disposed between an input signal and a latch circuit, for example.

The delay circuit may be formed using at least two inverter circuits (e.g., two P-type transistors and two N-type transistors), for example. The NAND circuit may be formed using two P-type transistors and two N-type transistors, for example. The OR circuit may be formed using a NOR circuit (e.g., two P-type transistors and two N-type transistors) and one inverter circuit (e.g., one P-type transistor and one N-type transistor), for example.

The noise filter circuit 60 shown in FIG. 6 may include the third, first, and second inverter circuits 61, 62, and 64 (e.g., three P-type transistors and three N-type transistors) instead of the delay circuit, the NAND circuit, and the OR circuit. The noise filter circuit 60 shown in FIG. 6 has such a simple structure. Therefore, the noise filter circuit 60 can be formed to have a reduced chip size as compared with a related-art noise filter circuit.

The first delay amount d1 shown in FIG. 7 is determined based on a time constant (determined based on the ON-resistance of the P-type transistor of the first inverter circuit 62 and the capacitance between the first inverter circuit 62 and the latch circuit 66 (i.e., the total capacitance of the set-signal-side gate capacitance of the latch circuit 66, the drain capacitance of the first inverter circuit 62, and the parasitic capacitance due to wires and the like)) and the set-signal-side input threshold value 37 of the latch circuit 66.

The second delay amount d2 is determined based on a time constant (determined based on the ON-resistance of the P-type transistor of the second inverter circuit 64 and the capacitance between the second inverter circuit 64 and the latch circuit 66 (i.e., the total capacitance of the reset-signal-side gate capacitance of the latch circuit 66, the drain capacitance of the second inverter circuit 64, and the parasitic capacitance due to wires and the like)) and the reset-signal-side input threshold value 37 of the latch circuit 66.

Each of the first inverter circuit 62 and the second inverter circuit 64 may include the same type of inverter circuit (i.e., an inverter circuit in which the capability of the P-type transistor is lower than the capability of the N-type transistor). As a result, a variation in delay amount (d1 and d2) can be reduced.

When reducing the capability of a CMOS transistor, a channel length Lp' of a P-type transistor necessary for reducing the capability of the P-type transistor by a given amount PO is shorter than a channel length Ln' of an N-type transistor necessary for reducing the capability of the N-type transistor by the given amount PO. Therefore, when each of the first inverter circuit 62 and the second inverter circuit 64 includes an inverter circuit in which the capability of the P-type transistor is lower than the capability of the N-type transistor (first specific embodiment of the noise filter circuit), a noise filter circuit having a reduced chip size can be provided.

When the first noise (31) included in the input signal (IN) shown in FIG. 7 includes successive noises, the noise (71) included in the set signal (62(S)) also includes successive noises. However, the successive noises included in the set signal (62(S)) do not exceed the input threshold value 37. Likewise, when the second noise (32) included in the input signal (IN) shown in FIG. 7 includes successive noises, successive noises included in the reset signal (64(R)) do not exceed the input threshold value 37. Therefore, the noise filter circuit 60 according to the invention can remove successive noises.

1.5.1 Modification of First Specific Embodiment of Noise Filter Circuit

In FIG. 6, the latch circuit 16 outputs one (Q_) of the two output levels (Q and Q_), for example. Note that the latch circuit 16 may output the other (Q) of the two output levels (Q and Q_). In this case, the noise filter circuit 60 may not include the fourth inverter circuit 67.

In FIG. 6, the latch circuit 66 receives the signals output from the first and second inverter circuits 62 and 64 as the set signal and the reset signal, respectively. Note that the latch circuit 66 may receive the signals output from the first and second inverter circuits 62 and 64 as the reset signal and the set signal, respectively. Specifically, the third inverter circuit 61 that is disposed between the input signal (IN) and the first inverter circuit 62 in FIG. 6 may be disposed between the input signal (IN) and the second inverter circuit 64. In this case, the noise filter circuit 60 may not include the fourth inverter circuit 67.

In FIG. 6, an independent capacitor may be disposed between each of the first and second inverter circuits 62 and 64 and the latch circuit 66. In this case, the first and second delay amounts d1 and d2 increase corresponding to the capacitances of the independent capacitors. Therefore, the noise filter circuit 60 can remove noise having a larger pulse width.

1.6 Second Specific Embodiment of Noise Filter Circuit

Figure 8:
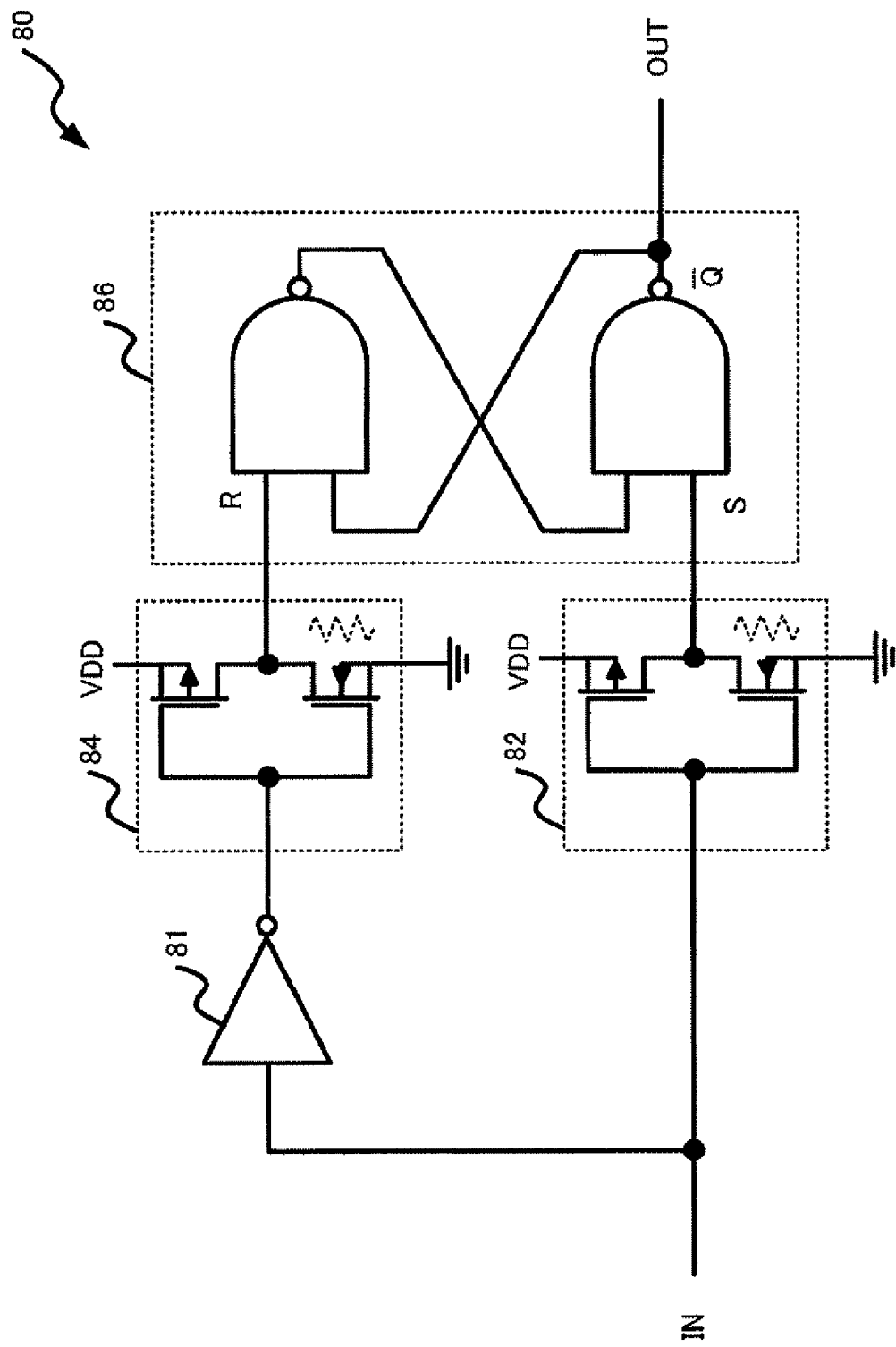
FIG. 8 shows another specific example of the noise filter circuit 10 shown in FIG. 1.

FIG. 8 shows another specific example of the noise filter circuit 10 shown in FIG. 1.

A noise filter circuit 80 shown in FIG. 8 includes first and second inverter circuits 82 and 84 that receive signals based on the input signal (IN), and a latch circuit 86 that receives signals based on signals output from the first and second inverter circuits 82 and 84.

The first inverter circuit 82 inverts the input signal (IN), and outputs the inverted signal. The capability of an N-type transistor of the first inverter circuit 82 is lower than the capability of a P-type transistor of the first inverter circuit 82.

The second inverter circuit 84 receives the input signal (IN) through a third inverter circuit 81. Specifically, the second inverter circuit 84 receives the signal (IN') obtained by inverting the input signal (IN). The second inverter circuit 84 inverts the input signal' (IN'), and outputs the inverted signal. The capability of an N-type transistor of the second inverter circuit 84 is lower than the capability of a P-type transistor of the second inverter circuit 84.

The latch circuit 86 receives the signal output from the first inverter circuit 82 as the set signal (S). The latch circuit 86 receives the signal output from the second inverter circuit 84 as the reset signal (R). The latch circuit 86 outputs one (Q_) of two output levels (Q and Q_) corresponding to the timings of the set signal (S) and the reset signal (R). The latch circuit 86 is formed using a NAND latch circuit. The signal output from the latch circuit 86 forms an output signal (OUT) output from the noise filter circuit 80.

Figure 9:
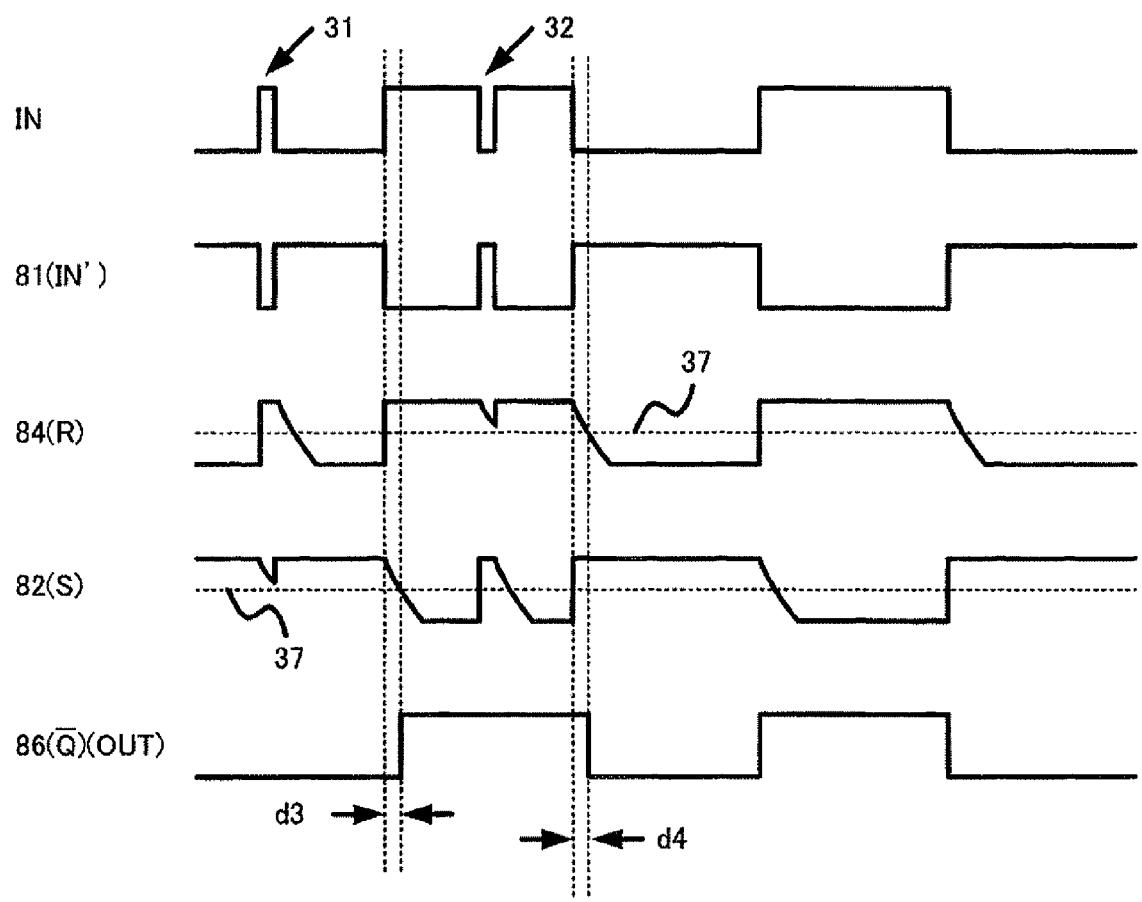
FIG. 9 is a timing diagram illustrative of the operation of a noise filter circuit 80 shown in FIG. 8.

FIG. 9 is a timing diagram illustrative of the operation of the noise filter circuit 80 shown in FIG. 8.

In FIG. 9, symbols IN, 81(IN'), 82(S), 84(R), and 86(Q_) (OUT) respectively indicate the input signal, the signal (input signal') output from the third inverter circuit 81, the signal (set signal) output from the first inverter circuit 82, the signal (reset signal) output from the second inverter circuit 84, and the signal (latch signal) (output signal) output from the latch circuit 86.

The inverter output signal (INV_OUT(2)) shown on the upper side of FIG. 4 corresponds to the signal (S) output from the first inverter circuit 82 shown in FIG. 9, and the inverter output signal (INV_OUT(2)) shown on the lower side of FIG. 4 corresponds to the signal (R) output from the second inverter circuit 84 shown in FIG. 9.

As shown in FIG. 9, the noise filter circuit 80 can remove the HIGH-side noise (31) having a pulse width smaller than a first delay amount d3. The noise filter circuit 80 can also remove the LOW-side noise (32) having a pulse width smaller than a second delay amount d4. The first delay amount d3 is preferably equal to the second delay amount d4.

The fall time and the rise time of the output signal (IN') output from the third inverter circuit 81 shown in FIG. 9 are significantly short and can be disregarded.

Each of the first inverter circuit 82 and the second inverter circuit 84 may include the same type of inverter circuit (i.e., an inverter circuit in which the capability of the N-type transistor is lower than the capability of the P-type transistor). As a result, a variation in delay amount (d3 and d4) can be reduced.

When the first noise (31) included in the input signal (IN) shown in FIG. 9 includes successive noises, successive noises included in the set signal (82(S)) do not exceed the input threshold value 37. Likewise, when the second noise (32) included in the input signal (IN) shown in FIG. 9 includes successive noises, successive noises included in the reset signal (84(R)) do not exceed the input threshold value 37. Therefore, the noise filter circuit 80 according to the invention can remove successive noises.

1.6.1 Modification of Second Specific Embodiment of Noise Filter Circuit

In FIG. 8, the latch circuit 86 outputs one (Q_) of the two output levels (Q and Q_), for example. Note that the latch circuit 86 may output the other (Q) of the two output levels (Q and Q_). In this case, the noise filter circuit 80 may include the fourth inverter circuit 67.

The third inverter circuit 81 that is disposed between the input signal (IN) and the second inverter circuit 84 in FIG. 8 may be disposed between the input signal (IN) and the first inverter circuit 82. In this case, the noise filter circuit 80 may include the fourth inverter circuit 67.

In FIG. 8, an independent capacitor may be disposed between each of the first and second inverter circuits 82 and 84 and the latch circuit 86.

1.7 Third Specific Embodiment of Noise Filter Circuit

Figure 10:
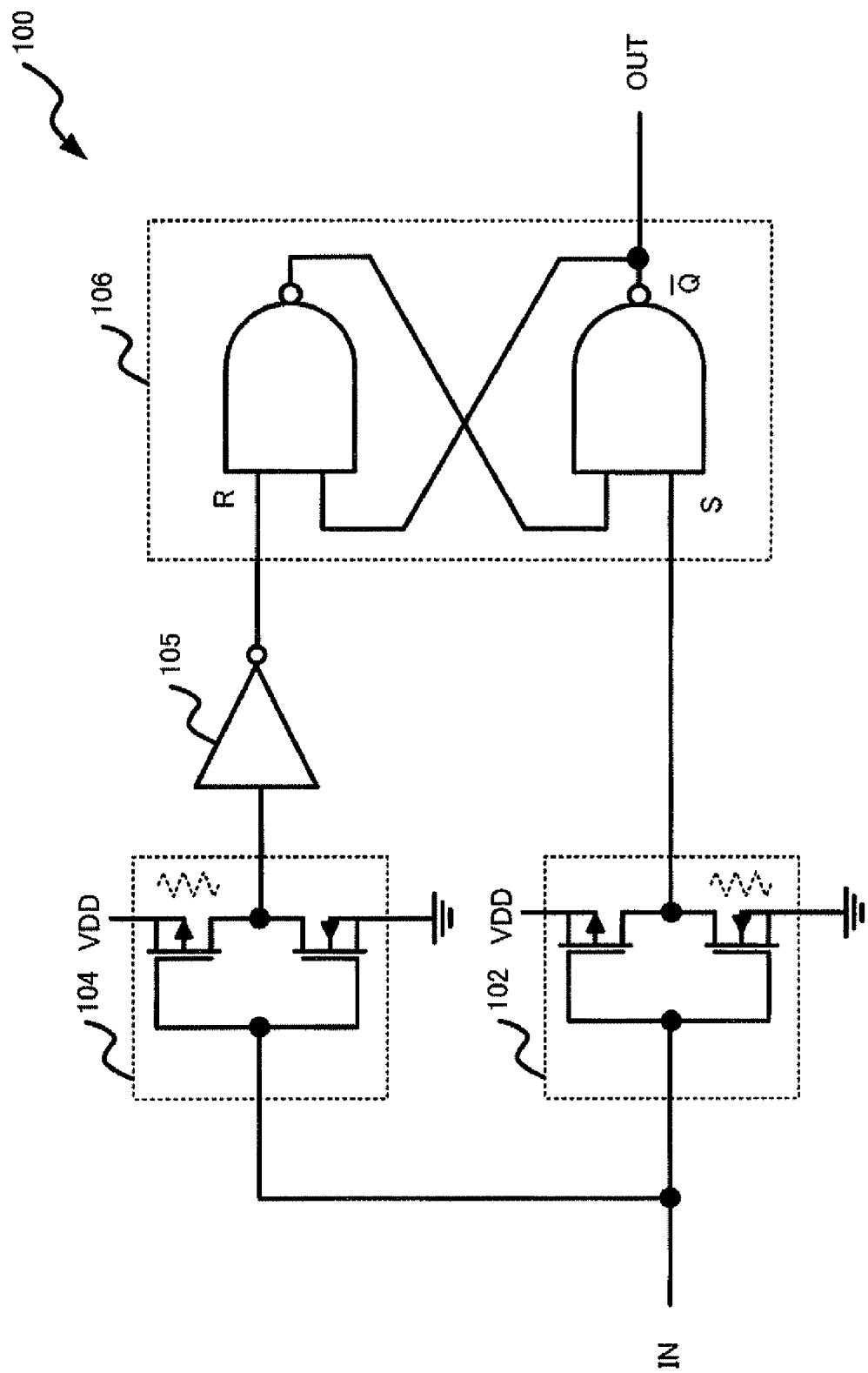
FIG. 10 shows another specific example of the noise filter circuit 10 shown in FIG. 1.

FIG. 10 shows another specific example of the noise filter circuit 10 shown in FIG. 1.

A noise filter circuit 100 shown in FIG. 10 includes first and second inverter circuits 102 and 104 that receive signals based on the input signal (IN), and a latch circuit 106 that receives signals based on signals output from the first and second inverter circuits 102 and 104.

The first inverter circuit 102 inverts the input signal (IN), and outputs the inverted signal. The capability of a P-type transistor of the first inverter circuit 102 is lower than the capability of an N-type transistor of the first inverter circuit 102.

The second inverter circuit 104 inverts the input signal (IN), and outputs the inverted signal. The capability of an N-type transistor of the second inverter circuit 104 is lower than the capability of a P-type transistor of the second inverter circuit 104.

The latch circuit 106 receives the signal output from the first inverter circuit 102 as the set signal (S).

The latch circuit 106 receives the signal output from the second inverter circuit 104 through a third inverter circuit 105. Specifically, the latch circuit 106 receives a signal that is obtained by inverting the signal output from the second inverter circuit 104 and subjected to a waveform adjustment as the reset signal (R).

The latch circuit 106 outputs one (Q_) of two output levels (Q and Q_) corresponding to the timings of the set signal (S) and the reset signal (R). The latch circuit 106 is formed using a NAND latch circuit. The signal output from the latch circuit 106 forms an output signal (OUT) output from the noise filter circuit 100.

Figure 11:
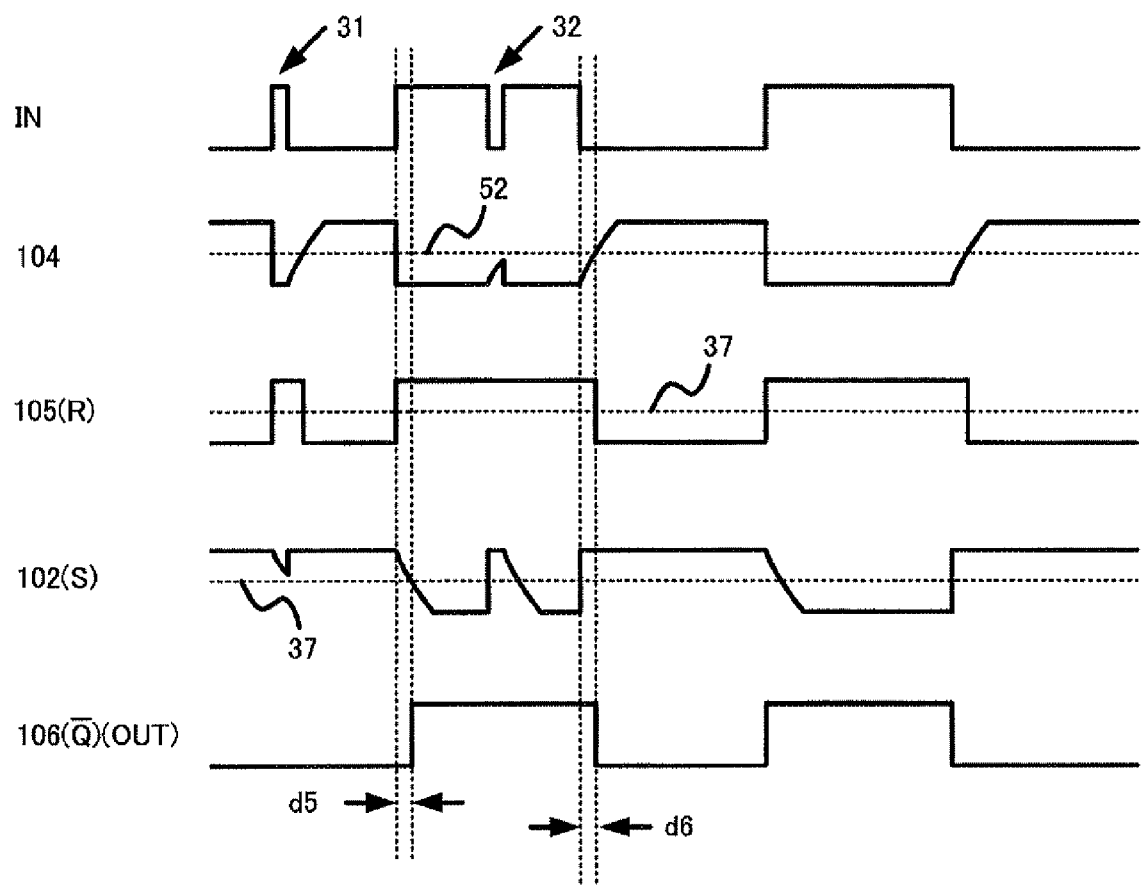
FIG. 11 is a timing diagram illustrative of the operation of a noise filter circuit 100 shown in FIG. 10.

FIG. 11 is a timing diagram illustrative of the operation of a noise filter circuit 100 shown in FIG. 10.

In FIG. 11, symbols IN, 102(S), 104, 105(R), and 106(Q_) (OUT) respectively indicate the input signal, the signal (set signal) output from the first inverter circuit 102, the signal output from the second inverter circuit 104, the signal (reset signal) output from the third inverter circuit 105, and the signal (latch signal) (output signal) output from the latch circuit 106.

The inverter output signal (INV_OUT(2)) shown in FIG. 5 corresponds to the signal (S) output from the first inverter circuit 102 shown in FIG. 10, and the inverter output signal' (INV_OUT(1)') shown in FIG. 5 corresponds to the signal (R) obtained by inverting the signal output from the second inverter circuit 104 shown in FIG. 10 (i.e., the signal (R) output from the third inverter circuit 105 shown in FIG. 10).

As shown in FIG. 11, the noise filter circuit 100 can remove the HIGH-side noise (31) having a pulse width smaller than a first delay amount d5. The noise filter circuit 100 can also remove the LOW-side noise (32) having a pulse width smaller than a second delay amount d6 The first delay amount d5 is preferably equal to the second delay amount d6.

The fall time and the rise time of the output signal (R) output from the third inverter circuit 105 shown in FIG. 11 are significantly short and can be disregarded.

When only the second inverter circuit 104 includes the inverter circuit in which the capability of the P-type transistor is lower than the capability of the N-type transistor (third specific embodiment of the noise filter circuit), a noise filter circuit having a chip size that is larger than that of the first specific embodiment of the noise filter circuit, but is smaller than that of the second specific embodiment of the noise filter circuit can be provided.

When the first noise (31) included in the input signal (IN) shown in FIG. 11 includes successive noises, successive noises included in the set signal (102(S)) do not exceed the input threshold value 37. Likewise, even if the second noise (32) included in the input signal (IN) shown in FIG. 11 includes successive noises, successive noises included in the signal output from the second inverter circuit 104 do not exceed the input threshold value 52 of the third inverter circuit 105. Therefore, the noise filter circuit 100 according to the invention can remove successive noises.

1.7.1 Modification of Third Specific Embodiment of Noise Filter Circuit

In FIG. 10, the latch circuit 106 outputs one (Q_) of the two output levels (Q and Q_), for example. Note that the latch circuit 106 may output the other (Q) of the two output levels (Q and Q_). In this case, the noise filter circuit 100 may include the fourth inverter circuit 67.

The third inverter circuit 105 that is disposed between the second inverter circuit 104 and the latch circuit 106 (NAND latch circuit) in FIG. 10 may be disposed between the first inverter circuit 102 and the latch circuit 106. In this case, the latch circuit 106 may be formed using a NOR latch circuit (i.e., the latch circuit 66 shown in FIG. 6), and the noise filter circuit 80 may include the fourth inverter circuit 67.

In FIG. 8, an independent capacitor may be disposed between each of the first and second inverter circuits 82 and 84 and the latch circuit 86.

1.8 Fourth Specific Embodiment of Noise Filter Circuit

A related-art noise filter circuit is disclosed in FIG. 1 of JP-A-2003-163583, for example. In such a noise filter circuit, a delay circuit, a NAND circuit, and an OR circuit are disposed between an input signal and a latch circuit.

A noise filter circuit 120 according to the invention (fourth specific embodiment) is formed by inserting the second and third inverter circuits 104 and 105 (delay circuits) shown in FIG. 10 between the NAND circuit and the latch circuit and between the OR circuit and the latch circuit of the related-art noise filter circuit.

Figure 12:
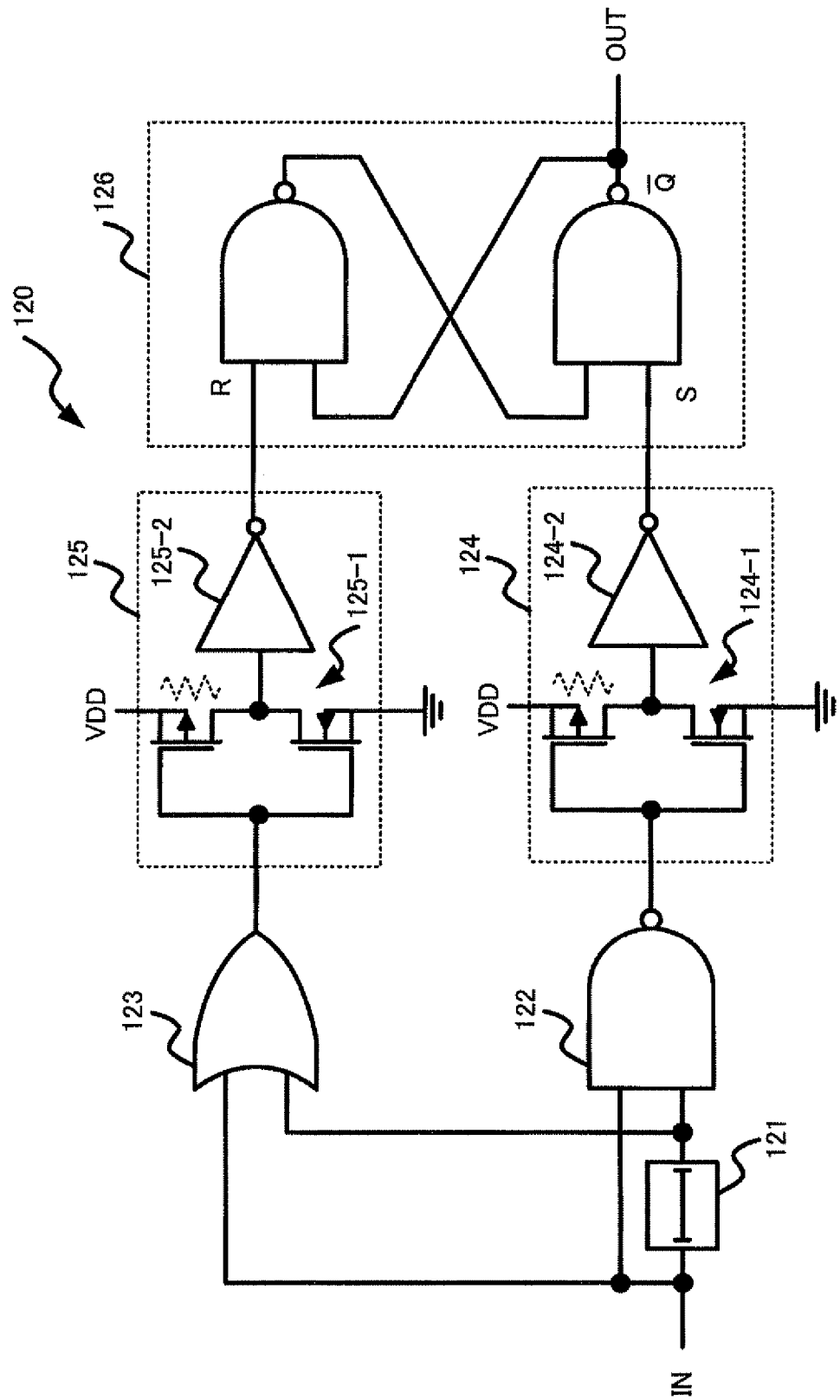
FIG. 12 shows a specific example of a noise filter circuit 120 according to the invention.

FIG. 12 shows a specific example of the noise filter circuit 120 according to the invention.

The noise filter circuit 120 shown in FIG. 12 includes a first delay circuit 121 that receives the input signal (IN), a NAND circuit 122 and an OR circuit 123 that receive the input signal (IN) and a signal (INd) output from the first delay circuit 121, a second delay circuit 124 that receives a signal output from the NAND circuit 122, a third delay circuit 125 that receives a signal output from the OR circuit 123, and a latch circuit 126 that receives signals output from the second and third delay circuits 124 and 125 as the set signal (S) and the reset signal (R), respectively.

The delay circuit 121 receives the input signal (IN), delays the input signal (IN) by a given first delay amount D1, and outputs the delayed signal. The delay circuit 121 is formed using a circuit in which an even number of inverter circuits are connected in series (e.g., a delay circuit disclosed in FIG. 2 or 1 of JP-A-7-022921), for example.

The delay circuit 121 is preferably formed using a delay circuit described later (e.g., a circuit formed by combining an inverter circuit 220 shown in FIG. 22 with an inverter circuit).

The NAND circuit (AND circuit in a broad sense) 122 receives the input signal (IN) and the signal (INd) output from the first delay circuit 121. The NAND circuit 122 executes a logical operation (NAND) on these two signals (IN and INd), and outputs the operation result. Specifically, the NAND circuit 122 outputs a logical level LOW only when the two signals (IN and INd) are set at the HIGH level, otherwise outputs a logical level HIGH.

The OR circuit 123 receives the input signal (IN) and the signal (INd) output from the first delay circuit 121. The OR circuit 123 executes a logical operation (OR) on these two signals (IN and INd), and outputs the operation result. Specifically, the NAND circuit 122 outputs a logical level HIGH when at least one of the two signals (IN and INd) is set at the HIGH level, otherwise the NAND circuit 122 outputs a logical level LOW.

The second delay circuit 124 receives the signal output from the NAND circuit 122.

The second delay circuit 124 has the same function as that of the second and third inverter circuits 104 and 105 shown in FIG. 10. Specifically, the second delay circuit 124 includes a first-stage inverter circuit 124-1 that inverts the signal output from the NAND circuit 122 and outputs the inverted signal. The second delay circuit 124 also includes a second-stage inverter circuit 124-2 that inverts the signal output from the first-stage inverter circuit 124-1 and outputs the inverted signal. The capability of a P-type transistor of the first-stage inverter circuit 124-1 is lower than the capability of an N-type transistor of the first-stage inverter circuit 124-1. The signal output from the second-stage inverter circuit 124-2 forms an output signal output from the second delay circuit 124.

The third delay circuit 125 receives the signal output from the OR circuit 125.

The third delay circuit 125 includes a first-stage inverter circuit 125-1 that inverts the signal output from the OR circuit 125 and outputs the inverted signal. The third delay circuit 125 also includes a second-stage inverter circuit 125-2 that inverts the signal output from the first-stage inverter circuit 125-1 and outputs the inverted signal. The capability of a P-type transistor of the first-stage inverter circuit 125-1 is lower than the capability of an N-type transistor of the first-stage inverter circuit 125-1. The signal output from the second-stage inverter circuit 125-2 forms an output signal output from the second delay circuit 124.

The latch circuit 126 receives the signal output from the second delay circuit 124 as the set signal (S). The latch circuit 126 receives the signal output from the third delay circuit 124 as the reset signal (R). The latch circuit 126 outputs one (Q_) of two output levels (Q and Q_) corresponding to the timings of the set signal (S) and the reset signal (R). The latch circuit 126 is formed using a NAND latch circuit. The signal output from the latch circuit 126 forms an output signal (OUT) output from the noise filter circuit 120.

Figure 13:
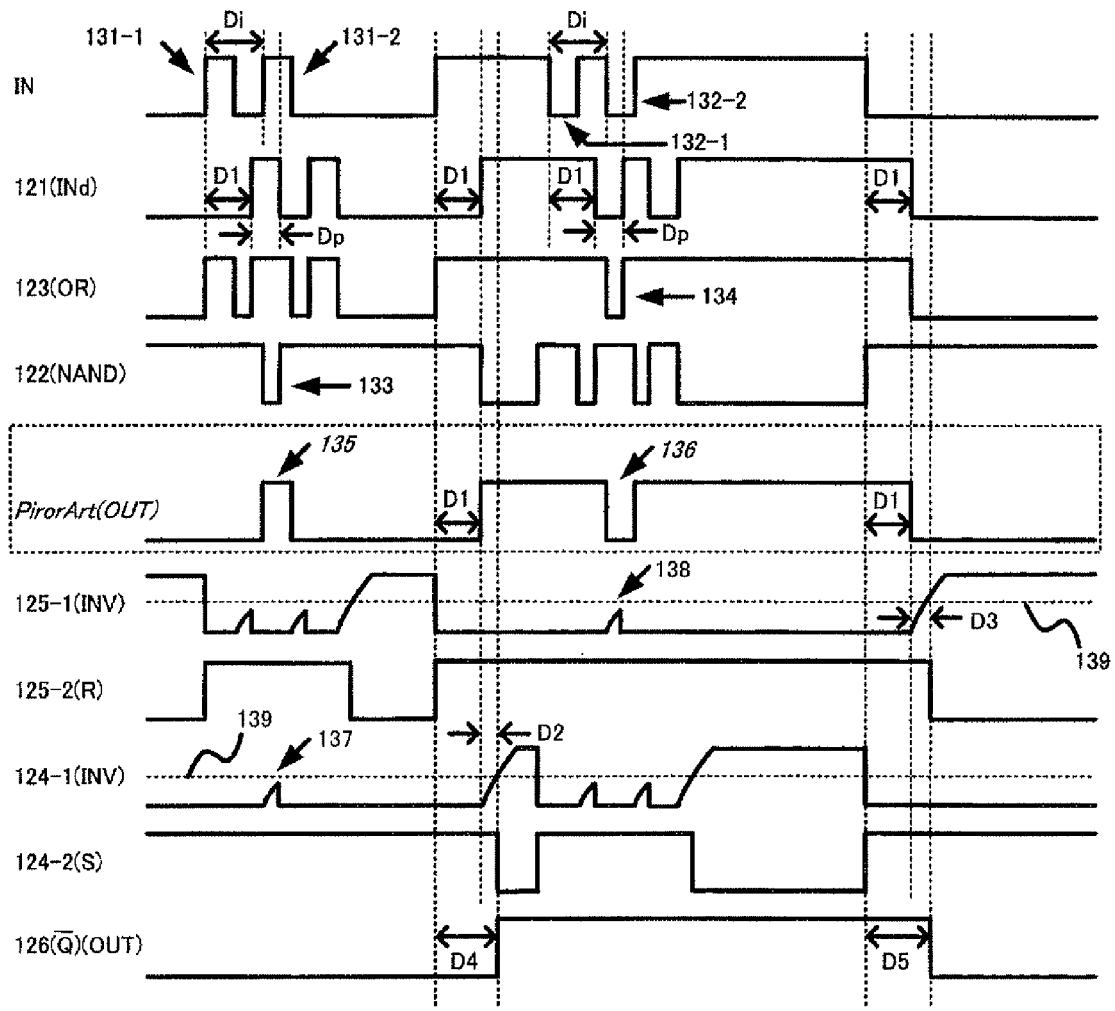
FIG. 13 is a timing diagram illustrative of the operations of the noise filter circuit 120 shown in FIG. 12 and a related-art noise filter circuit.

FIG. 13 is a timing diagram illustrative of the operations of the noise filter circuit 120 shown in FIG. 12 and the related-art noise filter circuit.

In FIG. 13, symbols IN, 121(INd), 122(NAND), 123(OR), 124-1(INV), 124-2(S), 125-1(INV), 125(R), and 126(Q_) (OUT) respectively indicate the input signal, the signal output from the first delay circuit 121, the signal output from the NAND circuit 122, the signal output from the first-stage inverter circuit 124-1 of the second delay circuit 124, the signal (set signal) output from the second-stage inverter circuit 124-2 of the second delay circuit 124, the signal output from the first-stage inverter circuit 125-1 of the third delay circuit 125, the signal (reset signal) output from the second-stage inverter circuit 125-2 of the third delay circuit 125, and the signal (latch signal) (output signal) output from the latch circuit 126.

In FIG. 13, a symbol PriorArt(OUT) indicates an output signal output from the related-art noise filter circuit.

The input signal (IN) shown in FIG. 13 includes HIGH-side successive noises 131-1 and 131-2 and LOW-side successive noises 132-1 and 132-2.

In FIG. 13, when an interval Di between the HIGH-side successive noises 131-1 and 131-2 is smaller than the sum of the delay amount D1 of the first delay circuit 121 and a pulse width Dp of the first noise 131-1 of the successive noises (Di<D1+Dp), the NAND circuit 122 has a noise 133 corresponding to the HIGH-side successive noises.

When the interval Di between the LOW-side successive noises 132-1 and 132-2 is smaller than the sum of the delay amount D1 of the first delay circuit 121 and a pulse width Dp of the first noise 132-1 of the successive noises (Di<D1+Dp), the OR circuit 123 has a noise 134 corresponding to the LOW-side successive noises.

In this case, the signal output from the NAND circuit 122 and the signal output from the OR circuit 123 of the related-art noise filter circuit are used as the set signal and the reset signal of the latch circuit. Therefore, the output signal (PriorArt(OUT)) output from the related-art noise filter circuit includes a noise 135 and a noise 136 due to the HIGH-side and LOW-side successive noises.

In the noise filter circuit 120 according to the invention, the signal output from the second delay circuit 124 that receives the signal output from the NAND circuit 122 and the signal output from the third delay circuit 126 that receives the signal output from the OR circuit 123 are used as the set signal and the reset signal of the latch circuit 126. Therefore, the output signal (126(Q_)(OUT)) output from the noise filter circuit 120 does not include the noise 135 and the noise 136 due to the HIGH-side and LOW-side successive noises.

The signal (124-1(INV)) output from the first-stage inverter circuit 124-1 of the second delay circuit 124 includes a noise 137 corresponding to the HIGH-side successive noises. However, the noise 137 does not exceed an input threshold value 139 of the second-stage inverter circuit 124-2. Therefore, the noise 137 can be removed by the second delay circuit 125.

The signal (125-1(INV)) output from the first-stage inverter circuit 125-1 of the third delay circuit 125 includes a noise 138 corresponding to the LOW-side successive noises. However, the noise 138 does not exceed the input threshold value 139 of the second-stage inverter circuit 125-2. Therefore, the noise 138 can be removed by the third delay circuit 125.

The delay amount D2 of second delay circuit 124 is preferably equal to the delay amount D3 of the third delay circuit 125.

The rise time of each of the output signals (124-1(INV) and 125-1(INV)) output from the first-stage inverter circuits 124-1 and 125-1 shown in FIG. 12 is sufficiently longer than the fall time.

The fall time and the rise time of each of the output signals (124-2(S) and 125-2(R)) output from the second-stage inverter circuits 124-2 and 125-2 shown in FIG. 12 are significantly short and can be disregarded.

1.8.1 Modification of Fourth Specific Embodiment of Noise Filter Circuit

In FIG. 12, the second-stage inverter circuit 124-2 of the second delay circuit 124 and the second-stage inverter circuit 125-2 of the third delay circuit 125 may be omitted, and a NOR latch circuit that outputs the output level Q may be disposed instead of the NAND latch circuit 126 that outputs the output level Q_.

In FIG. 12, an independent capacitor may be disposed between the first-stage inverter circuit 124-1 and the second-stage inverter circuit 124-2 and/or between the first-stage inverter circuit 125-1 and the second-stage inverter circuit 125-2.

2. Dead Time Circuit 2.1 Configuration of Dead Time Circuit

Figure 14:
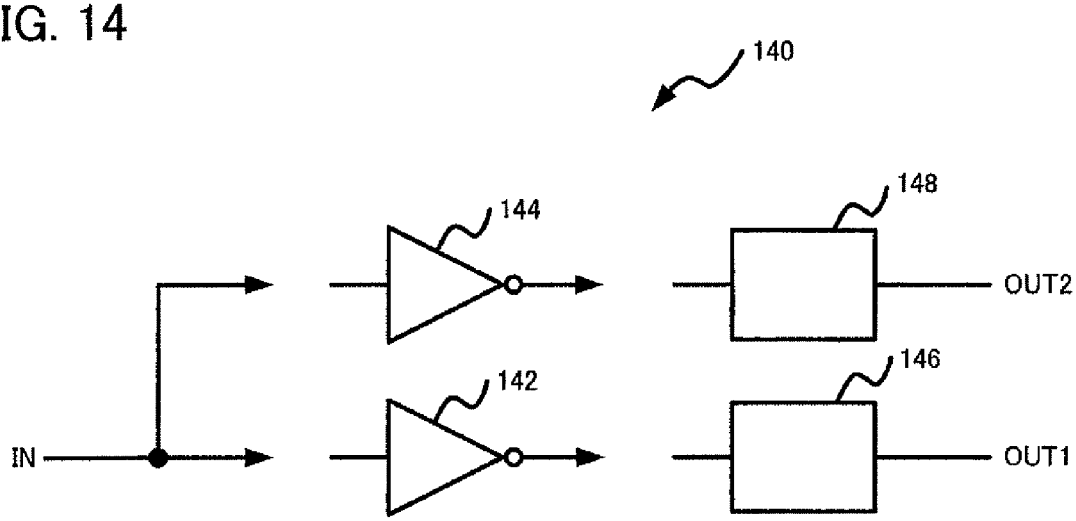
FIG. 14 is a schematic block diagram showing a dead time circuit according to the invention.

FIG. 14 is a schematic block diagram showing a dead time circuit according to the invention.

A dead time circuit 140 shown in FIG. 14 includes first and second inverter circuits 142 and 144 that receive signals based on the input signal (IN), a first waveform adjusting circuit 146 that receives a signal based on a signal output from the first inverter circuit 142, and a second waveform adjusting circuit 148 that receives a signal based on a signal output from the second inverter circuit 144.

Note that the dead time circuit 140 may not include the first and second waveform adjusting circuits 146 and 148 when a reduction in chip size is given priority, for example.

The first inverter circuit 142 inverts a signal based on the input signal (IN) (e.g., the signal (IN') obtained by inverting the input signal (IN)), and outputs the inverted signal. The first inverter circuit 142 includes a first-conductivity-type transistor and a second-conductivity-type transistor. The capability of one of the first-conductivity-type transistor and the second-conductivity-type transistor is lower than the capability of the other of the first-conductivity-type transistor and the second-conductivity-type transistor. The first inverter circuit 14 includes a CMOS transistor, for example.

The second inverter circuit 144 inverts a signal based on the input signal (IN) (e.g., the input signal (IN)), and outputs the inverted signal. The second inverter circuit 144 includes a first-conductivity-type transistor and a second-conductivity-type transistor. The capability of one of the first-conductivity-type transistor and the second-conductivity-type transistor is lower than the capability of the other of the first-conductivity-type transistor and the second-conductivity-type transistor. The second inverter circuit 144 includes a CMOS transistor, for example.

The first waveform adjusting circuit 146 adjusts the waveform of the signal output from the first inverter circuit 142 (e.g., the signal from the first inverter circuit 142), and outputs the waveform-adjusted signal.

The second waveform adjusting circuit 148 adjusts the waveform of the signal output from the second inverter circuit 144 (e.g., the signal output from the second inverter circuit 144), and outputs the waveform-adjusted signal.

The signals (OUT1 and OUT2) output from the first and second waveform adjusting circuits 146 and 146 form a dead time.

When the first and second waveform adjusting circuit 146 and 148 are omitted, the signals output from the first and second inverter circuits 142 and 144 form a dead time.

2.2 First Specific Embodiment of Dead Time Circuit

Figure 15:
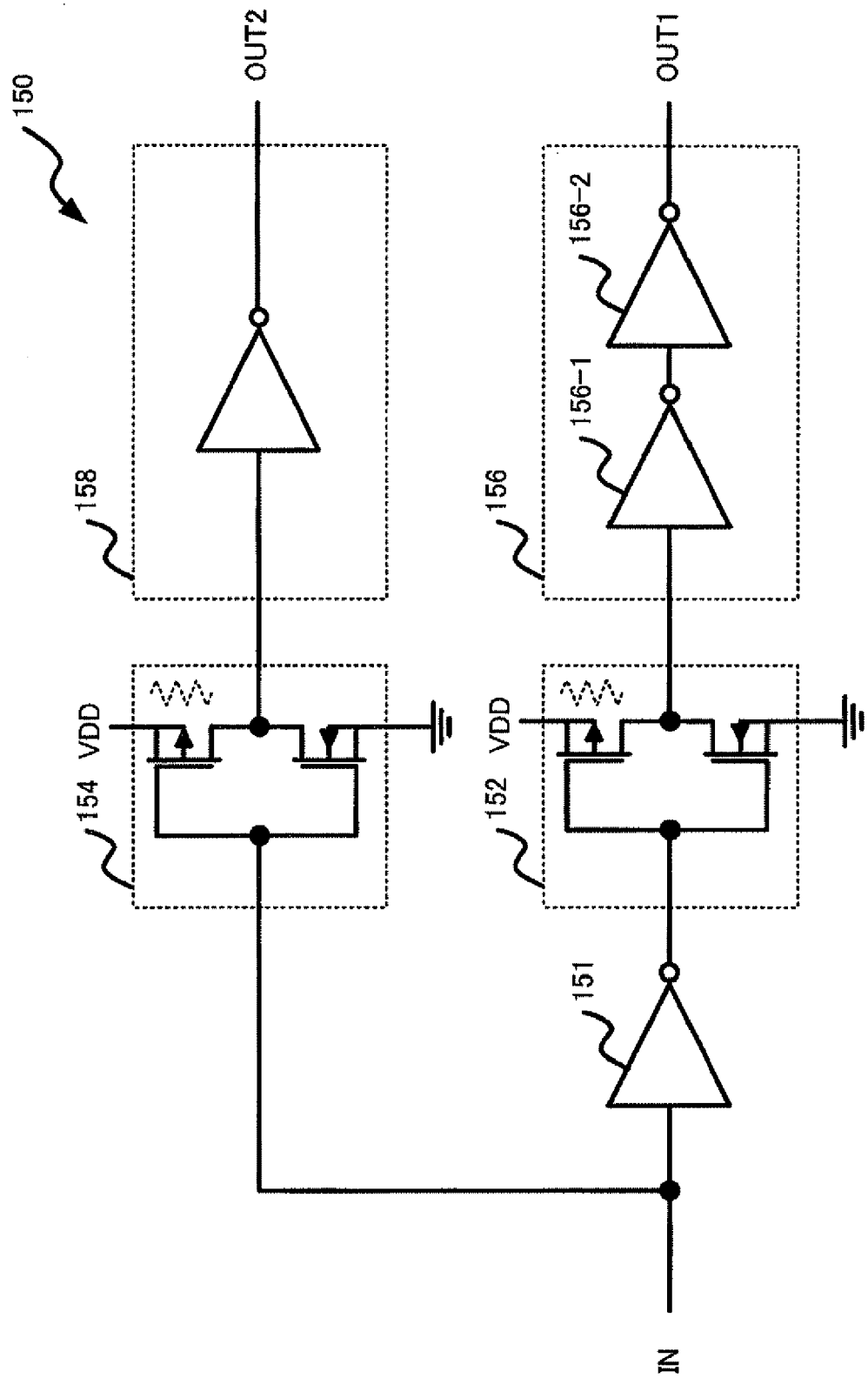
FIG. 15 shows a specific example of a dead time circuit 140 shown in FIG. 14.

FIG. 15 shows a specific example of the dead time circuit 140 shown in FIG. 14.

A dead time circuit 150 shown in FIG. 15 includes first and second inverter circuits 152 and 154 that receive signals based on the input signal (IN), a first waveform adjusting circuit 156 that receives a signal based on a signal output from the first inverter circuit 152, and a second waveform adjusting circuit 158 that receives a signal based on a signal output from the second inverter circuit 154.

Note that the dead time circuit 150 may not include the first and second waveform adjusting circuits 156 and 158.

The first inverter circuit 152 receives the input signal (IN) through a third inverter circuit 151. Specifically, the first inverter circuit 152 receives the signal output from the third inverter circuit 151 (i.e., the signal (IN') obtained by inverting the input signal (IN)). The first inverter circuit 152 inverts the input signal' (IN'), and outputs the inverted signal.

The first inverter circuit 152 includes a P-type transistor and an N-type transistor (CMOS transistor). The capability of the P-type transistor of the first inverter circuit 152 is lower than the capability of the N-type transistor of the first inverter circuit 152.

The second inverter circuit 154 inverts the input signal (IN), and outputs the inverted signal. The second inverter circuit 154 includes a P-type transistor and an N-type transistor (CMOS transistor). The capability of the P-type transistor of the second inverter circuit 154 is lower than the capability of the N-type transistor of the second inverter circuit 154.

The first waveform adjusting circuit 156 includes a fourth inverter circuit 156-1 that adjusts the waveform of the signal output from the first inverter circuit 152. The first waveform adjusting circuit 156 also includes a fifth inverter circuit 156-2 that inverts the signal output from the fourth inverter circuit 156-1.

The second waveform adjusting circuit 158 adjusts the waveform of the signal output from the second inverter circuit 154. In FIG. 15, the second waveform adjusting circuit 158 includes a sixth inverter circuit 158.

Figure 16:
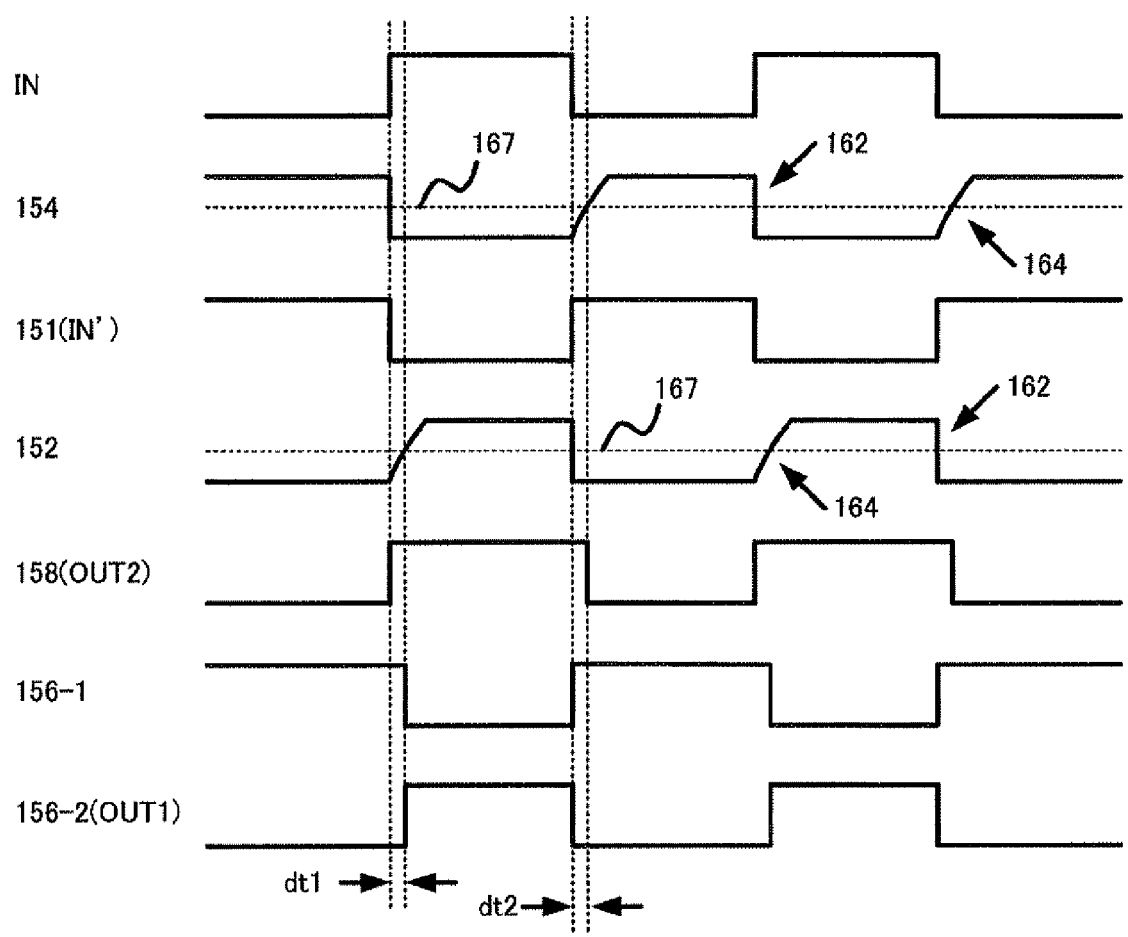
FIG. 16 is a timing diagram illustrative of the operation of a dead time circuit 150 shown in FIG. 15.

FIG. 16 is a timing diagram illustrative of the operation of the dead time circuit 150 shown in FIG. 15.

In FIG. 16, symbols IN, 151(IN'), 152, 154, 156-1, 156-2 (OUT1), and 158(OUT2) respectively indicate the input signal, the signal (input signal') output from the third inverter circuit 151, the signal output from the first inverter circuit 152, the signal output from the second inverter circuit 154, the signal output from the fourth inverter circuit 156-1, the signal (output signal 1) output from the fifth inverter circuit 156-2, and the signal (output signal 2) output from the sixth inverter circuit 158.

As shown in FIG. 16, the input signal (IN) input to the dead time circuit 150 shown in FIG. 15 is a rectangular signal.

As shown in FIG. 16, the rise time (see arrow 164) of each of the output signals output from the first and second inverter circuits 152 and 154 shown in FIG. 15 is sufficiently longer than the fall time.

As shown in FIG. 16, the fall time and the rise time of each of the output signals output from the third, fourth, fifth, and sixth inverter circuits 151, 156-1, 156-2, and 158 shown in FIG. 15 are significantly short and can be disregarded.

In FIG. 16, a dotted line 167 indicates an input threshold value of the first and second waveform adjusting circuits 156 and 158. The input threshold value 167 of the first and second waveform adjusting circuits 156 and 158 is set at a value that is half of a power supply voltage VDD of the first and second inverter circuits 152 and 154. Note that the input threshold value may differ between the first and second waveform adjusting circuits 156 and 158.

As shown in FIG. 16, the output signals 1 and 2 (OUT1 and OUT2) output from the dead time circuit 150 shown in FIG. 15 have the same phase as the phase of the input signal (IN) and form dead times (dt1 and dt2). The output signals (OUT1 and OUT2) having the same phase may be applied to a driver circuit 370 (described later) shown in FIG. 37, for example. When the first and second waveform adjusting circuits 156 and 158 are omitted, only one of the signals output from the first and second inverter circuits 152 and 154 has the same phase as the phase of the input signal (IN) and forms a dead time. The signals output from the first and second inverter circuits 152 and 154 have opposite phases, and may be applied to a level shifter circuit (not shown).

The first dead time dt1 shown in FIG. 16 is determined based on a time constant (determined based on the ON-resistance of the P-type transistor of the first inverter circuit 152 and the capacitance between the first inverter circuit 152 and the first waveform adjusting circuit 156 (i.e., the total capacitance of the gate capacitance of the fourth inverter circuit 156-1, the drain capacitance of the first inverter circuit 152, and the parasitic capacitance due to wires and the like)) and the input threshold value 167 of the first waveform adjusting circuit 156.

The second dead time dt2 shown in FIG. 16 is determined based on a time constant (determined based on the ON-resistance of the P-type transistor of the second inverter circuit 154 and the capacitance between the second inverter circuit 154 and the second waveform adjusting circuit 158 (i.e., the total capacitance of the gate capacitance of the sixth inverter circuit 158, the drain capacitance of the second inverter circuit 154, and the parasitic capacitance due to wires and the like)) and the input threshold value 167 of the second waveform adjusting circuit 158.

The first dead time dt1 is preferably equal to the second dead time dt2.

A related-art dead time circuit is disclosed in FIG. 8 or 1 of JP-A-2005-261091, and includes a plurality of types of circuit elements, for example.

On the other hand, the dead time circuit 150 shown in FIG. 15 has a simple structure formed by the first to sixth inverter circuits. Therefore, the dead time circuit 150 can be formed to have a reduced chip size as compared with the related-art dead time circuit.

Each of the first inverter circuit 152 and the second inverter circuit 154 may include the same type of inverter circuit (i.e., an inverter circuit in which the capability of the P-type transistor is lower than the capability of the N-type transistor). As a result, a variation in dead time (dt1 and dt2) can be reduced.

When each of the first inverter circuit 152 and the second inverter circuit 154 includes an inverter circuit in which the capability of the P-type transistor is lower than the capability of the N-type transistor (first specific embodiment of the dead time circuit), a dead time circuit having a reduced chip size can be provided.

2.2.1 Modification of First Specific Embodiment of Dead Time Circuit

In FIG. 15, the first waveform adjusting circuit 156 includes the inverter circuits 156-1 and 156-2. Note that the first waveform adjusting circuit 156 may include only the inverter circuit 156-1. Specifically, the inverter circuit 156-2 may be omitted. In this case, only one of the signals output from the inverter circuit 156-1 and the inverter circuit 158 has the same phase as the phase of the input signal (IN) and forms a dead time.

In FIG. 15, the input threshold value 167 of the first and second waveform adjusting circuits 156 and 158 is set at VDD/2. Note that the input threshold value of the first waveform adjusting circuit 156 and the input threshold value of the second waveform circuit 158 may be set to be higher than VDD/2. In this case, the first and second dead times dt1 and dt2 increase corresponding to a change in input threshold value.

In FIG. 15, an independent capacitor may be disposed between the first inverter circuit 152 and the first waveform adjusting circuit 156 and between the second inverter circuit 154 and the second waveform adjusting circuit 158. In this case, the first and second delay amounts d1 and d2 increase corresponding to the capacitances of the independent capacitors.

2.3 Second Specific Embodiment of Dead Time Circuit

Figure 17:
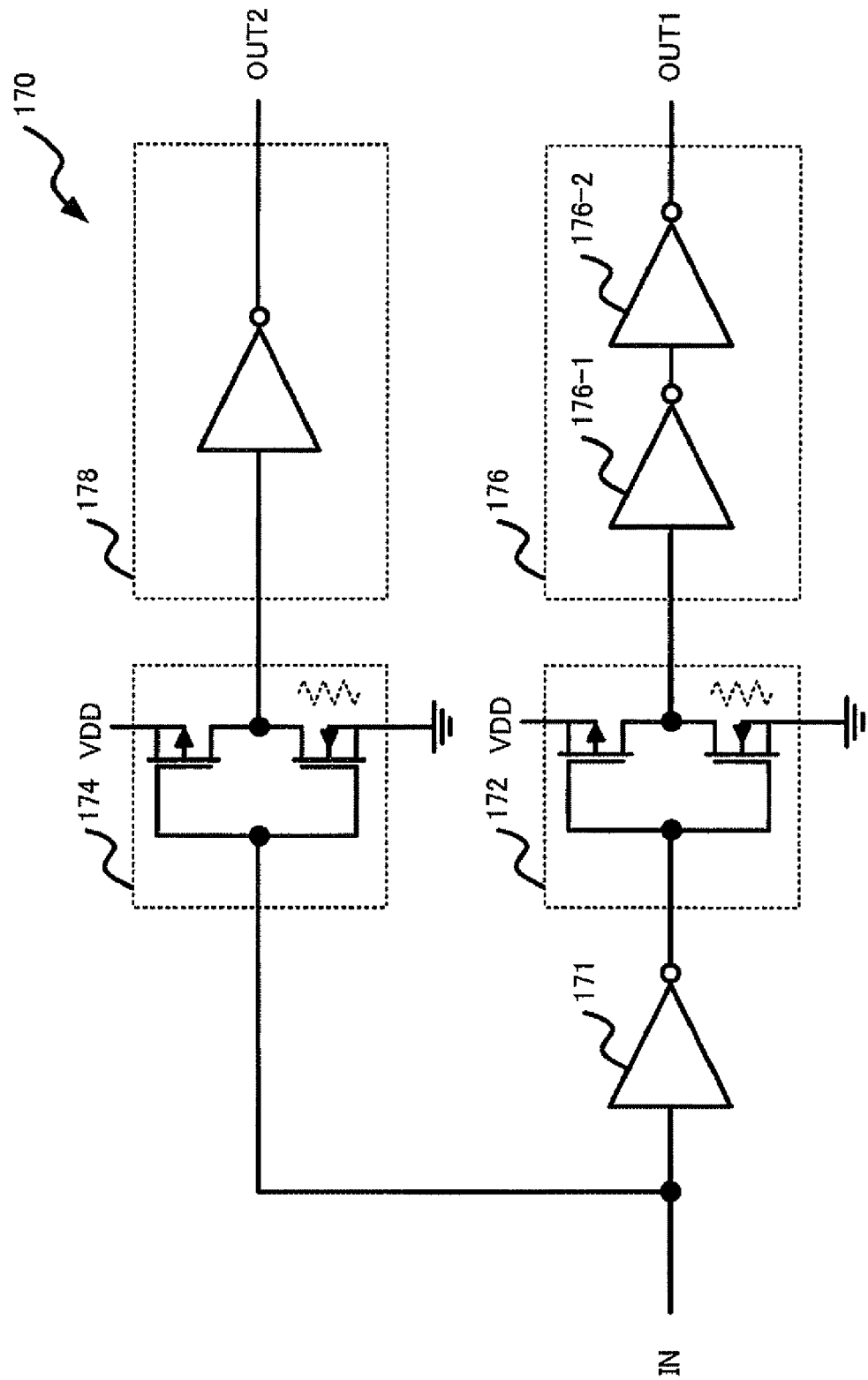
FIG. 17 shows another specific example of the dead time circuit 140 shown in FIG. 14.

FIG. 17 shows another specific example of the dead time circuit 140 shown in FIG. 14.

A dead time circuit 170 shown in FIG. 17 includes first and second inverter circuits 172 and 174 that receive signals based on the input signal (IN), a first waveform adjusting circuit 176 that receives a signal based on a signal output from the first inverter circuit 172, and a second waveform adjusting circuit 178 that receives a signal based on a signal output from the second inverter circuit 174.

Note that the dead time circuit 170 may not include the first and second waveform adjusting circuits 176 and 178.

The first inverter circuit 172 receives the input signal (IN) through a third inverter circuit 171. The first inverter circuit 172 inverts the input signal' (IN'), and outputs the inverted signal. The first inverter circuit 172 includes a P-type transistor and an N-type transistor (CMOS transistor). The capability of the N-type transistor of the first inverter circuit 172 is lower than the capability of the P-type transistor of the first inverter circuit 172.

The second inverter circuit 174 inverts the input signal (IN), and outputs the inverted signal. The second inverter circuit 174 includes a P-type transistor and an N-type transistor (CMOS transistor). The capability of the N-type transistor of the second inverter circuit 174 is lower than the capability of the P-type transistor of the second inverter circuit 174.

The first waveform adjusting circuit 176 includes a fourth inverter circuit 176-1 that adjusts the waveform of the signal output from the first inverter circuit 172. The first waveform adjusting circuit 176 also includes a fifth inverter circuit 176-2 that inverts the signal output from the fourth inverter circuit 176-1.

The second waveform adjusting circuit 178 adjusts the waveform of the signal output from the second inverter circuit 174. In FIG. 17, the second waveform adjusting circuit 178 includes a sixth inverter circuit 178.

Figure 18:
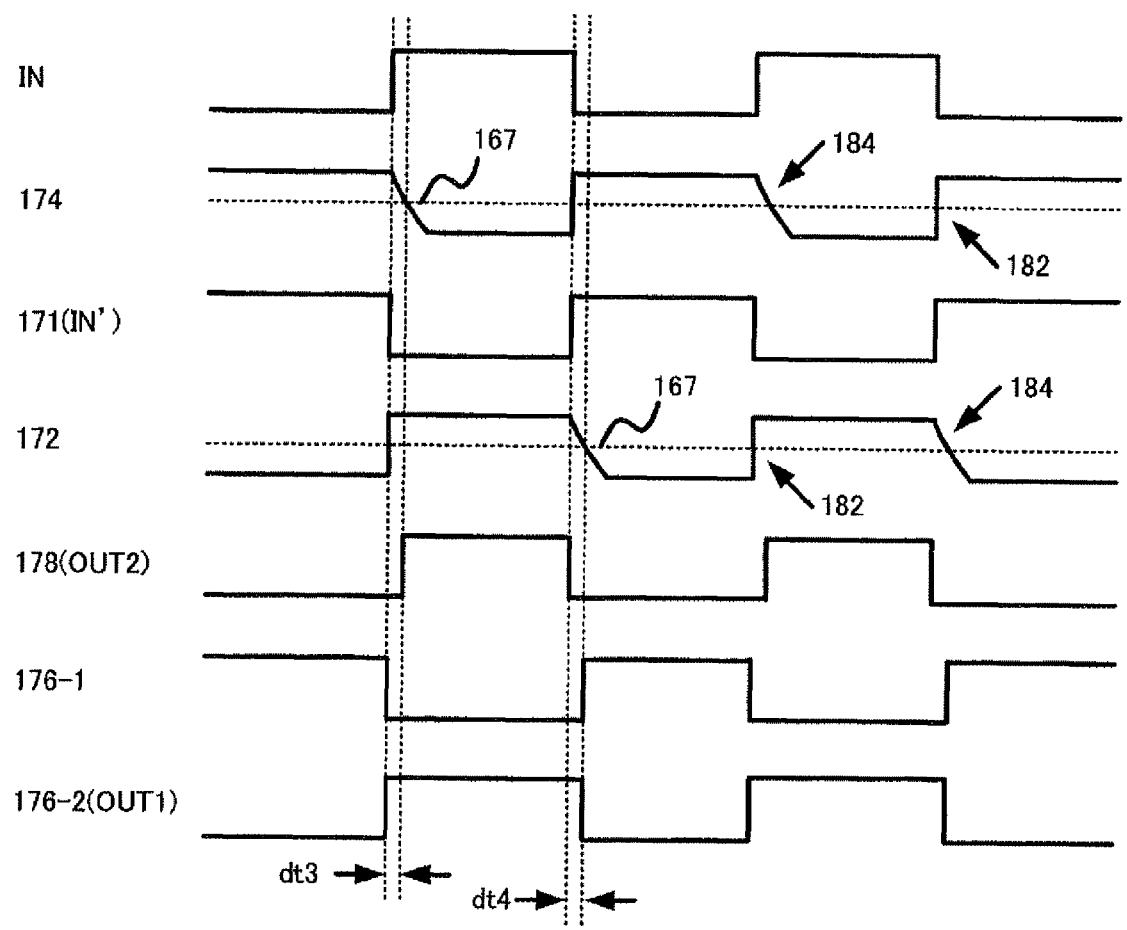
FIG. 18 is a timing diagram illustrative of the operation of a dead time circuit 170 shown in FIG. 17.

FIG. 18 is a timing diagram illustrative of the operation of the dead time circuit 170 shown in FIG. 17.

In FIG. 18, symbols IN, 171(IN'), 172, 174, 176-1, 176-2 (OUT1), and 178(OUT2) respectively indicate the input signal, the signal (input signal') output from the third inverter circuit 171, the signal output from the first inverter circuit 172, the signal output from the second inverter circuit 174, the signal output from the fourth inverter circuit 176-1, the signal (output signal 1) output from the fifth inverter circuit 176-2, and the signal (output signal 2) output from the sixth inverter circuit 178.

As shown in FIG. 18, the rise time (see arrow 184) of each of the output signals output from the first and second inverter circuits 152 and 154 shown in FIG. 17 is sufficiently longer than the fall time (see arrow 182).

As shown in FIG. 18, the output signals 1 and 2 (OUT1 and OUT2) output from the dead time circuit 170 shown in FIG. 17 have the same phase as the phase of the input signal (IN) and form dead times (dt3 and dt4). The first dead time dt3 is preferably equal to the second dead time dt4. When the first and second waveform adjusting circuits 176 and 178 are omitted, only one of the signals output from the first and second inverter circuits 172 and 174 has the same phase as the phase of the input signal (IN) and forms a dead time.

The dead time circuit 170 shown in FIG. 17 has a simple structure. Therefore, the dead time circuit 170 can be formed to have a reduced chip size as compared with a related-art dead time circuit.

Each of the first inverter circuit 172 and the second inverter circuit 174 may include the same type of inverter circuit (i.e., an inverter circuit in which the capability of the N-type transistor is lower than the capability of the P-type transistor). As a result, a variation in dead time (dt3 and dt4) can be reduced.

2.3.1 Modification of Second Specific Embodiment of Dead Time Circuit

In FIG. 17, the first waveform adjusting circuit 176 includes the inverter circuits 177-1 and 176-2. Note that the first waveform adjusting circuit 176 may include only the inverter circuit 176-1.

In FIG. 17, the input threshold value 167 of the first and second waveform adjusting circuits 176 and 178 is set at VDD/2. Note that the input threshold value of the first waveform adjusting circuit 176 and the input threshold value of the second waveform circuit 178 may be set to be lower than VDD/2.

In FIG. 17, an independent capacitor may be disposed between the first inverter circuit 172 and the first waveform adjusting circuit 176 and between the second inverter circuit 174 and the second waveform adjusting circuit 178.

2.4 Third Specific Embodiment of Dead Time Circuit

Figure 19:
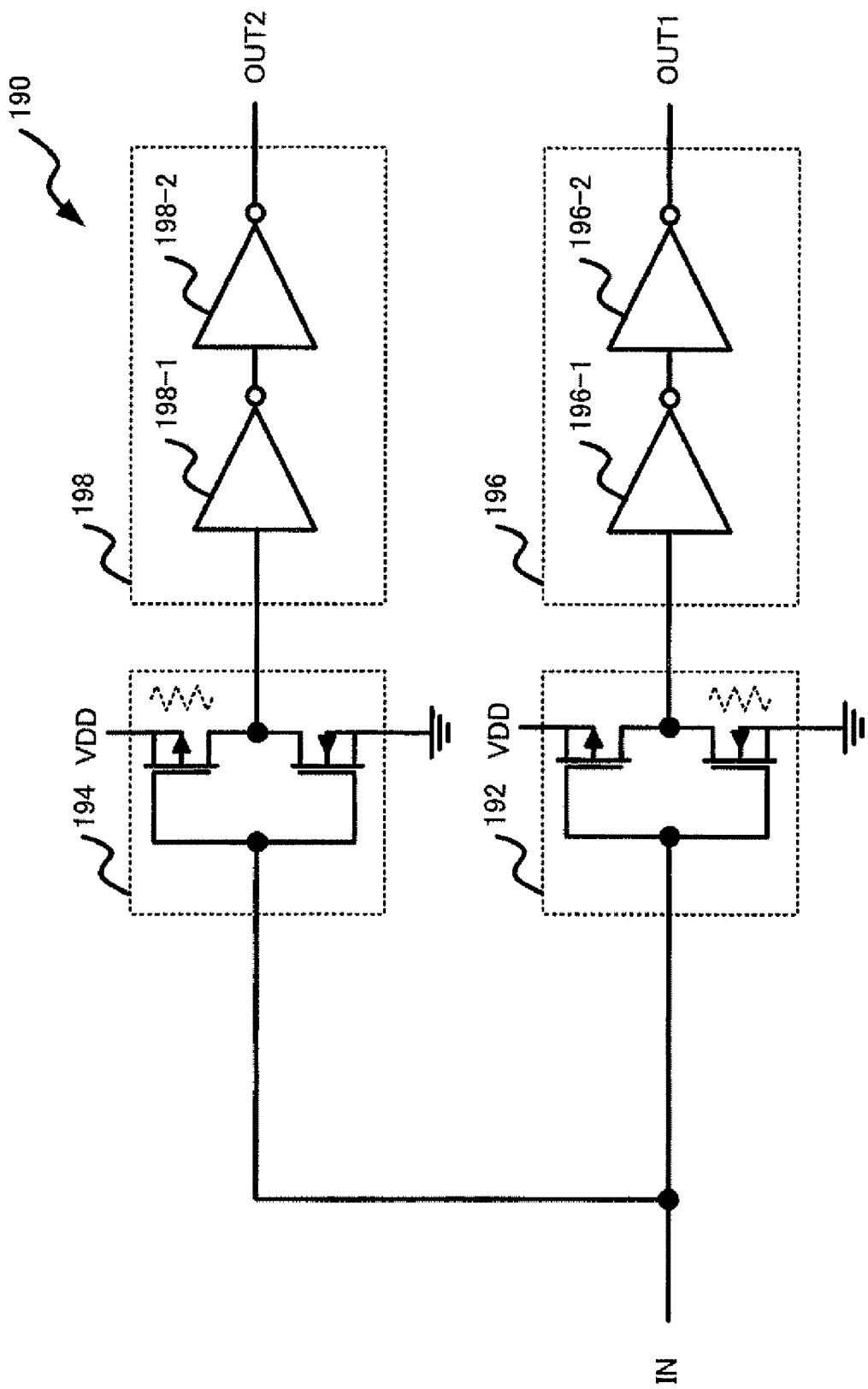
FIG. 19 shows a further specific example of the dead time circuit 140 shown in FIG. 14.

FIG. 19 shows a further specific example of the dead time circuit 140 shown in FIG. 14.

A dead time circuit 190 shown in FIG. 19 includes first and second inverter circuits 192 and 194 that receive signals based on the input signal (IN), a first waveform adjusting circuit 196 that receives a signal based on a signal output from the first inverter circuit 192, and a second waveform adjusting circuit 198 that receives a signal based on a signal output from the second inverter circuit 194.

Note that the dead time circuit 190 may not include the first and second waveform adjusting circuits 196 and 198.

The first inverter circuit 192 inverts the input signal (IN), and outputs the inverted signal. The first inverter circuit 192 includes a P-type transistor and an N-type transistor (CMOS transistor). The capability of the N-type transistor of the first inverter circuit 192 is lower than the capability of the P-type transistor of the first inverter circuit 192.

The second inverter circuit 194 inverts the input signal (IN), and outputs the inverted signal. The second inverter circuit 194 includes a P-type transistor and an N-type transistor (CMOS transistor). The capability of the P-type transistor of the second inverter circuit 194 is lower than the capability of the N-type transistor of the second inverter circuit 194.

The first waveform adjusting circuit 196 includes a third inverter circuit 196-1 that adjusts the waveform of the signal output from the first inverter circuit 192. The first waveform adjusting circuit 196 also includes a fourth inverter circuit 196-2 that inverts the signal output from the third inverter circuit 196-1.

The second waveform adjusting circuit 198 includes a fifth inverter circuit 198-1 that adjusts the waveform of the signal output from the second inverter circuit 194. The second waveform adjusting circuit 198 also includes a sixth inverter circuit 198-2 that inverts the signal output from the fifth inverter circuit 198-1.

Figure 20:
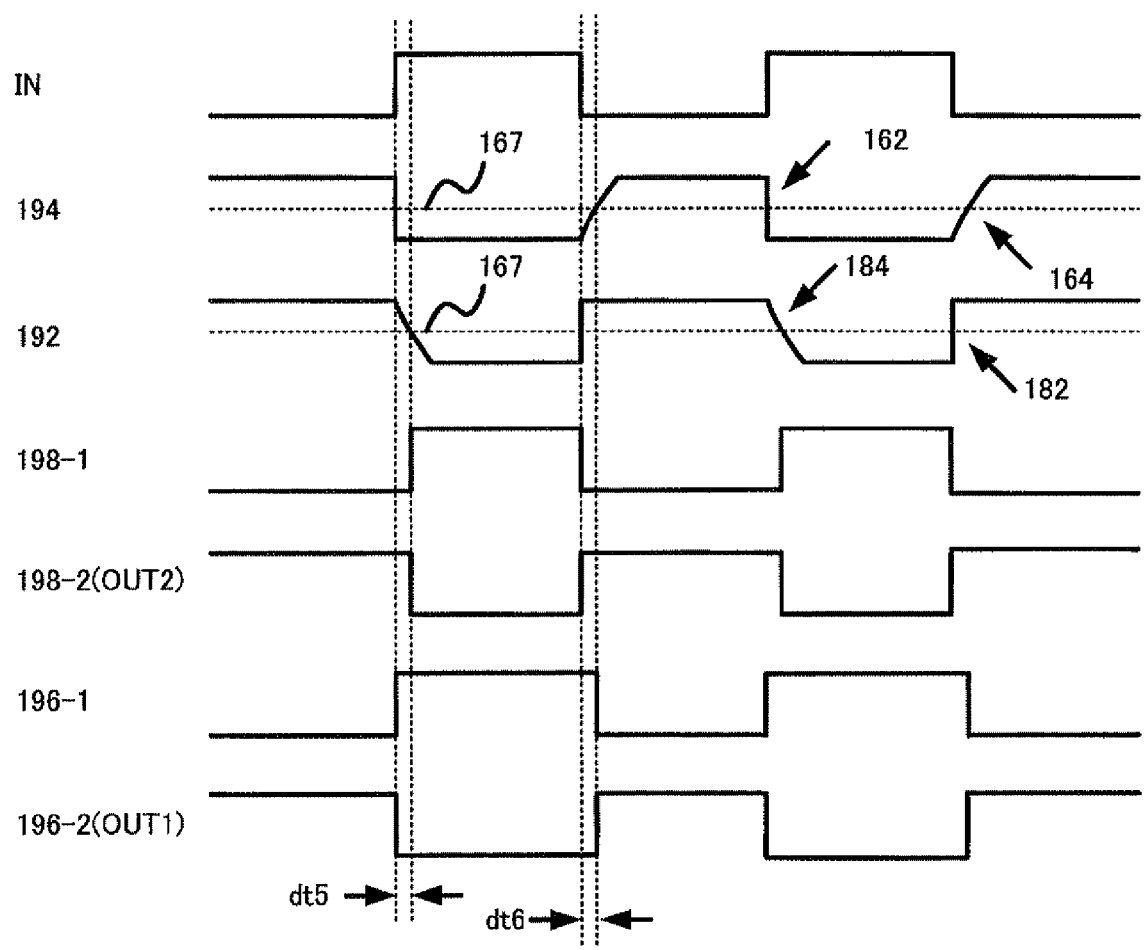
FIG. 20 is a timing diagram illustrative of the operation of a dead time circuit 190 shown in FIG. 19.

FIG. 20 is a timing diagram illustrative of the operation of the dead time circuit 190 shown in FIG. 19.

In FIG. 20, symbols IN, 192, 194, 196-1, 196-2(OUT1), 198-1, and 198-2(OUT2) respectively indicate the input signal, the signal output from the first inverter circuit 192, the signal output from the second inverter circuit 194, the signal output from the third inverter circuit 196-1, the signal (output signal 1) output from the fourth inverter circuit 196-2, the signal (output signal 2) output from the fifth inverter circuit 198-1, and the signal (output signal 2) output from the sixth inverter circuit 198-2.

As shown in FIG. 20, the fall time (184) of the output signal output from the first inverter circuit 192 shown in FIG. 19 is sufficiently longer than the rise time (182).

As shown in FIG. 20, the rise time (164) of the output signal output from the second inverter circuit 194 shown in FIG. 19 is sufficiently longer than the fall time (162).

As shown in FIG. 20, the output signals 1 and 2 (OUT1 and OUT2) output from the dead time circuit 190 shown in FIG. 19 have a phase opposite to the phase of the input signal (IN) and form dead times (dt5 and dt6). The first dead time dt5 is preferably equal to the second dead time dt6. When the first and second waveform adjusting circuits 196 and 198 are omitted, the signals output from the first and second inverter circuits 192 and 194 have a phase opposite to the phase of the input signal (IN) and form a dead time.

The dead time circuit 190 shown in FIG. 19 has a simple structure. Therefore, the dead time circuit 190 can be formed to have a reduced chip size as compared with a related-art dead time circuit.

When only the second inverter circuit 194 includes the inverter circuit in which the capability of the P-type transistor is lower than the capability of the N-type transistor (third specific embodiment of the dead time circuit), a dead time circuit having a chip size that is larger than that of the first specific embodiment of the dead time circuit, but is smaller than that of the second specific embodiment of the dead time circuit can be provided.

2.4.1 Modification of Third Specific Embodiment of Dead Time Circuit

In FIG. 19, the first waveform adjusting circuit 196 includes the inverter circuits 196-1 and 196-2. Note that the first waveform adjusting circuit 196 may include only the inverter circuit 196-1.

In FIG. 19, the second waveform adjusting circuit 198 includes the inverter circuits 198-1 and 198-2. Note that the second waveform adjusting circuit 198 may include only the inverter circuit 198-1.

In FIG. 19, the input threshold value 167 of the first and second waveform adjusting circuits 196 and 198 is set at VDD/2. Note that the input threshold value of the first waveform adjusting circuit 196 and the input threshold value of the second waveform circuit 198 may be set to be lower than VDD/2.

In FIG. 19, an independent capacitor may be disposed between the first inverter circuit 192 and the first waveform adjusting circuit 196 and between the second inverter circuit 194 and the second waveform adjusting circuit 198.

3. Delay Circuit

3.1 Configuration of Delay Circuit

Figure 21:
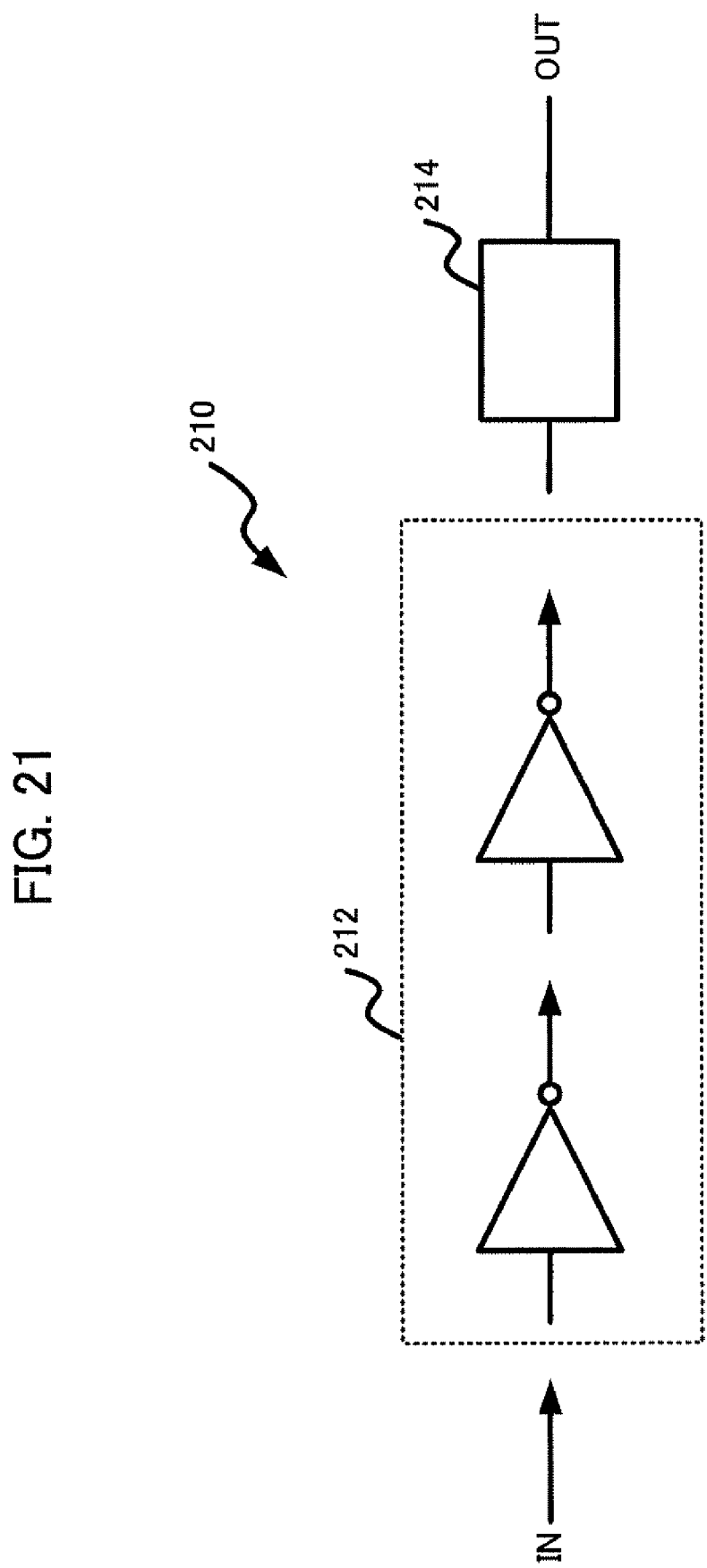
FIG. 21 is a schematic block diagram showing a delay circuit according to the invention.

FIG. 21 is a schematic block diagram showing a delay circuit according to the invention.

A delay circuit 210 shown in FIG. 21 includes an inverter circuit 212 that receives a signal based on the input signal (IN), and a waveform adjusting circuit 214 that receives a signal based on a signal output from the inverter circuit 212.

Note that the delay circuit 210 may not include the waveform adjusting circuit 214 when a reduction in chip size is given priority, for example. Specifically, another circuit (not shown) in the subsequent stage may adjust the waveform of a signal based on a signal output from the inverter circuit 212.

The inverter circuit 212 includes a plurality of inverter circuits. The first-stage inverter circuit inverts a signal based on the input signal (IN) (e.g., the input signal (IN)), and outputs the inverted signal. The second-stage inverter circuit inverts a signal based on the signal output from the first-stage inverter circuit (e.g., the signal output from the first-stage inverter circuit), and outputs the inverted signal. Each of the inverter circuits included in the inverter circuit 212 includes a first-conductivity-type transistor and a second-conductivity-type transistor. The capability of one of the first-conductivitytype transistor and the second-conductivity-type transistor is lower than the capability of the other of the first-conductivity-type transistor and the second-conductivity-type transistor. Each of the inverter circuits included in the inverter circuit 212 includes a CMOS transistor, for example.

The waveform adjusting circuit 214 adjusts the waveform of the signal output from the inverter circuit 212 (e.g., the signal output from the inverter circuit 212), and outputs the waveform-adjusted signal.

The inventor of the invention found that a delay circuit can be formed by combining an inverter circuit (in which the capability of one of the transistors is lower than the capability of the other transistor) and a waveform adjusting circuit (e.g., the second delay circuit 124 shown in FIGS. 12 and 13 and the delay amount D2), for example.

3.2 First Specific Embodiment of Delay Circuit

Figure 22:
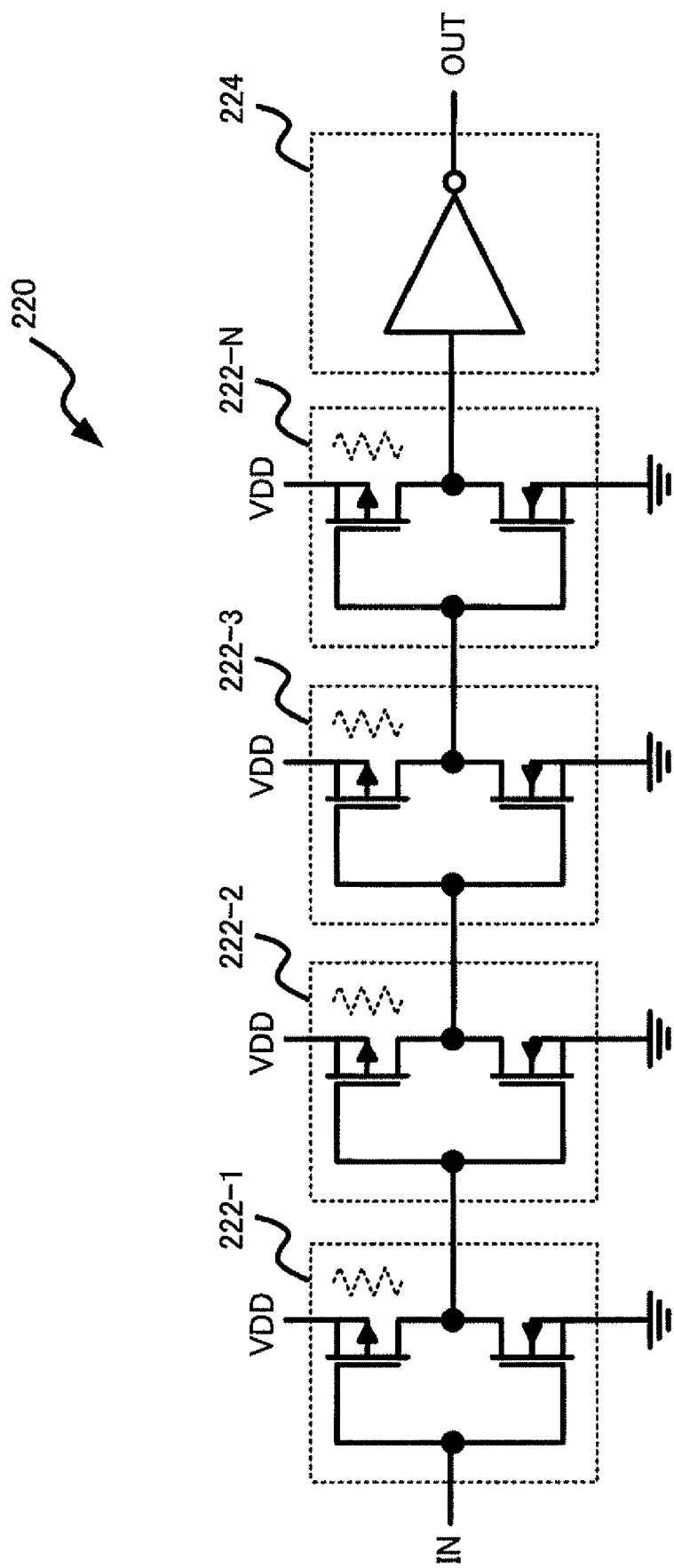
FIG. 22 shows a specific example of a delay circuit 210 shown in FIG. 21.

FIG. 22 shows a specific example of the delay circuit 210 shown in FIG. 21.

A delay circuit 220 shown in FIG. 22 includes a subsequent-stage inverter circuit 222-N that receives a signal based on the input signal (IN), and a waveform adjusting circuit 224 that receives a signal based on a signal output from the subsequent-stage inverter circuit 222-N.

Note that the delay circuit 220 may not include the waveform adjusting circuit 224, for example.

The subsequent-stage inverter circuit 222-N receives the input signal (IN) through preceding-stage inverter circuits 222-1, 222-2, and 222-3. Specifically, the inverter circuit 222-N receives a signal output from the inverter circuit 222-3 (i.e., an input signal (IN''') obtained by inverting the input signal (IN) three times).

Each of the subsequent-stage inverter circuit 222-N and the preceding-stage inverter circuits 222-1, 222-2, and 222-3 includes a P-type transistor and an N-type transistor (CMOS transistor). The capability of the P-type transistor of each of the subsequent-stage inverter circuit 222-N and the preceding-stage inverter circuits 222-1, 222-2, and 222-3 is lower than the capability of the N-type transistor of each of the subsequent-stage inverter circuit 222-N and the preceding-stage inverter circuits 222-1, 222-2, and 222-3.

In FIG. 22, the inverter circuits 222-1, 222-2, 222-3, and 222-N are connected in series. The conductivity type of the low-capability transistor of each of the inverter circuits (222-1, 222-2, 222-3, and 222-N) is identical (i.e., P type).

The waveform adjusting circuit 224 adjusts the waveform of the signal output from the subsequent-stage inverter circuit 222-N. In FIG. 22, the waveform adjusting circuit 224 is formed by a final-stage inverter circuit 224.

Figure 23:
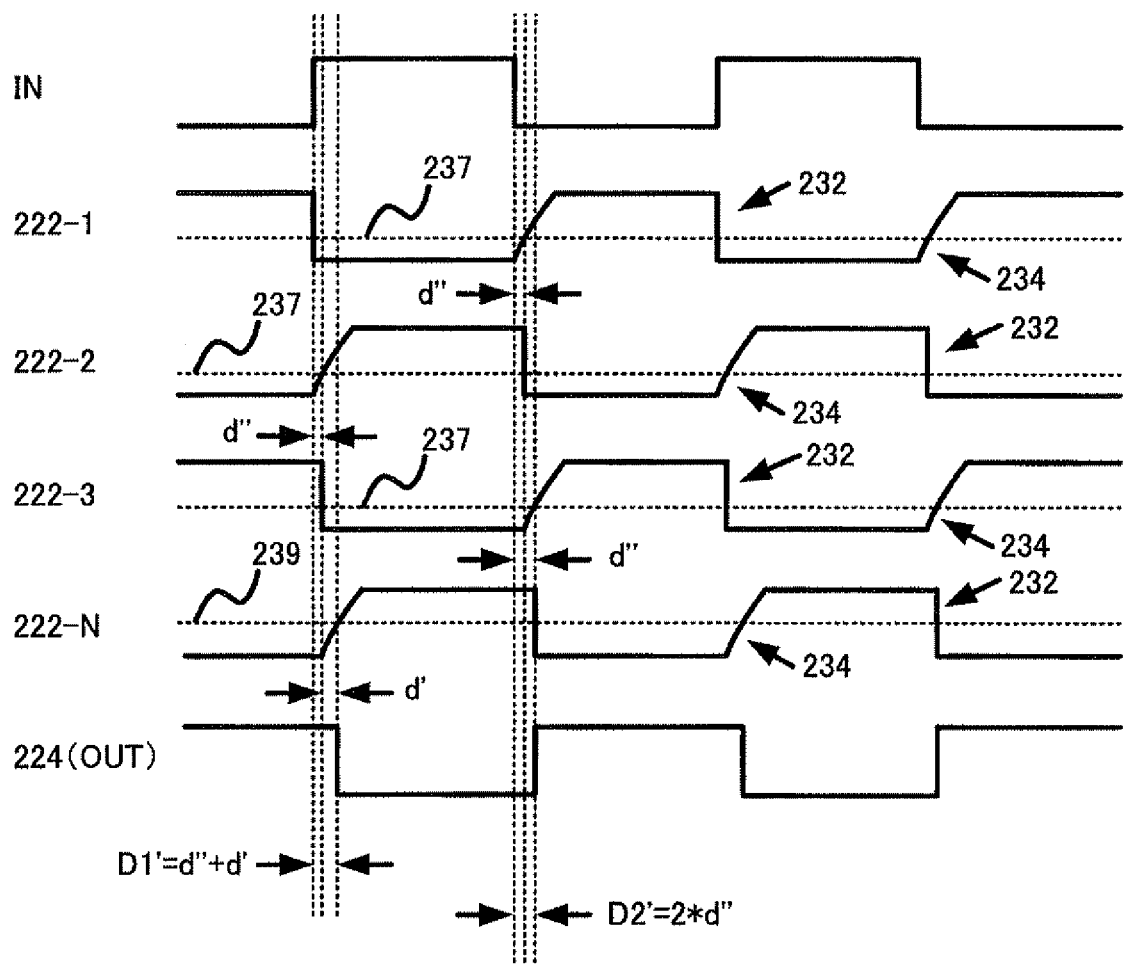
FIG. 23 is a timing diagram illustrative of the operation of a delay circuit 220 shown in FIG. 22.

As shown in FIG. 23, a signal (output signal) output from the final-stage inverter circuit 224 has a phase opposite to the phase of the input signal (IN). Therefore, the waveform adjusting circuit 224 may be formed by a non-inverting waveform adjusting circuit (i.e., an even number of inverter circuits) so that the signal output from the waveform adjusting circuit 224 has the same phase as the phase of the input signal (IN).

FIG. 23 is a timing diagram illustrative of the operation of the delay circuit 220 shown in FIG. 22.

In FIG. 23, symbols IN, 222-1, 222-2, 222-3, 222-N, and 224(OUT) respectively indicate the input signal, the signals output from the preceding-stage inverter circuits 222-1, 222-2, and 222-3, the signal output from the subsequent-stage inverter circuit 222-N, and the signal (output signal) output from the final-stage inverter circuit 224.

As shown in FIG. 23, the input signal (IN) input to the delay circuit 220 shown in FIG. 22 is a rectangular signal.

As shown in FIG. 23, the rise time (see arrow 234) of each of the output signals output from the preceding-stage inverter circuits 222-1, 222-2, and 222-3 and the subsequent-stage inverter circuit 222-N shown in FIG. 22 is sufficiently longer than the fall time (see arrow 232).

As shown in FIG. 23, the fall time and the rise time of the output signal output from the final-stage inverter circuit 224 shown in FIG. 22 are significantly short and can be disregarded.

In FIG. 23, a dotted line 237 indicates an input threshold value of the inverter circuits 222-2, 222-3, and 222-N, and a dotted line 239 indicates an input threshold value of the waveform adjusting circuit 224.

Since the capability of the P-type transistor of each of the inverter circuits 222-2, 222-3, and 222-N is lower than the capability of the N-type transistor of each of the inverter circuits 222-2, 222-3, and 222-N, the input threshold value 237 of the inverter circuits 222-2, 222-3, and 222-N is set to be lower than a value half of the power supply voltage VDD of the inverter circuits 222-1, 222-2, and 222-3. The input threshold value 239 of the waveform adjusting circuit 224 is set at a value half of the power supply voltage VDD of the inverter circuit 222-N, for example. Note that the input threshold value 239 of the waveform adjusting circuit 224 may be set at a different value.

As shown in FIG. 23, the output signal (OUT) output from the delay circuit 220 shown in FIG. 22 has a delay amount (D1' (=d"+d')) when the input signal (IN) changes from the LOW level to the HIGH level, and has a delay amount (D2' (=2d")) when the input signal (IN) changes from the HIGH level to the LOW level.

A related-art delay circuit is disclosed in FIG. 2 or 1 of JP-A-7-022921, for example, and is formed by a plurality of combinations of an inverter circuit and an independent capacitor. In another related-art delay circuit (not shown), a P-type transistor and an N-type transistor of each inverter circuit has low capability, as described later as a comparative example with reference to FIG. 26.

The delay circuit 220 shown in FIG. 22 is configured so that the inverter circuits 222-1, 222-2, 222-3, and 222-N can produce a delay without providing an independent capacitor. Moreover, since one of the P-type transistor and the N-type transistor of each of the inverter circuits 222-1, 222-2, 222-3, and 222-N has low capability, the gate area can be reduced. Therefore, the delay circuit 220 has a simple structure and can be formed to have a reduced chip size as compared with the related-art delay circuit.

Each of the preceding-stage inverter circuits 222-1, 222-2, and 222-3 and the subsequent-stage inverter circuit 222-N may include the same type of inverter circuit (i.e., an inverter circuit in which the capability of the P-type transistor is lower than the capability of the N-type transistor). As a result, a variation in delay amount (D1' and D2') can be reduced.

When each of the preceding-stage inverter circuits 222-1, 222-2, and 222-3 and the subsequent-stage inverter circuit 222-N includes an inverter circuit in which the capability of the P-type transistor is lower than the capability of the N-type transistor (first specific embodiment of the delay circuit), a delay circuit having a reduced chip size can be provided.

3.2.1 Modification of First Specific Embodiment of Delay Circuit

In FIG. 22, the preceding-stage inverter circuits 222-1, 222-2, and 222-3 are formed using three inverter circuits, for example. Note that the number of preceding-stage inverter circuits may be increased or decreased corresponding to the desired delay amount of the delay circuit 220. For example, when the number of preceding-stage inverter circuits is nine, the delay amount D1' of the delay circuit 220 is 4d"+d', and the delay amount D2' of the delay circuit 220 is 5d".

In FIG. 22, each of the preceding-stage inverter circuits 222-1, 222-2, and 222-3 and the subsequent-stage inverter circuit 222-N includes an inverter circuit in which the capability of the P-type transistor is lower than the capability of the N-type transistor. Note that the inverter circuits may include an inverter circuit in which the capability of the N-type transistor is lower than the capability of the P-type transistor (e.g., the first inverter circuit 82 shown in FIG. 8).

In FIG. 22, an independent capacitor may be disposed in each of the preceding-stage inverter circuits 222-1, 222-2, and 222-3 and the subsequent-stage inverter circuit 222-N. In this case, the delay amounts D1' and D2' increase corresponding to the capacitances of the independent capacitors.

In FIG. 22, an inverter circuit connected to the inverter circuit 224 may be additionally provided in order to invert the output signal (OUT) output from the inverter circuit 224.

In FIG. 22, the wave adjusting circuit 224 is formed by an inverter circuit having one input threshold value 239, for example. Note that the wave adjusting circuit 224 may be formed by a Schmitt circuit having two input threshold values. For example, a first threshold value of the Schmitt circuit used to detect a change from the LOW level to the HIGH level is set to be higher than VDD/2, and a second threshold value of the Schmitt circuit used to detect a change from the HIGH level to the LOW level is set to be lower than VDD/2. In this case, the delay amount D1' increases while amplitude noise between the first and second threshold values is removed (i.e., the original function of the Schmitt circuit).

Figure 24:
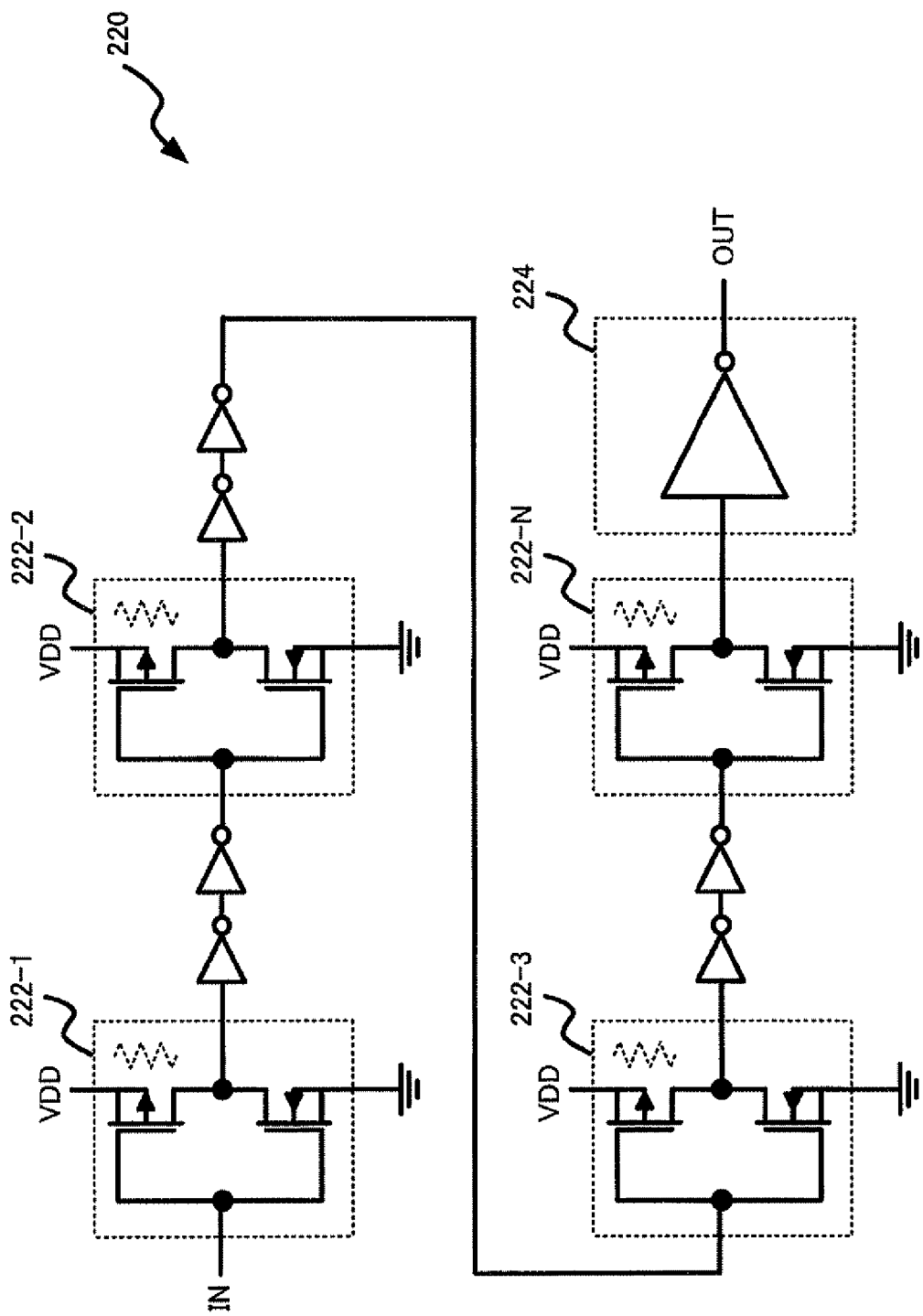
FIG. 24 shows a modification of the delay circuit 220 shown in FIG. 22.

FIG. 24 shows a modification of the delay circuit 220 shown in FIG. 22.

Specifically, an even number of inverter circuits (non-inverting waveform adjusting circuit) may be added to the subsequent stage of each of the inverter circuits 222-1, 222-2, and 222-3 shown in FIG. 22.

Figure 25:
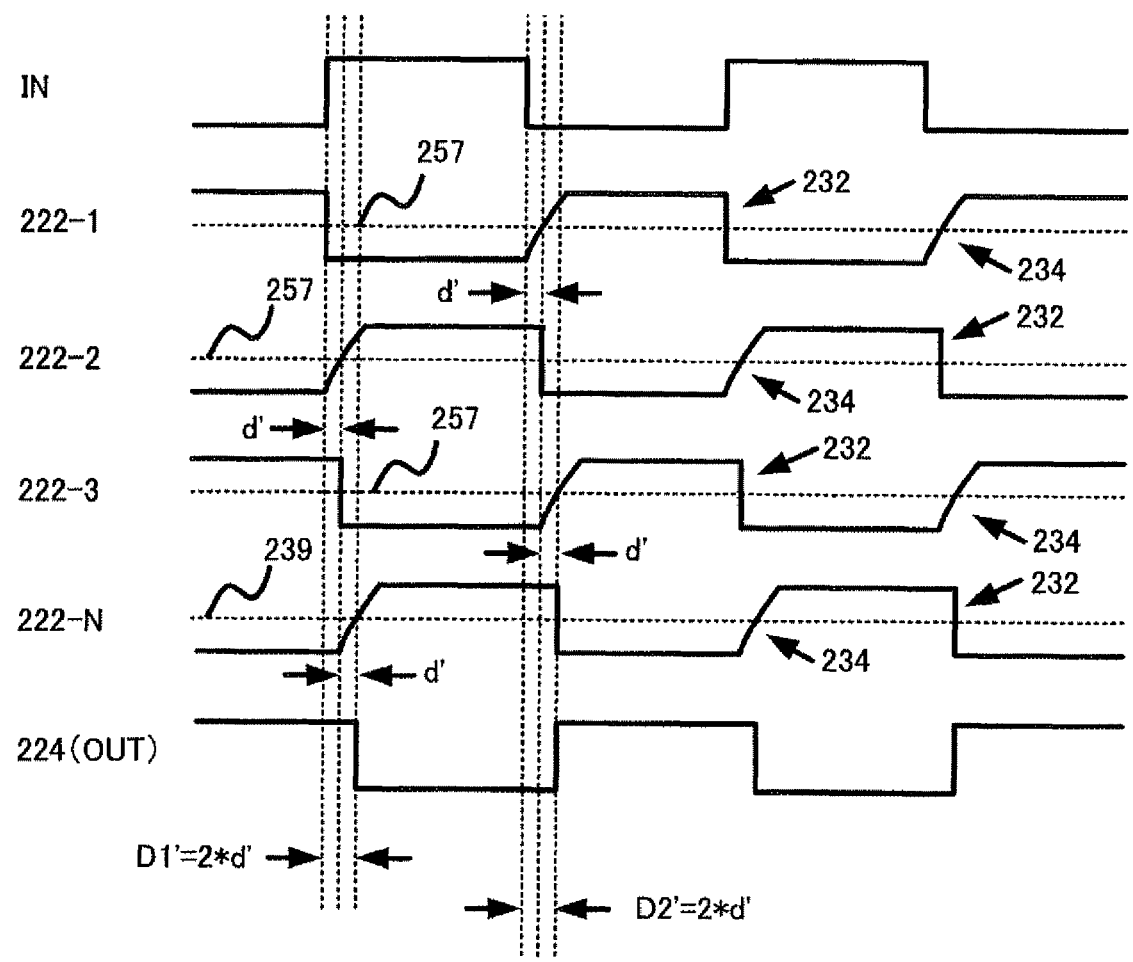
FIG. 25 is a timing diagram illustrative of the operation of a delay circuit 220' shown in FIG. 24.

FIG. 25 is a timing diagram illustrative of the operation of the delay circuit 220 shown in FIG. 24. Note that signals output from the even number of inverter circuits additionally provided are not shown in FIG. 25.

In FIG. 25, a dotted line 257 indicates an input threshold value of the first-stage inverter circuit of each of the even number of inverter circuits. The input threshold value is set at a value half of the power supply voltage VDD of the inverter circuits 222-1, 222-2, and 222-3.

As shown in FIG. 25, the output signal (OUT) output from the delay circuit 220 shown in FIG. 24 has a delay amount (D1' (=2d')) when the input signal (IN) changes from the LOW level to the HIGH level, and has a delay amount (D2' (=2d')) when the input signal (IN) changes from the HIGH level to the LOW level. Note that the delay amount (2d') of the delay circuit 220 shown in FIG. 24 is larger than the delay amount ((d"+d') and (2d")) of the delay circuit 220 shown in FIG. 22.

In FIG. 24, the first-stage inverter circuit of each of the even number of inverter circuits and the waveform adjusting circuit 224 are formed by inverter circuits having one input threshold value 257 or 239. Note that the first-stage inverter circuit of each of the even number of inverter circuits and the waveform adjusting circuit 224 may be formed by Schmitt circuits having two input threshold values. For example, a first threshold value of the Schmitt circuit used to detect a change from the LOW level to the HIGH level is set to be higher than VDD/2, and a second threshold value of the Schmitt circuit used to detect a change from the HIGH level to the LOW level is set to be lower than VDD/2. In this case, the delay amounts D1' and D2' increase while amplitude noise between the first and second threshold values is removed (i.e., the original function of the Schmitt circuit).

In FIG. 24, the waveform adjusting circuit 224 is formed by one inverter circuit (inverting waveform adjusting circuit). Note that the waveform adjusting circuit 224 may be formed by a non-inverting waveform adjusting circuit (i.e., an even number of inverter circuits), if necessary.

Figure 26:
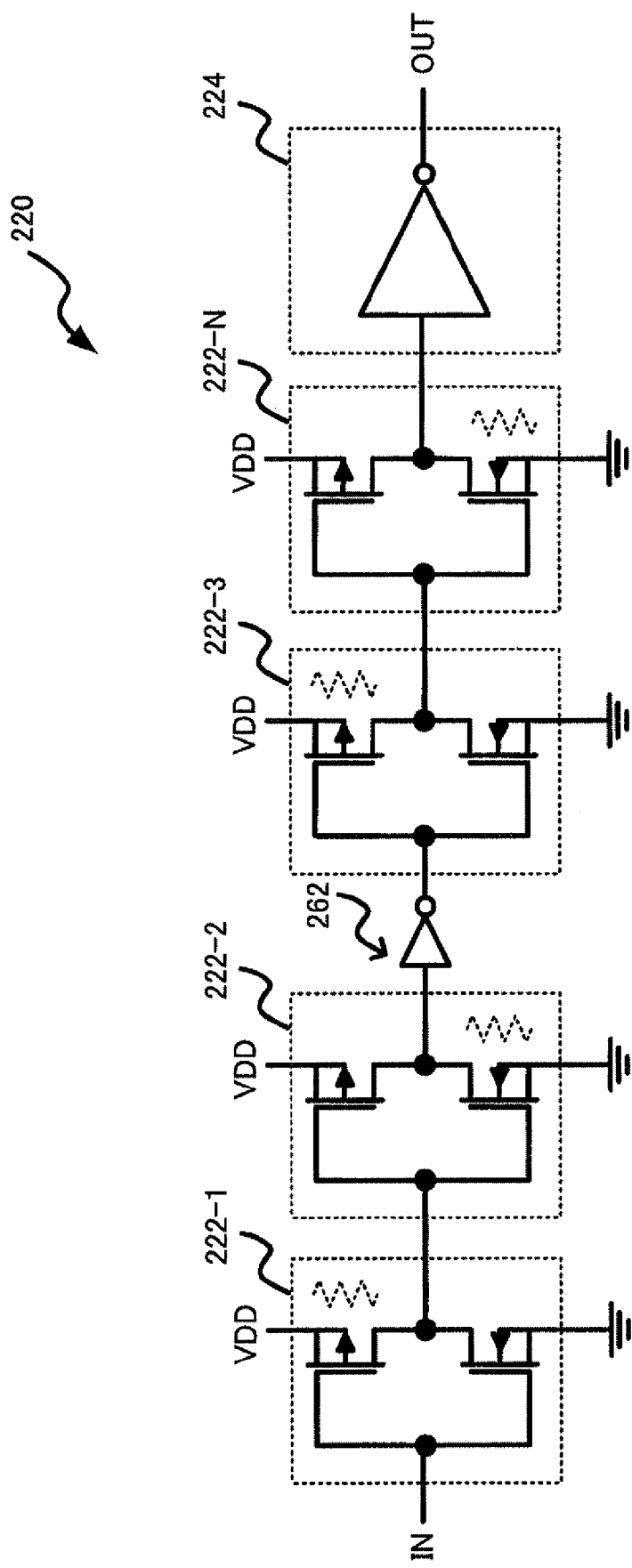
FIG. 26 shows another modification of the delay circuit 220 shown in FIG. 22.

FIG. 26 shows another modification of the delay circuit 220 shown in FIG. 22.

Specifically, an odd number of inverter circuits 262 (inverting waveform adjusting circuit 262) may be added to the subsequent stage of the inverter circuit 222-2 shown in FIG. 22, and the capability of the N-type transistor of each of the inverter circuits 222-2 and 222-N may be lower than the capability of the P-type transistor of each of the inverter circuits 222-2 and 222-N. Specifically, the delay circuit 220 may include a plurality of unit circuits. Each of the unit circuits may include an inverter circuit 222-1 in which the capability of a P-type transistor is lower than the capability of an N-type transistor, an inverter circuit 222-2 in which the capability of an N-type transistor is lower than the capability of a P-type transistor, and an inverting waveform adjusting circuit 262.

In FIG. 26, the inverter circuits 222-1, 222-2, and 222-3 are connected in series. The inverter circuits 222-1, 222-2, and 222-3 include an even number of successive inverter circuits 222-1 and 222-2, and one subsequent inverter circuit 222-3. The conductivity type of the low-capability transistor alternately differs (i.e., P type and N type) between the inverter circuits 222-1 and 222-2. The conductivity type N type) of the low-capability transistor of the final inverter circuit 222-2 included in the inverter circuits 222-1 and 222-2 differs from the conductivity type (P type) of the low-capability transistor of the subsequent inverter circuit 222-3.

In FIG. 26, when a capacitor is added to the subsequent stage of each of the inverter circuits 222-1, 222-2, 222-3, and 222-N and the input threshold value of the inverter circuits 262 and 224 is set at a value half of the power supply voltage VDD, the gate areas of the inverter circuits 222-1, 222-2, 262, 222-3, 222-N, and 224 are respectively 68 μm×μm, 125 μm×μm, 22 μm×μm, 68 μm×μm, 125 μm×μm, and 22 μm×μm, for example. In this case, the total gate area is 430 μm×μm. In FIG. 26, when a capacitor is added to the subsequent stage of each of the inverter circuits 222-1, 222-2, 222-3, and 222-N, the inverter circuit 262 is omitted, the inverter circuit 224 (inverting waveform adjusting circuit) is replaced by two inverter circuits 224 (non-inverting waveform adjusting circuit), and the inverter circuits 222-1, 222-2, 222-3, and 222-N are configured so that the capability of the P-type transistor is lower than the capability of the P-type transistor of the inverter circuit 224 and the capability of the N-type transistor is lower than the capability of the N-type transistor of the inverter circuit 224, the gate areas of the inverter circuits 222-1, 222-2, 262, 222-3, 222-N, and 224 are respectively 160 μm×μm, 160 μm×μm, 160 μm×μm, 160 μm×μm, 160 μm×μm, and 7 μm×μm, for example. In this comparative example (related-art delay circuit), the total gate area is 654 μm×μm. Specifically, when one of the P-type transistor and the N-type transistor of each of the inverter circuits 222-1, 222-2, 222-3, and 222-N included in the delay circuit 220 has low capability, an identical delay amount can be obtained while reducing the gate area by 34% as compared with the comparative example in which the P-type transistor and the N-type transistor have low capability.

Figure 27:
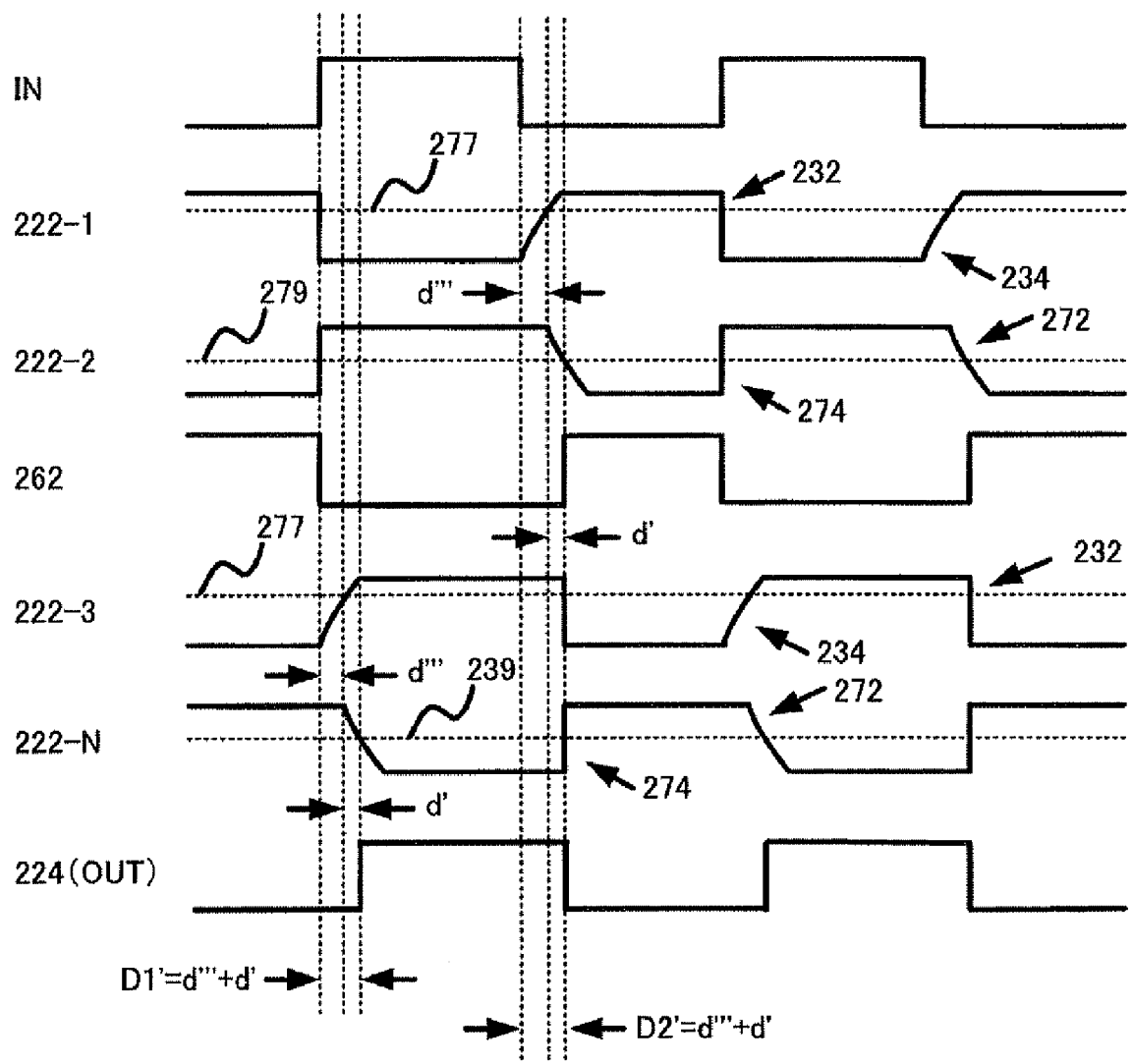
FIG. 27 is a timing diagram illustrative of the operation of a delay circuit 220" shown in FIG. 26.

FIG. 27 is a timing diagram illustrative of the operation of the delay circuit 220 shown in FIG. 26.

In FIG. 27, a dotted line 277 indicates an input threshold value of the inverter circuits 222-2 and 222-N, and a dotted line 279 indicates an input threshold value of the inverter circuit 262 that is additionally provided.

Since the capability of the N-type transistor of each of the inverter circuits 222-2 and 222-N is lower than the capability of the P-type transistor of each of the inverter circuits 222-2 and 222-N, the input threshold value 277 of the inverter circuits 222-2 and 222-N is set to be higher than a value half of the power supply voltage VDD of the inverter circuits 222-1 and 222-3. The input threshold value of the inverter circuit 262 is set at a value half of the power supply voltage VDD of the inverter circuit 222-2.

As shown in FIG. 27, the fall time (see arrow 272) of each of the output signals output from the inverter circuits 222-2 and 222-N shown in FIG. 26 is sufficiently longer than the rise time (see arrow 274).

As shown in FIG. 27, the fall time and the rise time of the output signal output from the inverter circuit 262 shown in FIG. 26 are significantly short and can be disregarded.

As shown in FIG. 27, the output signal (OUT) output from the delay circuit 220 shown in FIG. 26 has a delay amount (D1' (=d'''+d')) when the input signal (IN) changes from the LOW level to the HIGH level, and has a delay amount (D2' (=d'''+d')) when the input signal (IN) changes from the HIGH level to the LOW level. Note that the delay amount (d'''+d') of the delay circuit 220 shown in FIG. 26 is larger than the delay amount ((d''+d') and (2d'')) of the delay circuit 220 shown in FIG. 22 and the delay amount ((2d')) of the delay circuit 220 shown in FIG. 24.

In FIG. 26, the inverter circuit 262 and the waveform adjusting circuit 224 are formed by inverter circuits having one input threshold value 279 or 239. Note that the inverter circuit 262 and the waveform adjusting circuit 224 may be formed by Schmitt circuits having two input threshold values. For example, a first threshold value of the Schmitt circuit used to detect a change from the LOW level to the HIGH level is set to be lower than VDD/2, and a second threshold value of the Schmitt circuit used to detect a change from the HIGH level to the LOW level is set to be higher than VDD/2. In this case, the delay amounts D1' and D2' increase while amplitude noise between the first and second threshold values is removed (i.e., the original function of the Schmitt circuit).

In FIG. 26, the inverting waveform adjusting circuit 262 may be replaced by a non-inverting waveform adjusting circuit, the inverter circuit 222-3 in which the capability of the P-type transistor is lower than the capability of the N-type transistor may be replaced by an inverter circuit 222-3 in which the capability of the N-type transistor is lower than the capability of the P-type transistor, and the inverter circuit 222-N in which the capability of the N-type transistor is lower than the capability of the P-type transistor may be replaced by an inverter circuit 222-N in which the capability of the P-type transistor is lower than the capability of the N-type transistor. In this case, the inverter circuits 222-1, 222-2, and 222-3 connected in series include an even number of successive inverter circuits 222-1 and 222-2, and one subsequent inverter circuit 222-3. The conductivity type (N type) of the low-capability transistor of the final inverter circuit 222-2 included in the inverter circuits 222-1 and 222-2 is the same as the conductivity type (N type) of the low-capability transistor of the subsequent inverter circuit 222-3.

In FIG. 26, the waveform adjusting circuit 224 is formed by one inverter circuit (inverting waveform adjusting circuit). Note that the waveform adjusting circuit 224 may be formed by a non-inverting waveform adjusting circuit (i.e., an even number of inverter circuits), if necessary.

Figure 28:
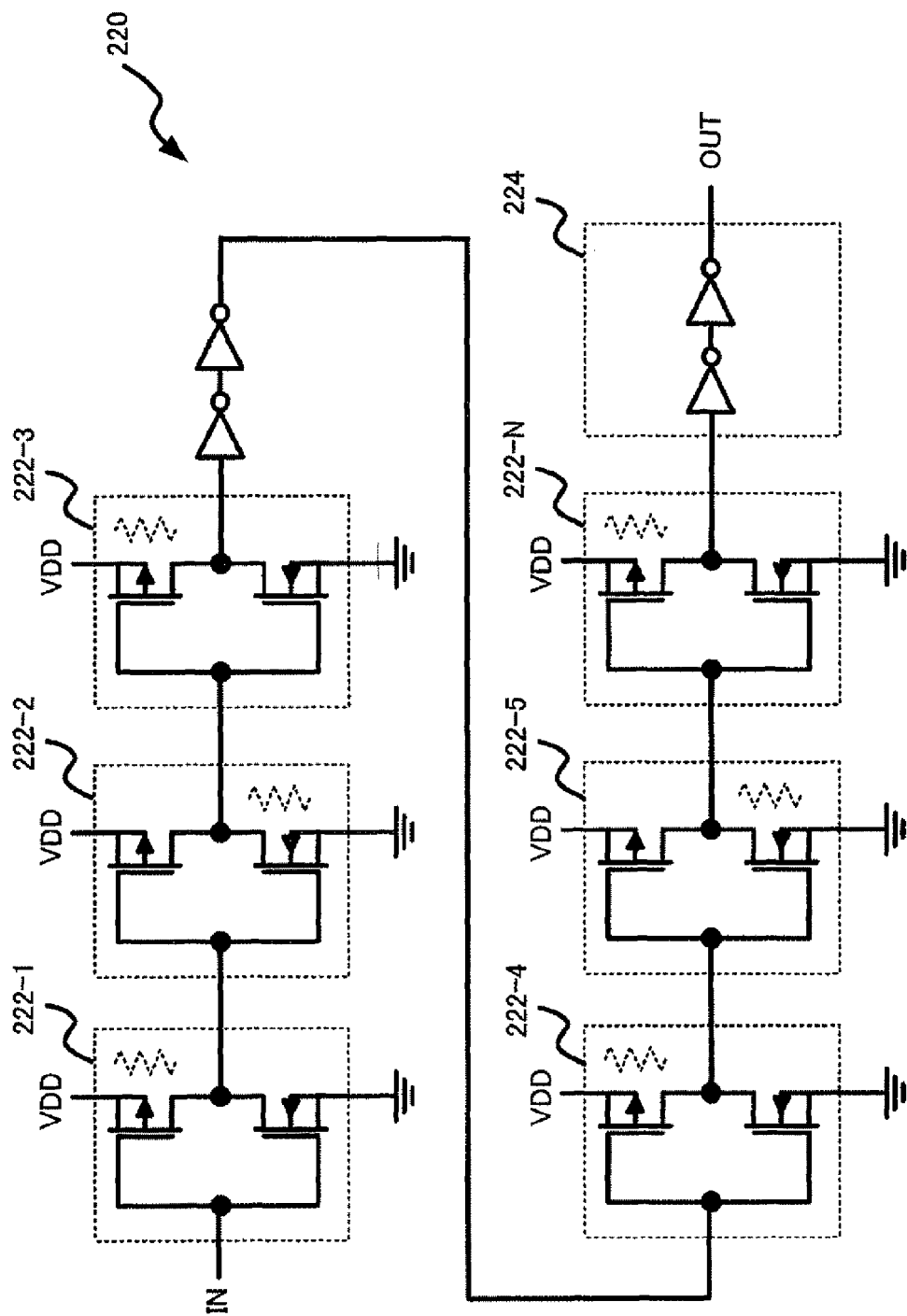
FIG. 28 shows a further modification of the delay circuit 220 shown in FIG. 22.

FIG. 28 shows a further modification of the delay circuit 220 shown in FIG. 22.

Specifically, an even number of inverter circuits (non-inverting waveform adjusting circuit) may be added to the subsequent stage of the inverter circuit 222-3 shown in FIG. 22, the capability of the N-type transistor of the inverter circuit 222-2 may be lower than the capability of the P-type transistor of the inverter circuit 222-2, an inverter circuit that has a function equal to that of the inverter circuits 222-1 and 222-2 may be added to the preceding stage of the inverter circuit 222-N, and the inverting waveform adjusting circuit 224 may be replaced by a non-inverting waveform adjusting circuit 224. Specifically, the delay circuit 220 may include a plurality of unit circuits. Each of the unit circuits may include an inverter circuit 222-1 in which the capability of a P-type transistor is lower than the capability of an N-type transistor, an inverter circuit 222-2 in which the capability of an N-type transistor is lower than the capability of a P-type transistor, an inverter circuit 222-3 in which the capability of a P-type transistor is lower than the capability of an N-type transistor, and a non-inverting waveform adjusting circuit.

In FIG. 28, the inverter circuits 222-1, 222-2, 222-3, and 222-4 are connected in series. The inverter circuits 222-1, 222-2, 222-3, and 222-4 include an odd number of successive inverter circuits 222-1, 222-2, and 222-3, and one subsequent inverter circuit 222-4. The conductivity type of the low-capability transistor alternately differs (i.e., P type, N type, and P type) between the inverter circuits 222-1, 222-2, and 222-3. The conductivity type (P type) of the low-capability transistor of the final inverter circuit 222-3 included in the inverter circuits 222-1, 222-2, and 222-3 is the same as the conductivity type (P type) of the low-capability transistor of the subsequent inverter circuit 222-4.

The delay amount of the delay circuit 220 can be increased by increasing the number of inverter circuits in which the capability of the P-type transistor or N-type transistor is lower than the capability of the other transistor.

In FIG. 28, the first-stage inverter circuit of the non-inverting waveform adjusting circuit may be formed by a Schmitt circuit having two input threshold values, for example.

In FIG. 28, the non-inverting waveform adjusting circuit may be replaced by an inverting waveform adjusting circuit, the inverter circuit 222-4 in which the capability of the P-type transistor is lower than the capability of the N-type transistor may be replaced by an inverter circuit 222-4 in which the capability of the N-type transistor is lower than the capability of the P-type transistor, the inverter circuit 222-5 in which the capability of the N-type transistor is lower than the capability of the P-type transistor may be replaced by an inverter circuit 222-5 in which the capability of the P-type transistor is lower than the capability of the N-type transistor, and the inverter circuit 222-N in which the capability of the P-type transistor is lower than the capability of the N-type transistor may be replaced by an inverter circuit 222-N in which the capability of the N-type transistor is lower than the capability of the P-type transistor. In this case, the inverter circuits 222-1, 222-2, 222-3, and 222-4 connected in series include an odd number of successive inverter circuits 222-1, 222-2, and 222-3, and one subsequent inverter circuit 222-4. The conductivity type (P type) of the low-capability transistor of the final inverter circuit 222-2 included in the inverter circuits 222-1 and 222-2 differs from the conductivity type (N type) of the low-capability transistor of the subsequent inverter circuit 222-4.

In FIG. 28, the waveform adjusting circuit 224 is formed by a non-inverting waveform adjusting circuit. Note that the waveform adjusting circuit 224 may be formed by an inverting waveform adjusting circuit (i.e., an odd number of inverter circuits), if necessary.

3.3 Second Specific Embodiment of Delay Circuit

Figure 29:
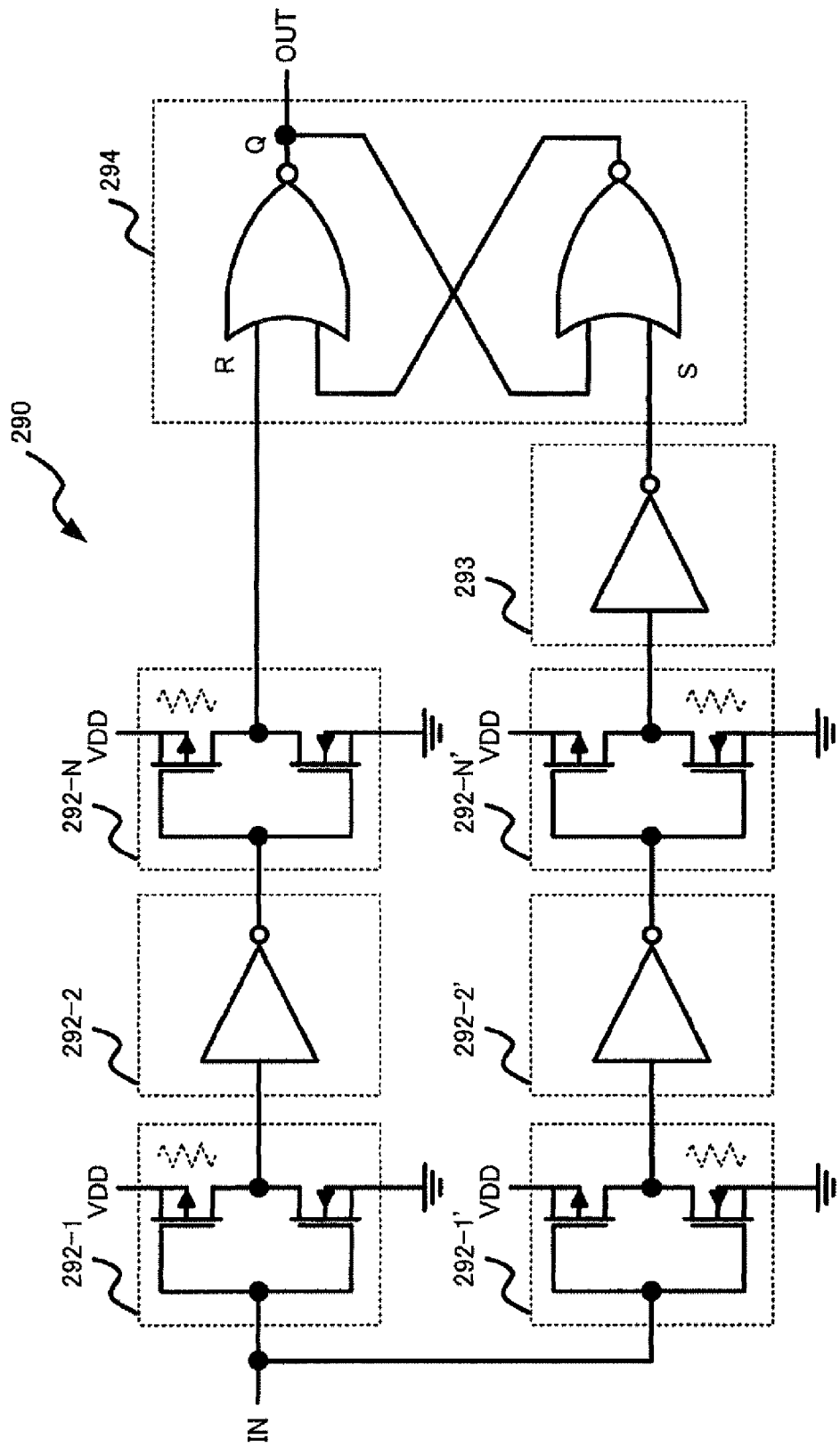
FIG. 29 shows another specific example of the delay circuit 210 shown in FIG. 21.

FIG. 29 shows another specific example of the delay circuit 210 shown in FIG. 21.

A delay circuit 290 shown in FIG. 29 includes subsequent-stage inverter circuits 292-N and 292-N' that receive a signal based on the input signal (IN), and a waveform adjusting circuit 294 that receives signals based on signals output from the subsequent-stage inverter circuits 292-N and 292-N'.

The subsequent-stage inverter circuit 292-N has the same function as that of the subsequent-stage inverter circuit 292-N shown in FIG. 29. Specifically, the subsequent-stage inverter circuit 292-N receives the input signal (IN) through a preceding-stage inverter circuit 292-1 and a waveform adjusting circuit 292-2. In FIG. 29, the preceding-stage waveform adjusting circuit 292-2 includes an inverter circuit 292-2.

Each of the subsequent-stage inverter circuit 292-N and the preceding-stage inverter circuit 292-1 includes a P-type transistor and an N-type transistor (CMOS transistor). The capability of the P-type transistor of each of the subsequent-stage inverter circuit 292-N and a preceding-stage inverter circuit 292-1 is lower than the capability of the N-type transistor of each of the subsequent-stage inverter circuit 292-N and the preceding-stage inverter circuit 292-1.

The subsequent-stage inverter circuit 292-N' includes the same circuit elements as those of the subsequent-stage inverter circuit 292-N, but differs from the subsequent-stage inverter circuit 292-N as to the following point.

The capability of the N-type transistor of each of the subsequent-stage inverter circuit 292-N' and a preceding-stage inverter circuit 292-1' is lower than the capability of the P-type transistor of each of the subsequent-stage inverter circuit 292-N' and the preceding-stage inverter circuit 292-1'. Specifically, each of the preceding-stage inverter circuit 292-1 and the subsequent-stage inverter circuit 292-N includes an inverter circuit in which the capability of the P-type transistor is lower than the capability of the N-type transistor. On the other hand, each of the preceding-stage inverter circuit 292-1' and the subsequent-stage inverter circuit 292-N' includes an inverter circuit in which the capability of the N-type transistor is lower than the capability of the P-type transistor.

The waveform adjusting circuit 294 receives a signal output from the subsequent-stage inverter circuit 292-N, and receives a signal output from the subsequent-stage inverter circuit 292-N' through an intermediate-stage inverter circuit 293. The waveform adjusting circuit 294 includes a latch circuit 294.

The latch circuit 294 receives a signal obtained by inverting a signal output from the subsequent-stage inverter circuit 292-N' as the set signal (S). The latch circuit 294 receives a signal obtained by inverting a signal output from the subsequent-stage inverter circuit 292-N as the reset signal (R). The latch circuit 294 outputs one (Q) of two output levels (Q and Q_) corresponding to the timings of the set signal (S) and the reset signal (R). The latch circuit 294 is formed using a NOR latch circuit. A signal output from the latch circuit 86 forms an output signal (OUT) output from the delay circuit 290.

Figure 30:
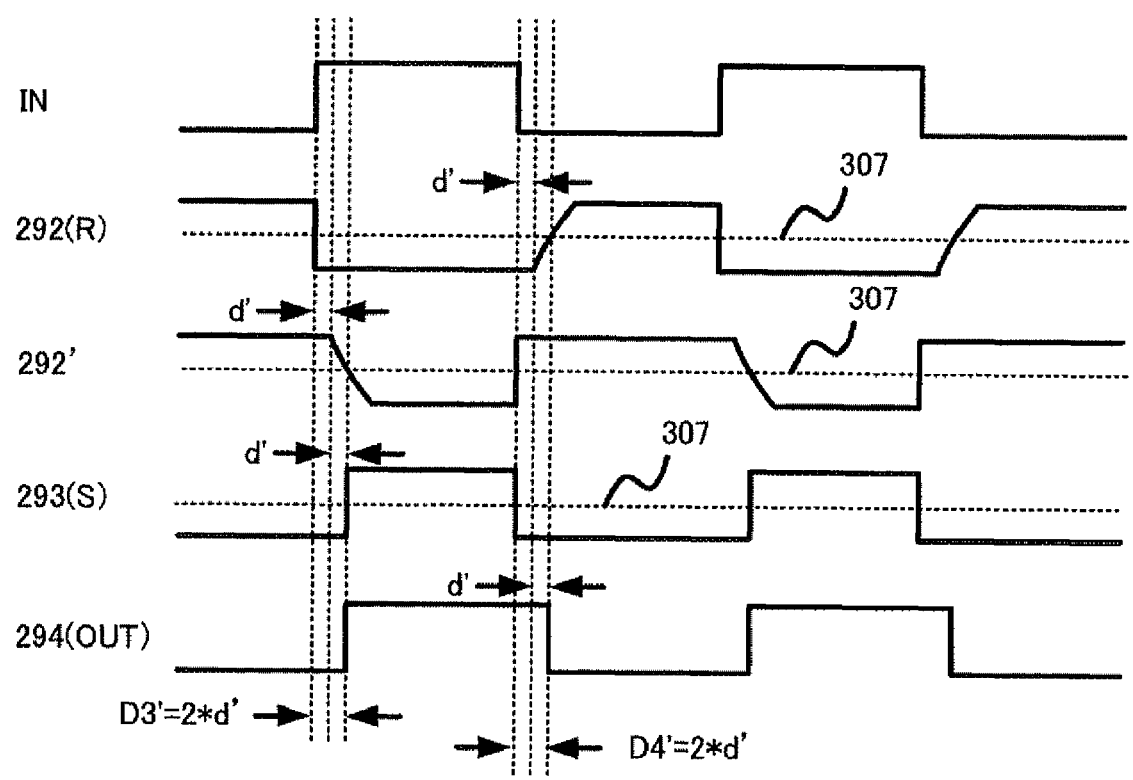
FIG. 30 is a timing diagram illustrative of the operation of a delay circuit 290 shown in FIG. 29.

FIG. 30 is a timing diagram illustrative of the operation of the delay circuit 290 shown in FIG. 29.

In FIG. 30, symbols IN, 292-N(R), 292-N', 293(S), and 294(OUT) respectively indicate the input signal, the signal (reset signal) output from the subsequent-stage inverter circuit 292-N, the signal output from the subsequent-stage inverter circuit 292-N', the signal (set signal) output from the intermediate-stage inverter circuit 293, and the signal (output signal) output from the latch circuit 294.

In FIG. 30, a dotted line 307 indicates an input threshold value with regard to the reset signal (R) of the latch circuit 294, an input threshold value of the intermediate-stage inverter circuit 293, and an input threshold value with regard to the set signal (S) of the latch circuit 294. The input threshold values 237 of the intermediate-stage inverter circuit 293 and the latch circuit 294 are set at a value half of the power supply voltage VDD of the inverter circuits 292-N, 292-N', and 293. Note that the input threshold values 237 of the intermediate-stage inverter circuit 293 and the latch circuit 294 may differ from each other.

As shown in FIG. 30, the output signal (OUT) output from the delay circuit 290 shown in FIG. 29 has a delay amount (D3' (=2d')) when the input signal (IN) changes from the LOW level to the HIGH level, and has a delay amount (D4' (=2d')) when the input signal (IN) changes from the HIGH level to the LOW level.

The delay circuit 290 shown in FIG. 29 has a simple structure. Therefore, the delay circuit 290 can be formed to have a reduced chip size as compared with a related-art delay circuit.

3.3.1 Modification of Second Specific Embodiment of Delay Circuit

In FIG. 29, the intermediate-stage inverter circuit 293 is disposed between the subsequent-stage inverter circuit 292-N' and the latch circuit 294. Note that the intermediate-stage inverter circuit 293 may be disposed between the subsequent-stage inverter circuit 292-N and the latch circuit 294. In this case, the latch circuit 294 is formed using a NAND latch circuit.

In FIG. 29, each of the inverter circuits 292-2, 292-2', and 293 may be formed by a Schmitt circuit having two input threshold values.

Figure 31:
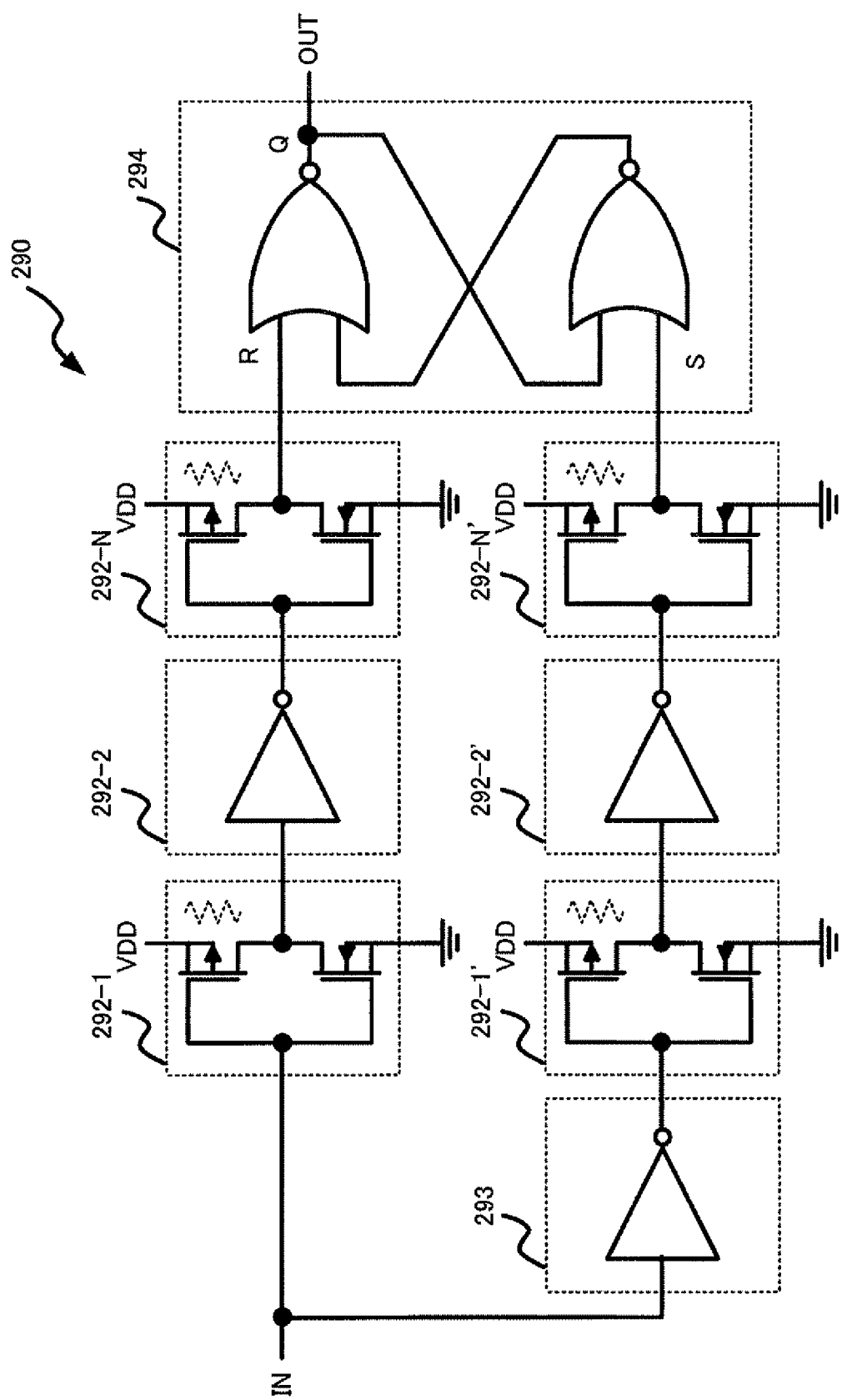
FIG. 31 shows a modification of the delay circuit 290 shown in FIG. 29.

FIG. 31 shows a modification of the delay circuit 290 shown in FIG. 29.

Specifically, the inverter circuit 293 that is disposed between the inverter circuit 292-N' and the waveform adjusting circuit 294 in FIG. 29 may be disposed between the input signal (IN) and the inverter circuit 292-1, and the capability of the P-type transistor of each of the inverter circuits 292-1' and 292-N' may be lower than the capability of the N-type transistor of each of the inverter circuits 292-1' and 292-N'. Specifically, the delay circuit 290 may be configured so that all of the inverter circuits in which the capability of one of the P-type transistor and the N-type transistor is lower than the capability of the other transistor are formed by the inverter circuits 292-1, 292-N, 292-1', and 292-N' in which the capability of the P-type transistor is lower than the capability of the N-type transistor. In this case, a variation in delay amount (D3' and D4') of the delay circuit 290 can be reduced. Moreover, the delay circuit 290 shown in FIG. 31 can be formed to have a reduced chip size.

In FIG. 31, each of the inverter circuits 292-2 and, 292-2' may be formed by a Schmitt circuit having two input threshold values.

In FIG. 29 or 31, the delay circuit 290 includes first and second inverter circuits 292-1 and 292-1' connected in parallel. The delay circuit 290 also includes a first inverting waveform adjusting circuit 292-2 connected in series to the first inverter circuit 292-1, a subsequent first inverter circuit 292-N connected in series to the first inverting waveform adjusting circuit 292-2, a second inverting waveform adjusting circuit 292-2' connected in series to the second inverter circuit 292-1', a subsequent second inverter circuit 292-N' connected in series to the second inverting waveform adjusting circuit 292-2', and a third inverter circuit 293 connected in series to the preceding stage of the first inverter circuit 292-1, the subsequent stage of the subsequent first inverter circuit 292-N, the preceding stage of the second inverter circuit 292-1', or the subsequent stage of the subsequent second inverter circuit 292-N'. The conductivity type of the low-capability transistor of the first inverter circuit 292-1 is the same as the conductivity type of the low-capability transistor of the subsequent first inverter circuit 292-N. The conductivity type of the low-capability transistor of the second inverter circuit 292-1' is the same as the conductivity type of the low-capability transistor of the subsequent second inverter circuit 292-N'.

In FIG. 29 or 31, the first inverter circuit 292-1 may include an even number of successive first inverter circuits (e.g., the inverter circuits 222-1 and 222-2 shown in FIG. 26), and the second inverter circuit 292-1' may include an even number of successive second inverter circuits. Note that the conductivity type of the low-capability transistor alternately differs between the first inverter circuits and between the second inverter circuits. The conductivity type of the low-capability transistor of the final inverter circuit included in each of the first inverter circuits and the second inverter circuits is the same as the conductivity type of the low-capability transistor of the subsequent inverter circuit.

In FIG. 29 or 31, the first inverter circuit 292-1 may include an even number of successive first inverter circuits (e.g., the inverter circuits 222-1 and 222-2 shown in FIG. 26), the second inverter circuit 292-1' may include an even number of successive second inverter circuits, and the first inverting waveform adjusting circuit 292-2 and the first inverting waveform adjusting circuit 292-2 may be replaced by non-inverting waveform circuits. Note that the conductivity type of the low-capability transistor alternately differs between the first inverter circuits and between the second inverter circuits. The conductivity type of the low-capability transistor of the final inverter circuit included in each of the first inverter circuits and the second inverter circuits differs from the conductivity type of the low-capability transistor of the subsequent inverter circuit.

In FIG. 29 or 31, the first inverter circuit 292-1 may include an odd number of successive first inverter circuits (e.g., the inverter circuits 222-1, 222-2, and 222-3 shown in FIG. 28), and the second inverter circuit 292-1' may include an odd number of successive second inverter circuits. Note that the conductivity type of the low-capability transistor alternately differs between the first inverter circuits and between the second inverter circuits. The conductivity type of the low-capability transistor of the final inverter circuit included in each of the first inverter circuits and the second inverter circuits is the same as the conductivity type of the low-capability transistor of the subsequent inverter circuit.

In FIG. 29 or 31, the first inverter circuit 292-1 may include an odd number of successive first inverter circuits (e.g., the inverter circuits 222-1, 222-2, and 222-3 shown in FIG. 28), the second inverter circuit 292-1' may include an even number of successive second inverter circuits, and the first inverting waveform adjusting circuit 292-2 and the first inverting waveform adjusting circuit 292-2 may be replaced by non-inverting waveform circuits. Note that the conductivity type of the low-capability transistor alternately differs between the first inverter circuits and between the second inverter circuits. The conductivity type of the low-capability transistor of the final inverter circuit included in each of the first inverter circuits and the second inverter circuits differs from the conductivity type of the low-capability transistor of the subsequent inverter circuit.

4. Thermal Head Driver, Thermal Head, Electronic Instrument, and Printing System 4.1 Thermal Head FIG. 32 is a schematic block diagram showing a thermal head according to the invention.

Figure 32:
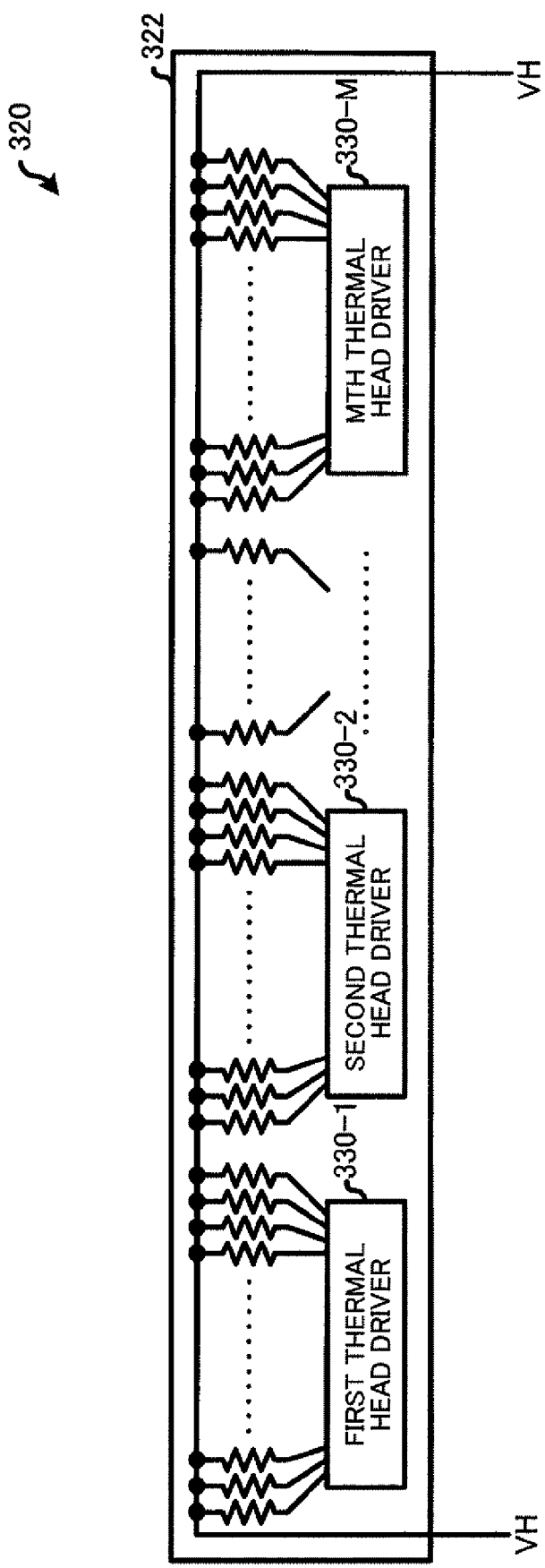
FIG. 32 is a schematic block diagram showing a thermal head according to the invention.

A thermal head 320 shown in FIG. 32 includes a plurality of thermal resistor elements (heating elements or heating resistors in a broad sense) formed on a ceramic sheet 322. In FIG. 32, the thermal resistor elements are arranged along the edge of one long side of the ceramic sheet 322 at intervals corresponding to pixels. A power supply voltage VH is supplied to one end of the thermal resistor elements. The power supply voltage VH is a high voltage (e.g., 24 V or 18 V) supplied from the outside of the thermal head 320 (ceramic sheet 322). The thermal head 320 includes first to Mth (M is an integer equal to or larger than two) thermal head drivers 330-1, 330-2, . . . , and 330-M. The outputs of the first to Mth thermal head drivers 330-1, 330-2, . . . , and 330-M are electrically connected to the other ends of the thermal resistor elements.

Each of the first to Mth thermal head drivers 330-1, 330-2, . . . , and 330-M causes a current to flow through the thermal resistor element (drives the thermal resistor element) by setting the output of an output driver connected to the thermal resistor element at a ground power supply voltage, for example.

4.2 Thermal Head Driver

Figure 33:
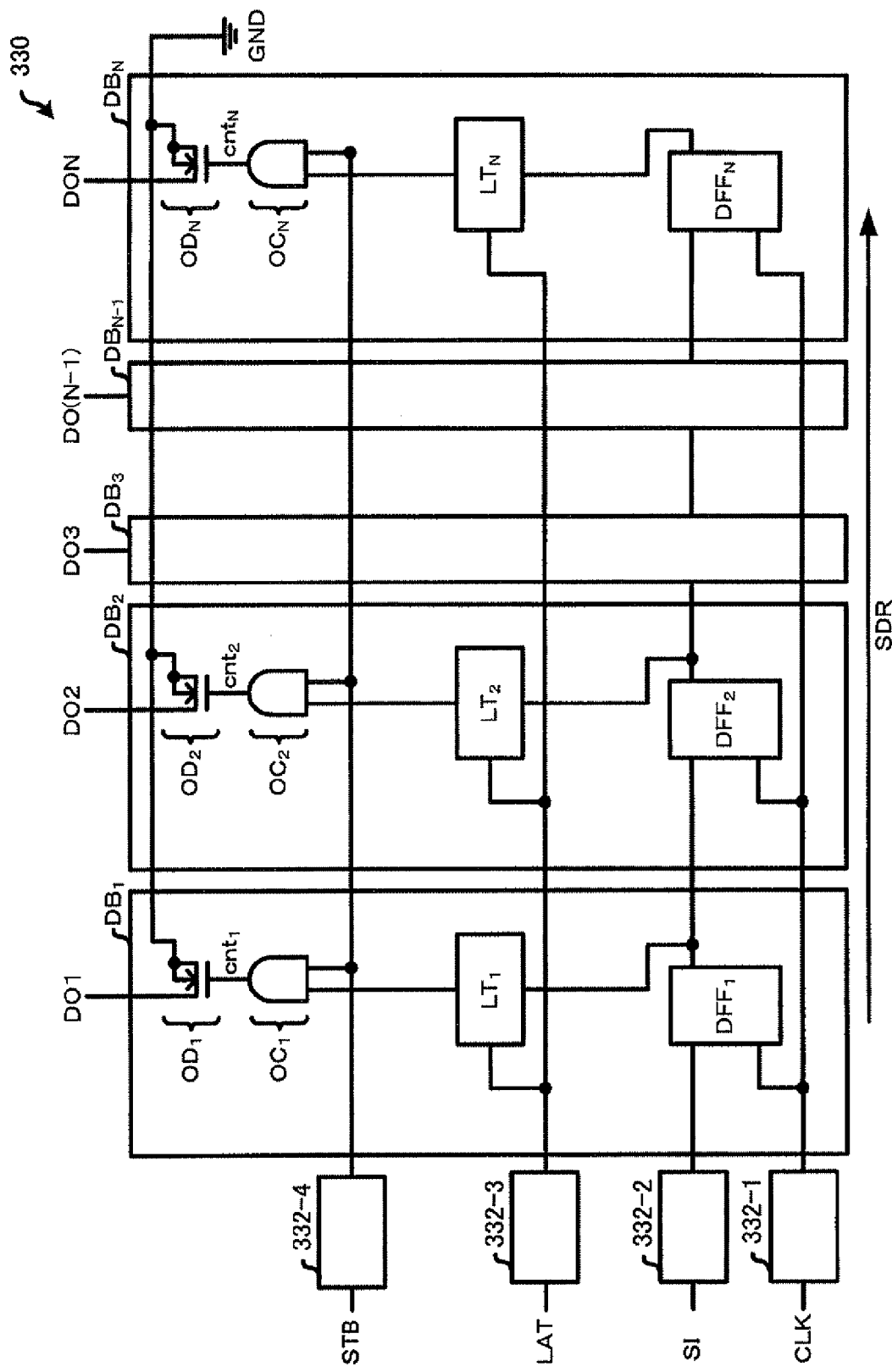
FIG. 33 shows a specific example of each thermal head driver 330 shown in FIG. 32.

FIG. 33 shows a specific example of the thermal head driver 330 shown in FIG. 32.

The thermal head driver 330 shown in FIG. 33 includes noise filter circuits 332-1, 332-2, 332-3, and 332-4 provided in an input section. The noise filter circuits 332-1, 332-2, 332-3, and 332-4 are formed using the above-described noise filter circuit (e.g., the noise filter circuit 80 shown in FIG. 8).

The noise filter circuits 332-1, 332-2, 332-3, and 332-4 can be formed with a reduced chip size. Therefore, a small thermal head driver can be provided at low cost.

The thermal head driver 330 includes a plurality of driver blocks DB1 to DBN (N is an integer equal to or larger than two). The driver block DBj (1≦j≦N, j is an integer) may include an output driver ODj, a latch LTj, and a flip-flop DFFj.

A clock signal CLK, serial data SI, a latch signal LAT, and a strobe signal STB are input to the thermal head driver 330 through the noise filter circuits 332-1, 332-2, 332-3, and 332-3. Pixel data is serially input as the serial data SI in synchronization with the clock signal CLK. The latch signal LAT is a signal for the latches LT1 to LTN to latch the pixel data corresponding to one line. The strobe signal STB is supplied to the driver blocks DB1 to DBN.

The flip-flops DFF1 to DFFN of the driver blocks DB1 to DBN form a shift register that shifts the pixel data input as the serial data SI in a shift direction SDR. Each flip-flop of the shift register holds the output from the flip-flop in the preceding stage and outputs the held data in synchronization with the change timing of the clock signal CLK.

The latch LTj latches (holds) the data held by the flip-flop DFFj when the latch signal LAT is set at the H level, for example. The data latched by the latch LTj is input to an output control circuit OCj. The output control circuit OCj generates an output control signal cnt1 that controls the output from the output driver OD1.

The output driver ODj includes an N-type metal-oxide-semiconductor (MOS) transistor (hereinafter referred to as "MOS transistor"). A driver output DOj is output from the drain of the MOS transistor. A ground power supply voltage GND is supplied to the sources of the MOS transistors that form the output drivers OD1 to ODN of the driver blocks DB1 to DBN. The output control signal cntj from the output control circuit OCj is supplied to the gate of the MOS transistor that forms the output driver ODj. In FIG. 33, the driver output DOj is set at the ground power supply voltage GND by electrically connecting the source and the drain of the MOS transistor that forms the output driver ODj using the output control signal cntj.

The output control circuit OCj generates the output control signal cntj based on the strobe signal STB and the pixel data (pixel data latched by the latch LTj) corresponding to the driver block DBj.

4.2.1 Modification

A control circuit (e.g., display driver) other than the thermal head driver 330 may include the above-described noise filter circuit provided in an input section.

4.3 Electronic Instrument

Figure 34:
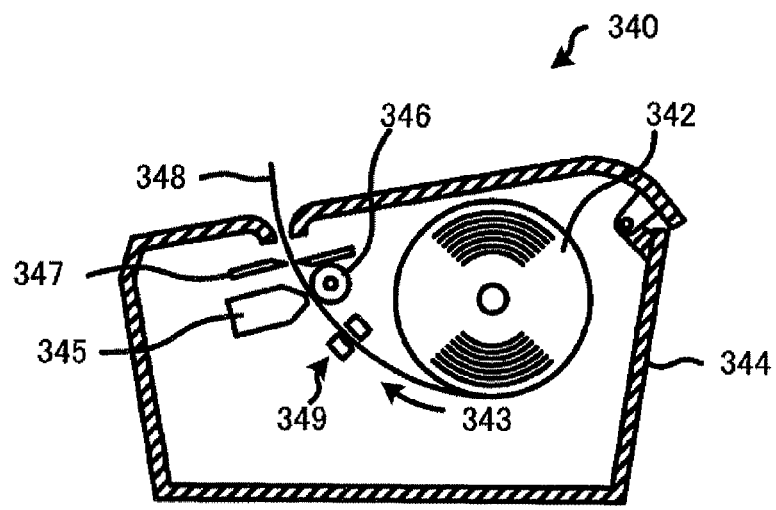
FIG. 34 is a vertical cross-sectional view showing only the main portion of a specific example of a thermal printer that includes a thermal head 320 shown in FIG. 32.

FIG. 34 is a vertical cross-sectional view showing only the main portion of a specific example of a thermal printer that includes the thermal head 320 shown in FIG. 32.

Rolled thermal paper 342 is provided in a printer 340. The printing target portion of the rolled paper 342 is supplied in a paper feed direction 343 by one line using a given paper feed mechanism (paper feed means). The printing target portion is guided toward a print head 345 inside a housing 344. The print head 345 includes the thermal head 320 shown in FIG. 32. When the printing target portion of the rolled paper 342 passes through the space between the print head 345 and a platen 346, a given image is printed on the printing target portion using the print head 345.

The paper feed mechanism further advances the printing target portion in the paper feed direction 343. The rolled paper 342 is then cut with a cutter 347, and removed as a receipt 348.

A paper end sensor 349 is provided in the housing 344 in the preceding stage of the print head 345 so that the edge of the rolled paper 342 can be detected when the rolled paper 342 is supplied in the paper feed direction 343.

4.3.1 Modification

An electronic instrument (e.g., liquid crystal device) other than the thermal printer 340 may also include a control circuit that includes the above-described noise filter circuit.

4.4 Printing System

Figure 35:
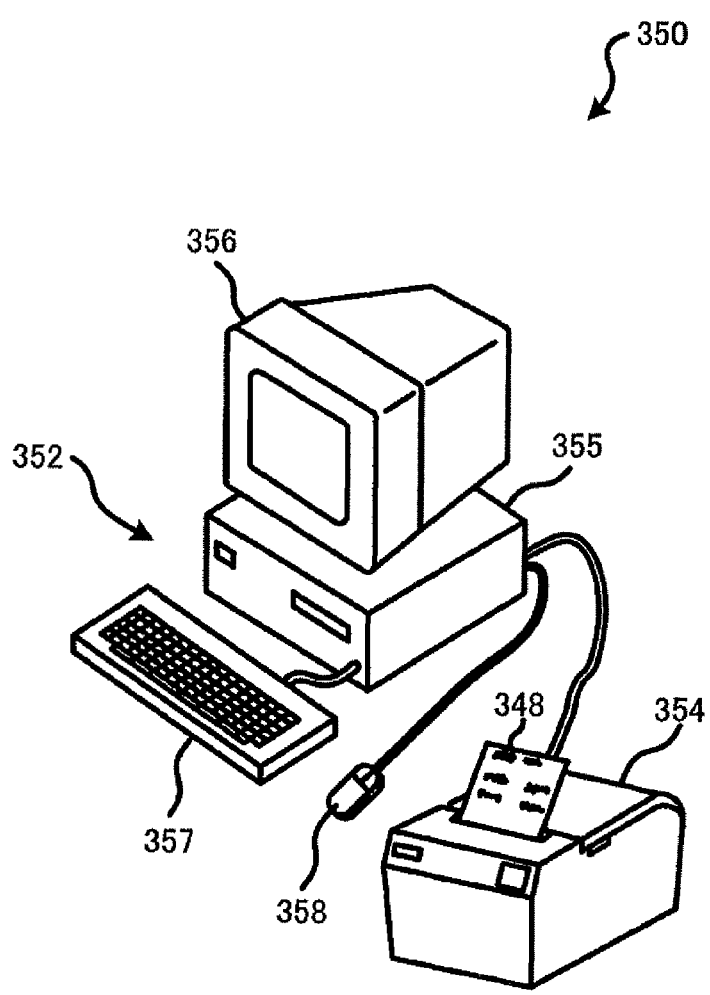
FIG. 35 shows a specific example of a printing system that includes the thermal head 320 shown in FIG. 32.

FIG. 35 shows a specific example of a printing system including the thermal head 320 shown in FIG. 32.

A printing system 350 shown in FIG. 35 includes a host computer 352 (control section in a broad sense), and a printer 354 that produces the receipt 348 or the like. The host computer 352 includes a main body 355, a display device 356, a keyboard 357, and a mouse 358 as a pointing device.

The printer 354 is formed using the printer 340 shown in FIG. 34, for example.

Figure 36:
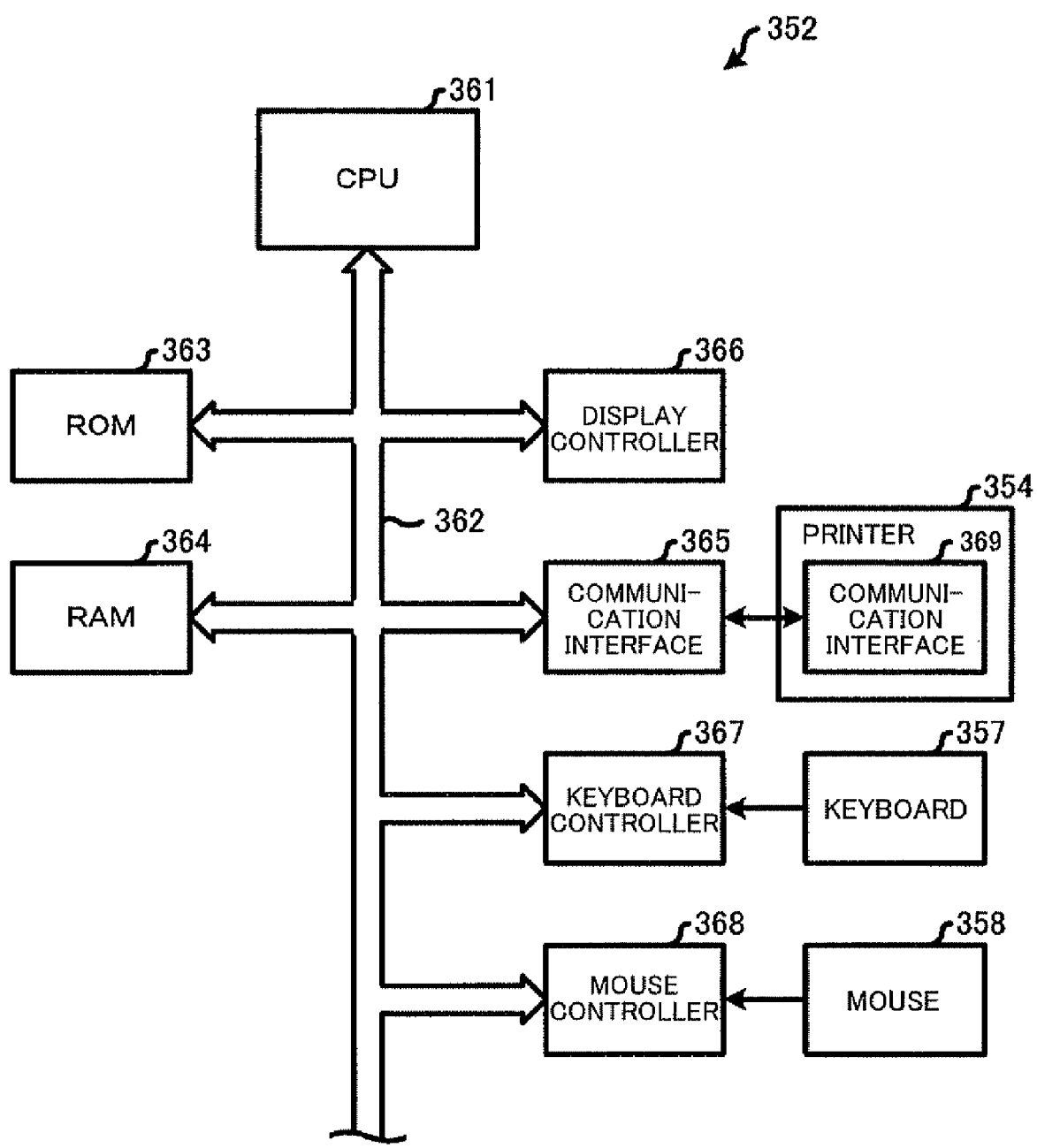
FIG. 36 is a schematic block diagram showing a host computer 352 shown in FIG. 35.

FIG. 36 is a schematic block diagram showing the host computer 352 shown in FIG. 35.

In the host computer 352, a read only memory (ROM) 363 that stores program data and the like, a random access memory (RAM) 364 that serves as a data processing work area and buffers print data, a communication interface 365 that transmits print data, a print command, and the like to the printer 354, a display controller 366 that causes the display device 356 to display characters and the like corresponding to display data, a keyboard controller 367 that receives a key signal corresponding to an input key from the keyboard 357, and a mouse controller 368 that controls data communication or the like with the mouse 358 are connected to a central processing unit (CPU) 361 through a bus line 362. The printer 354 also includes a communication interface 369 that receives print data and the like from the communication interface 365.

The CPU 361 executes a given print process based on a program stored in the ROM 363 or the RAM 364. The CPU 361 load the print data into the RAM 364, or transfers the print data stored in the RAM 364 to the printer 354 through the communication interface 365.

4.4.1 Modification

A system other than the printing system 350 may also include an electronic instrument that includes the above-described noise filter circuit.

5. Application Example of Dead Time Circuit

Figure 37:
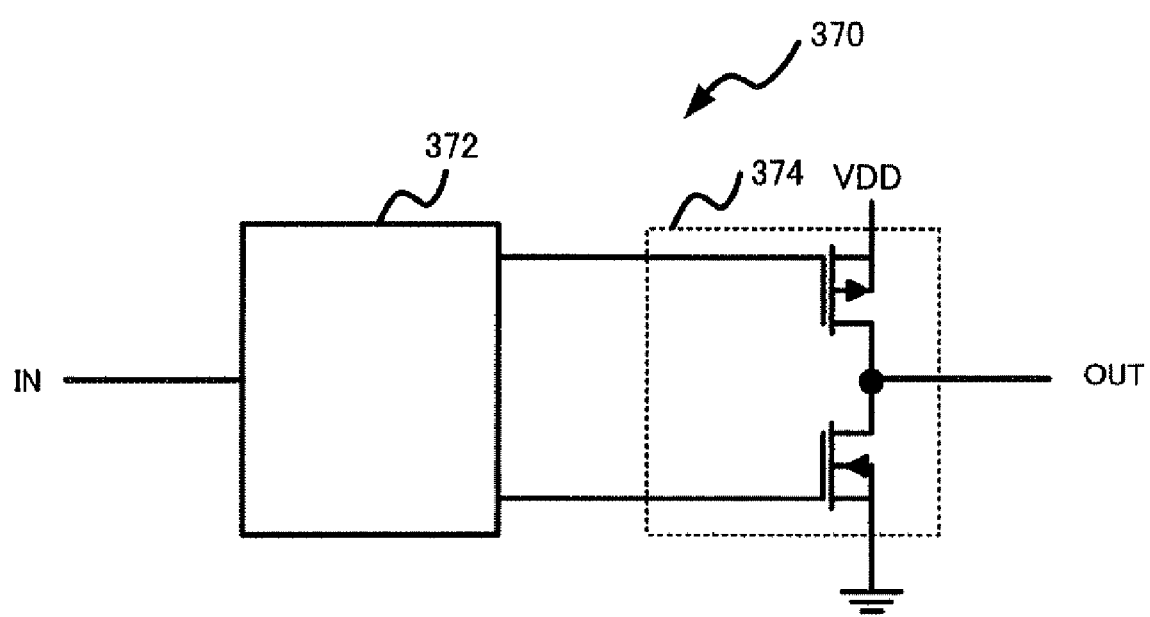
FIG. 37 shows an application example of a dead time circuit according to the invention.

FIG. 37 shows an application example of the dead time circuit according to the invention.

A driver circuit 370 shown in FIG. 37 includes a dead time circuit 372 and an output circuit 374.

The dead time circuit 372 may be formed by the above-described dead time circuit (e.g., the dead time circuit 150 shown in FIG. 15).

The output circuit 374 includes a P-type transistor and an N-type transistor (CMOS transistor 374). The capability of the P-type transistor is equal to the capability of the N-type transistor.

A first signal (e.g., 156-2(OUT1) shown in FIG. 16) output from the dead time circuit 372 is supplied to the gate of the N-type transistor of the CMOS transistor 374, and a second signal (e.g., 158(OUT2) shown in FIG. 16) output from the dead time circuit 372 is supplied to the gate of the P-type transistor of the CMOS transistor 374. In FIG. 37, the first signal and the second signal output from the dead time circuit 372 have the same phase.

A situation in which the P-type transistor and the N-type transistor of the CMOS transistor 374 are turned ON simultaneously can be prevented by utilizing the dead time of the dead time circuit 372. Therefore, the dead time circuit 372 can prevent a situation in which a current flows through the output circuit 374.

The above-described dead time circuit may also be applied also to control circuits (e.g., level shifter circuit, switched capacitor circuit, and voltage booster circuit) other than the driver circuit 370, electronic instruments, systems, and the like.

6. Application Example of Delay Circuit

Figure 38:
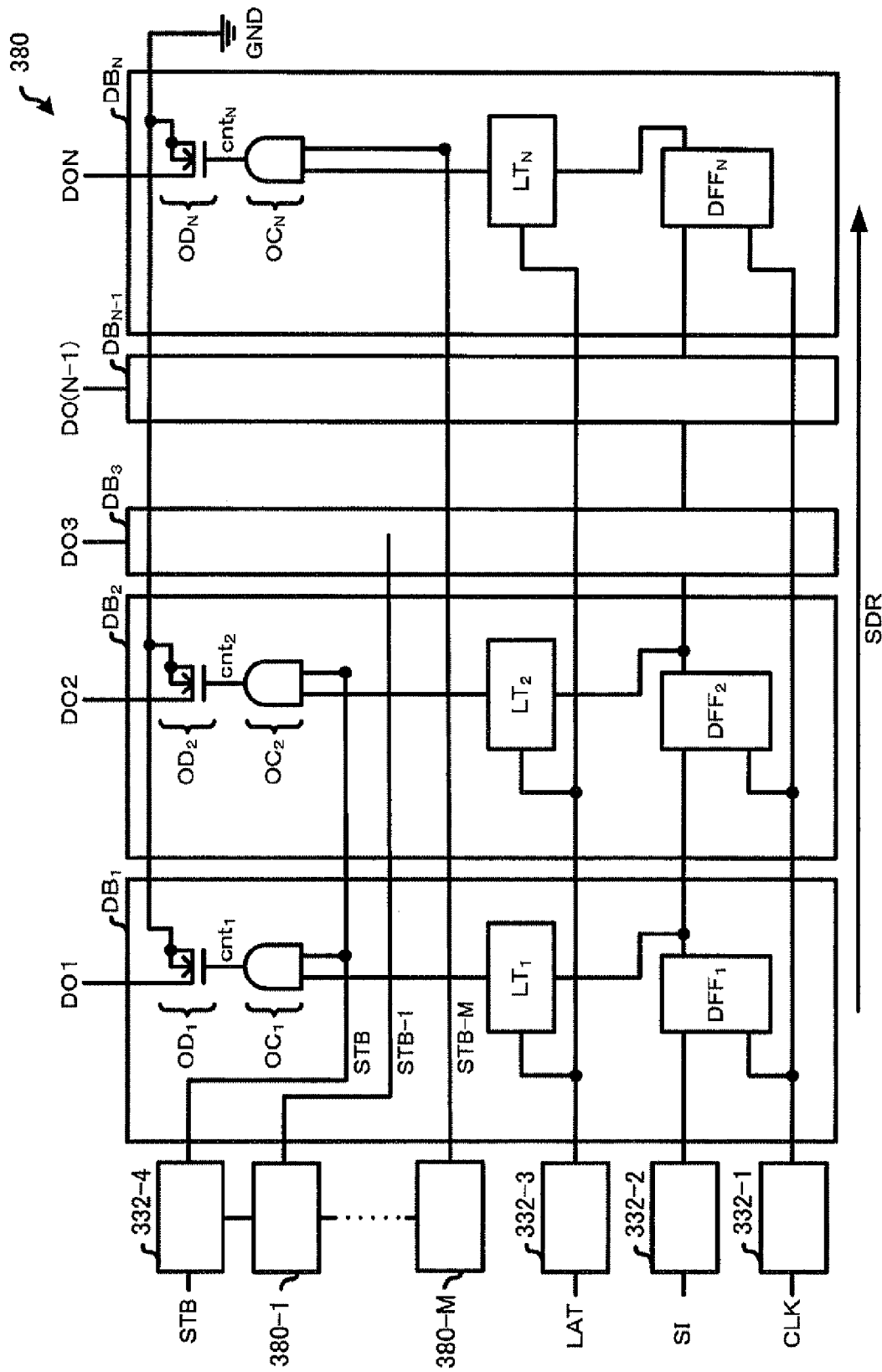
FIG. 38 shows an application example of a delay circuit according to the invention.

FIG. 38 shows an application example of the delay circuit according to the invention.

A thermal head driver 380 shown in FIG. 38 includes M delay circuits 382-1 to 382-M in addition to the elements of the thermal head driver 330 shown in FIG. 33. In FIG. 38, the noise filter circuits 332-1, 332-2, 332-3, and 332-4 may be omitted.

Each of the delay circuits 382-1 and 382-(N−1) may be formed by the above-described delay circuit (e.g., the delay circuit 260 shown in FIG. 26). The strobe signal STB is gradually delayed due to the delay circuit 382-1 and 382-(N−1), and the strobe signal STB and the delayed strobe signals STB-1 to STB-M are input to the corresponding driver blocks DB1 to DBN. Therefore, the driver outputs DO1 to DON have a time difference corresponding to the delay circuits 382. As a result, a surge voltage can be suppressed.

The delay circuit 121 shown in FIG. 12 may also be formed by the above-described delay circuit (e.g., the delay circuit 260 shown in FIG. 26).

The delay circuit according to the invention may also be applied to control circuits other than the thermal head driver 380 and the noise filter circuit 120, electronic instruments, systems, and the like.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention.

What is claimed is:

1. A noise filter circuit comprising:
- a first inverter circuit that receives a signal based on an input signal, the first inverter circuit generating a first signal with a delay amount based on the input signal, a rise time of the first signal being longer than a fall time of the first signal;
- a second inverter circuit that receives a signal based on the input signal, the second inverter circuit generating a second signal with the delay amount based on the input signal, a rise time of the second signal being longer than a fall time of the second signal;
- a latch circuit that receives signals based on the first signal and the second signal as a set signal and a reset signal, the latch circuit removing a noise having a pulse width smaller than the delay amount;
- one of the first inverter circuit and the second inverter circuit including a P-type transistor and an N-type transistor, the capability of the P-type transistor being lower than the capability of the N-type transistor; and
- the other of the first inverter circuit and the second inverter circuit including a P-type transistor and an N-type transistor, the capability of the P-type transistor being lower than the capability of the N-type transistor.

2. A thermal head driver comprising the noise filter circuit as defined in claim 1.

3. An electronic instrument comprising the noise filter circuit as defined in claim 1.

4. A noise filter circuit comprising:
- a first inverter circuit that receives a signal based on an input signal, the first inverter circuit generating a first signal with a delay amount based on the input signal, a fall time of the first signal being longer than a rise time of the first signal;
- a second inverter circuit that receives a signal based on the input signal, the second inverter circuit generating a second signal with the delay amount based on the input signal, a fall time of the second signal being longer than a rise time of the second signal;
- a latch circuit that receives signals based on the first signal and the second signal as a set signal and a reset signal, the latch circuit removing a noise having a pulse width smaller than the delay amount;
- one of the first inverter circuit and the second inverter circuit including a P-type transistor and an N-type transistor, the capability of the N-type transistor being lower than the capability of the P-type transistor; and
- the other of the first inverter circuit and the second inverter circuit including a P-type transistor and an N-type transistor, the capability of the N-type transistor being lower than the capability of the P-type transistor.

5. A thermal head driver comprising the noise filter circuit as defined in claim 4.

6. An electronic instrument comprising the noise filter circuit as defined in claim 4.

* * * * *